United States Patent [19]

Murakami et al.

[11] Patent Number: 6,072,231
[45] Date of Patent: Jun. 6, 2000

[54] SEMICONDUCTOR DEVICE

[75] Inventors: Gen Murakami, Machida; Kunihiro Tsubosaki, Hino; Masahiro Ichitani, Kodaira; Kunihiko Nishi, Kokbunji; Ichiro Anjoh, Koganei; Asao Nishimura, Ushiku; Makoto Kitano; Akihiro Yaguchi, both of Chiyoda-mura; Sueo Kawai, Iwama-machi; Masatsugu Ogata, Hitachi; Syuuji Eguchi, Hitachi; Hiroyoshi Kokaku, Hitachi; Masanori Segawa, Hitachi; Hiroshi Hozoji, Hitachi; Takashi Yokoyama, Hitachi; Noriyuki Kinjo, Hitachi; Aizo Kaneda, Yokohama; Junichi Saeki, Yokohama; Shozo Nakamura, Yokohama; Akio Hasebe, Yokohama; Hiroshi Kikuchi, Zushi; Isamu Yoshida, Yokohama; Takashi Yamazaki; Kazuyoshi Oshima, both of Ohme; Tetsurou Matsumoto, Higashiyamato, all of Japan

[73] Assignee: Hitachi, Ltd., Tokyo, Japan

[21] Appl. No.: 09/066,877

[22] Filed: Apr. 28, 1998

Related U.S. Application Data

[62] Division of application No. 08/646,031, May 7, 1996, Pat. No. 5,793,099, which is a continuation of application No. 08/293,555, Aug. 22, 1994, Pat. No. 5,530,286, which is a division of application No. 07/990,272, Dec. 14, 1992, Pat. No. 5,358,904, which is a division of application No. 07/915,861, Jul. 20, 1992, abandoned, which is a continuation of application No. 07/690,551, Apr. 24, 1991, abandoned, which is a continuation of application No. 07/409,332, Sep. 19, 1989, Pat. No. 5,068,712.

[30] Foreign Application Priority Data

Mar. 20, 1988 [JP] Japan .................................. 1-065844
Sep. 20, 1988 [JP] Japan .................................. 63-236156

[51] Int. Cl.$^7$ ................................................ H01L 23/495
[52] U.S. Cl. ........................ 257/666; 257/676; 257/668; 257/691

[58] Field of Search .................................... 257/666, 676, 257/691, 668

[56] References Cited

U.S. PATENT DOCUMENTS

| 3,783,348 | 1/1974 | Swartz et al. . |
| 4,203,792 | 5/1980 | Thompson ............................. 437/220 |
| 4,209,355 | 6/1980 | Burns . |
| 4,355,463 | 10/1982 | Burns ..................................... 437/217 |
| 4,577,214 | 3/1986 | Schaper . |
| 4,595,945 | 6/1986 | Graver . |

(List continued on next page.)

FOREIGN PATENT DOCUMENTS

| 57-45961 | 3/1982 | Japan . |
| 59-43534 | 3/1984 | Japan . |
| 5992556 | 5/1984 | Japan . |
| 60-167454 | 8/1985 | Japan . |
| 60-208847 | 10/1985 | Japan . |
| 61-236130 | 10/1986 | Japan . |
| 61-241959 | 10/1986 | Japan . |
| 63-44749 | 2/1988 | Japan . |
| 63-211744 | 9/1988 | Japan . |

*Primary Examiner*—Sheila V. Clark
*Attorney, Agent, or Firm*—Antonelli, Terry, Stout & Kraus, LLP

[57] ABSTRACT

As the semiconductor chip is large-sized, highly integrated and speeded up, it becomes difficult to pack the semiconductor chip together with leads in a package. In view of this difficulty, there has been adopted the package structure called the "Lead-On-Chip" or "Chip-On-Lead" structure in which the semiconductor and the leads are stacked and packed. In the package of this structure, according to the present invention, the gap between the leading end portions of the inner leads and the semiconductor chip is made wider than that between the inner lead portions except the leading end portions and the semiconductor chip thereby to reduce the stray capacity, to improve the signal transmission rate and to reduce the electrical noises.

40 Claims, 42 Drawing Sheets

U.S. PATENT DOCUMENTS

| | | |
|---|---|---|
| 4,598,307 | 7/1986 | Wakabayashi et al. . |
| 4,637,130 | 1/1987 | Fujii et al. ............... 437/220 |
| 4,661,837 | 4/1987 | Sono . |
| 4,680,613 | 7/1987 | Daniels et al. ............ 257/691 |
| 4,684,975 | 8/1987 | Takiar et al. . |
| 4,796,078 | 1/1989 | Phelps, Jr. et al. . |
| 4,807,018 | 2/1989 | Cellai ...................... 437/220 |
| 4,809,053 | 2/1989 | Kuraishi . |
| 4,862,245 | 8/1989 | Pashby et al. . |
| 4,891,687 | 1/1990 | Mallik et al. ............. 257/691 |
| 4,996,587 | 2/1991 | Hinrishscmeyer et al. . |
| 5,049,981 | 9/1991 | Dehringer ................ 357/81 |
| 5,115,298 | 5/1992 | Loh .......................... 257/691 |
| 5,252,854 | 10/1993 | Arita et al. ............... 257/676 |
| 5,319,241 | 6/1994 | Lim .......................... 257/676 |
| 5,327,009 | 7/1994 | Igeta ........................ 257/676 |
| 5,357,139 | 10/1994 | Yaguchi et al. ........... 257/666 |
| 5,359,224 | 10/1994 | Heinen et al. ............ 257/666 |
| 5,442,233 | 8/1995 | Anjoh et al. .............. 257/666 |
| 5,539,250 | 7/1996 | Litano et al. ............. 257/666 |
| 5,563,443 | 10/1996 | Beng et al. ............... 257/666 |
| 5,585,665 | 12/1996 | Anjoh et al. . |
| 5,656,551 | 8/1997 | Corbett et al. . |

SEMICONDUCTOR DEVICE

CROSS-REFERENCE TO RELATED APPLICATIONS

This application is a divisional application of Ser. No. 08/646,031, filed May 7, 1996 now U.S. Pat. No. 5,793,099, which is a continuation application of Ser. No. 08/293,555, filed Aug. 22, 1994 now U.S. Pat. No. 5,530,286, which is a divisional application of Ser. No. 07/990,272, filed Dec. 14, 1992 now U.S. Pat. No. 5,358,904, which is a divisional application of Ser. No. 07/915,861 now abandoned, filed Jul. 20, 1992, which is a continuation application of Ser. No. 07/690,551, filed Apr. 24, 1991 now abandoned, which is a continuation application of Ser. No. 07/409,332, filed Sep. 19, 1989 (now U.S. Pat. No. 5,068,712), the contents of each of which are incorporated herein by reference in their entirety.

BACKGROUND OF THE INVENTION

The present invention relates to a semiconductor device and, more particularly, to a technology effective if applied to the package of a large-scale integrated circuit of high integration.

In the prior art, the semiconductor chip is sealed up with a molding resin so that it may be protected. Several methods are used to mount leads in position on the semiconductor chip before the sealing.

For example, a lead frame having tabs at its center is used and mounted before the semiconductor chip is sealed. In this prior art, there is known a method of connecting electrode pads around the semiconductor chip with the corresponding inner leads through bonding wires.

The common problem among the semiconductor packages of the prior art is that the metal lead frame is cracked along the mold parting lines providing the exits of the lead lines.

Another problem is that the passages for moisture or contaminants in the atmosphere to seal along the metal lead wires from the outside into the semiconductor chip are relatively short.

Moreover, the surface mounting type package is seriously troubled by the so-called "reflow cracking" problem that the moisture contained in the package is expanded by the heat of the solder reflow to crack the package.

Still another problem is that the bonding wires necessary for connecting the inner leads with the electrode pads of the semiconductor chip cannot be intersected partly because they are relatively long and partly because they are alternately assigned to input/output terminals.

In order to solve the above-specified problems, therefore, there has been proposed in Japanese Patent Laid-Open No. 241959/1986 (corresponding to E.P. Publication No. 0198194) a semiconductor device in which a plurality of inner leads are adhered to the circuit forming surface of a semiconductor chip through the semiconductor chip and insulating films by an adhesive, in which the inner leads and the semiconductor chip are electrically connected through bonding wires and in which common inner leads (or bus bar inner leads are disposed in the vicinity of the longitudinal center line of the circuit forming surface of the semiconductor chip.

Also disclosed in Japanese Patent Laid-Open No. 167454/1985 or 218139/1986 (corresponding to U.S. Ser. No. 845.332) is the package structure of the so-called "tabless lead frame type", in which the tabs (i.e., the die pads) mounting the chip are eliminated to mount the chip on the insulating films adhered to the leads (i.e., Chip On Lead) and in which the bonding pads of the chip and the leading ends of the leads are connected through wires.

Also proposed in Japanese Patent Laid-Open No. 92556/1984 or 236130/1986 is the package structure in which the leads are adhered to the upper surface of the chip (i.e., Lead On Chip) by an adhesive and in which the bonding pads of the chip and the leading end portions of the leads are connected through wires.

According to the above-specified package structure arranged with the lead on the upper or lower surface of the chip, the heat and moisture resistances of the package can be improved because the leads in the package can be elongated. Thanks to the elimination of the tabs, moreover, the contact between the resin and the leads is improved to improve the reflow cracking resistance. As a result, even the large-sized chip can be packed in the package of the existing size. Moreover, this package structure is advantageous in reducing the wiring delay because it can shorten the bonding wires.

SUMMARY OF THE INVENTION

We have investigated the aforementioned semiconductor devices of the prior art and have found the following problems:

(1) In the semiconductor device of the prior art, the inner leads are adhered to the circuit forming surface of the semiconductor chip through the semiconductor chip and the insulating films by the adhesive. Because of the large stray capacity between the inner leads and the semiconductor chip, the semiconductor device has a problem that the signal transmission rate is dropped by the large stray capacity to increase the electrical noises.

(2) Because of the large area of the insulating films, the amount of moisture absorbed is increased so that the absorbed moisture is gasified and expanded in the package during the reflow, thus causing a problem that the package cracking is established by the moisture expansion.

(3) Since the aforementioned insulating films are made of a resin of polyimide, the amount of absorbed moisture is increased so that the absorbed moisture is gasified and expanded in the package during the reflow, thus causing the problem of package cracking.

(4) Since the aforementioned adhesive is made of an acrylic resin, it is degraded by the pressure cracker test or the like, thus raising a problem that the reliability is dropped by the electrical leakage between the leads and the corrosions of the aluminum electrodes.

(5) Since the circuit forming surface of the semiconductor chip is not coated all over with the resin coating of polyimide for protections against alpha rays, there arises a problem that errors are caused by the alpha rays.

(6) The common inner leads (i.e., bus bar inner leads) are used as radiating plates, but the element having a large exothermic portion is not covered all over with the inner leads. There arises a problem that the radiation is insufficient in an element of 1 watt or higher.

(7) Since the insulating films made of the aforementioned resin of polyimide has a large area, there arises a problem that the semiconductor device is weak in the temperature cycle.

(8) The wire bonding is accomplished across the aforementioned inner leads (i.e., bus bar inner leads), thus raising a problem in poor productivity.

(9) The aforementioned adhesive layer is so soft that the wire bonding conditions are difficult to set, thus raising the problem of poor productivity.

(10) This problem of poor productivity is also caused by the poor workability for mounting the insulating films on the semiconductor chip.

(11) Since the semiconductor chip is insufficiently fixed by the portions of the inner leads, it is moved in the resin sealing (or molding) operation, thus raising a problem that the productivity is poor.

An object of the present invention is to provide a technique for improving the reliability of a semiconductor device.

An object of the present invention is to provide a technique for a semiconductor device to improve the signal transmission rate due to the stray capacity between the semiconductor chip and the leads and to reduce the electrical noises.

Another object of the present invention is to provide a technique for a semiconductor device to improve the radiating efficiency of the heat generated.

Another object of the present invention is to provide a technique for a semiconductor device to reduce the influences of the heat during the reflow.

Another object of the present invention is to provide a technique for a semiconductor device to reduce the influences of the heat in the temperature cycle.

Another object of the present invention is to provide a technique for a semiconductor device to prevent the molding defects from being caused.

Another object of the present invention is to provide a technique for a semiconductor device, which has a package structure arranged with leads on the upper or lower surface of the chip, to reduce the parasitic capacity to be established between the chip and the leads.

Another object of the present invention is to provide a technique for a semiconductor device to improve the productivity.

Another object of the present invention is to provide a technique to improve the moisture resistance.

The foregoing and other objects and novel features of the present invention will become apparent from the following description to be made with reference to the accompanying drawings.

Representatives of the invention to be disclosed herein will be briefly described in the following:

1. A semiconductor device of the type, in which common inner leads are adhered to the vicinity of the center line taken in the X- or Y-direction of the principal surface of a semiconductor chip through insulators for insulating the semiconductor chip electrically, in which a plurality of signal inner leads are adhered to the principal surface of the semiconductor chip through insulators for insulating the semiconductor chip electrically, and in which the inner leads, the common inner leads and the semiconductor chip are electrically connected through bonding wires and sealed up with a mold resin, wherein the improvement resides in that the gaps between the semiconductor chip at the outer lead side than the portions bonded to the insulators and said inner leads are wider than those from the portions bonded to the insulators.

2. A semiconductor device according to the foregoing item 1, wherein the area occupied by the insulators is at most one half of the area of the semiconductor chip.

3. A semiconductor device according to the foregoing item 1, wherein the area for bonding the insulators and the principal surface of the semiconductor chip is practically minimized.

4. A semiconductor device according to each of the foregoing items 1 to 3, wherein the insulators are molded of a resin containing a portion of the inner leads.

5. A semiconductor device according to each of the foregoing items 1 to 4, wherein the material of the insulators satisfies at least two of the following conditions:

(1) The saturated moisture absorption is equal to or less than that of the sealing resin;
(2) The dielectric constant is 4.0 or less for $10^3$ Hz at a temperature from the room temperature to 200° C.;
(3) The Barcol hardness (GYZ J934-1) at 200° C. is 20 or more;
(4) The amount of a soluble halogen element is 10 ppm or less in the case of the uranium and thorium contents of 1 ppb or less and in the case of extraction at 120° C. for 100 hours;
(5) The contact between the semiconductor chip and the inner leads is excellent;
(6) The thermal expansion coefficient is $20 \times 10^{-6}$/° C. or less; and
(7) The theremost resin has a glass transition temperature of 220° C. or more.

6. A semiconductor device of the type, in which all of a plurality of inner leads are so arranged on the principal surface of a semiconductor chip as to float from the principal surface of the semiconductor chip, in which the semiconductor chip is adhered and fixed to the deenergized ones of the inner leads, and in which the remaining inner leads and the semiconductor chip are electrically connected through bonding wires and sealed up with a mold resin.

7. A semiconductor device of the type, in which a plurality of inner leads are so arranged on the principal surface of a semiconductor chip as to flat from the principal surface of the semiconductor chip, in which the side of the semiconductor chip opposite to the principal surface is adhered and fixed through insulators by a portion of the inner leads, and in which the inner leads and the semiconductor chip are electrically connected through bonding wires and sealed up with a mold resin.

8. A semiconductor device of the type, in which a plurality of inner leads are adhered to the principal surface of a semiconductor chip through insulators for insulating the semiconductor chip electrically, and in which the inner leads and the semiconductor chip are electrically connected through bonding wires, wherein the improvement resides: in that radiating leads electrically insulated from the semiconductor chip have their one-side ends held on the principal surface of the semiconductor chip at the central portion of the longitudinal side of the package; and in that the other terminals of the radiating leads are extended to above the principal surface of the semiconductor chip outside the package.

9. A semiconductor device according to the foregoing item 8, wherein the other ends of the radiating leads are extended to below the side opposite to the principal surface of the semiconductor chip outside of the package.

10. A semiconductor device according to the foregoing item 8 or 9, wherein the one-side ends of the radiating leads are extended to above the exothermic portions of the principal surface of the semiconductor chip.

11. A semiconductor device of the type, in which a plurality of inner leads are adhered to the principal surface of a semiconductor chip through insulators for insulating the semiconductor chip electrically, and in which the inner leads and the semiconductor chip are electrically connected through bonding wires, wherein the improvement resides: in that one-side ends of radiating leads electrically insulated from the semiconductor chip are held on the central portion of the longitudinal side of the package and on the side opposite site to the principal surface of the semiconductor chip; and in that the other ends of the radiating leads are extended to above the principal surface of the semiconductor chip outside of the package or to below the side opposite to the principal surface of the semiconductor chip outside of the package.

12. A semiconductor device according to any of the foregoing items 8 to 11, wherein the radiating leads are equipped at their outside with radiating plates.

13. A semiconductor device according to any of the foregoing items 6 to 12, wherein common inner leads are arranged in the vicinity of the X- or Y-directional center line of the principal surface of the semiconductor chip.

14. A semiconductor device according to any of the foregoing items 1 to 12, wherein the bonding wires are coated with insulators.

15. A semiconductor device according to any of the foregoing items 1 to 6 or 13, wherein the semiconductor chip has its principal surface arranged with bonding pads which do not intersect with the bonding wires arranged on the principal surface and the common inner leads.

16. A semiconductor device according to any of the foregoing items 1 to 15, wherein the mold resin material is a resin composite which is prepared by blending a thermoset resin with 70 wt. % or more of a substantially spherical inorganic filler having a particle size distribution of 0.1 to 100 microns, an average particle diameter of 5 to 20 microns and the maximum packing density of 0.8 or more.

17. A semiconductor device according to the foregoing item 16, wherein the mold resin material is composed mainly of at least one of a phenol-set type epoxy resin, a resol type phenol resin and a bismaleimide resin.

18. A semiconductor device according to the foregoing item 16 or 17, wherein the mold resin material is composed mainly of the resol type phenol resin or the bismaleimide resin as the thermoset resin, and wherein its molding has a bending strength of 3 kgf/mm$^2$ or more at 215° C.

19. A semiconductor device according to any of the foregoing items 16 to 18, wherein the mold resin material contains as its inorganic filler spherical molten silica having a particle size distribution of 0.1 to 100 microns, an average particle diameter of 5 to 20 microns and the maximum packing density of 0.8 or more.

20. A semiconductor device according to any of the foregoing items 16 to 19, wherein the mold resin material is blended as its inorganic filler with 67.5 vol % or more of substantially spherical molten silica having a particle size distribution of 0.1 to 100 microns, an average particle diameter of 5 to 20 microns and the maximum packing density of 0.8 or more, and wherein its molding has a linear expansion coefficient of $1.4 \times 10^{-5}$/° C. or less.

21. A semiconductor device according to any of the foregoing items 16 to 20, wherein the mold resin material has an extract of pH 3 to 7, in case it is mixed with ion exchange water in an amount of ten times and extracted at 120° C. for 100 hours, an electric conductivity of 200 µS/cm or less, and extractions of halogen ions, ammonia ions and metal ions of 10 ppm or less.

22. A semiconductor device of the type, in which a plurality of inner leads are adhered to the principal surface of a semiconductor chip with an adhesive through insulators for insulating the semiconductor chip electrically, and in which the inner leads and the semiconductor chip are electrically connected through bonding wires, wherein the improvement resides in that the adhesive is blended as a filler with spherical fine particles which have a constant particle diameter and which are selected from a thermoplastic resin or thermoset resin having a softening temperature higher than the inorganic or adhering temperature.

23. A semiconductor device of the type, according to the foregoing items 1 to 22 in which a plurality of inner leads are either adhered to the principal surface of a semiconductor chip with an adhesive through insulators for insulating the semiconductor chip electrically or arranged in a state floating from the principal surface of the semiconductor chip, and in which the inner leads and the semiconductor chip are electrically connected through bonding wires, wherein the improvement resides: in that the semiconductor chip is coated with an alpha ray shielding polyimide film at all its circuit forming regions other than bonding pads; and in that the semiconductor chip is formed with an insulating film on its portion to which are adhered at least the leading ends of the inner leads or suspension leads.

24. A semiconductor device according to the foregoing item 23, wherein the insulators are made of a thermoset resin containing a printable inorganic filler.

25. A semiconductor device according to the foregoing item 23 or 24, wherein the area occupied by the insulators is at most one half of the chip area.

26. A semiconductor device according to any of the foregoing items 23 to 25, wherein the semiconductor chip is formed with a polyimide film at its side opposite to the principal surface.

27. A semiconductor device according to any of the foregoing items 23 to 26, wherein the insulators are formed highly accurately by a wafer process including the steps of: a solvent-peeling type dry film to a semiconductor wafer; exposing and developing the dry film in an ordinary manner; applying a pasty insulator and burying it with squeezee; heating to cure the film; and peeling the film.

28. A semiconductor device according to the foregoing item 26, wherein the wafer process further includes the step of forming the insulators by developing and exposing a solder resist dry film.

29. A semiconductor device of the type, in which a plurality of inner leads are adhered to the principal surface of a semiconductor chip with an adhesive through insulators for insulating the semiconductor chip electrically, and in which the inner leads and the semiconductor chip are electrically connected through bonding wires, wherein the improvement resides in that an insulating film is arranged on all or some of the inner leads opposed and closest to the semiconductor chip.

30. A semiconductor device of the type, in which a plurality of inner leads are adhered to the principal surface of a semiconductor chip with an adhesive through insulators for insulating the semiconductor chip electrically, and in which the inner leads and the semiconductor chip are electrically connected through bonding wires, wherein the improvement resides in that the semiconductor chip has its principal surface covered wholly or partially with a substance which is more flexible or fluid than the mold resin to cover some or all of the bonding wires while the outside being sealed up with a resin.

31. A semiconductor device of the type, in which a plurality of inner leads are adhered to the principal surface of a semiconductor chip with an adhesive through insulators for insulating the semiconductor chip electrically, and in which the inner leads and the semiconductor chip are electrically connected through bonding wires, wherein the improvement resides in that the semiconductor chip has its principal surface covered wholly or partially with a bonding resin which covers some or all the bonding wires while the outside being sealed up with the mold resin.

32. A semiconductor device according to the foregoing item 31, wherein the outer surface of the mold resin covering the side of the semiconductor chip other than the main surface is recessed to expose a portion of the semiconductor chip substantially to the outside.

33. A semiconductor device according to any of the foregoing items 30 to 32, wherein common inner leads are disposed in the vicinity of the X- or Y-directional center line of the principal surface of the semiconductor chip.

34. A semiconductor device of the type, in which a plurality of inner leads are adhered to the principal surface of a semiconductor chip with an adhesive through insulators for insulating the semiconductor chip electrically, and in which the inner leads and the semiconductor chip are electrically connected through bonding wires, wherein the improvement resides in that the semiconductor chip is formed with a recess or rise in its side other than the principal surface.

35. A semiconductor device of the type, in which a plurality of inner leads are adhered to the principal surface of a semiconductor chip with an adhesive through insulators for insulating the semiconductor chip electrically, and in which the inner leads and the semiconductor chip are electrically connected through bonding wires, wherein the improvement resides in that the semiconductor chip is formed with a plurality of grooves in its side other than the principal surface.

36. A semiconductor device of the type, in which a plurality of inner leads are adhered to the principal surface of a semiconductor chip with an adhesive through insulators for insulating the semiconductor chip electrically, and in which the inner leads and the semiconductor chip are electrically connected through bonding wires, wherein the improvement resides in that the semiconductor chip is formed with a recess, a rise or a plurality of grooves in its side other than the principal surface while being left with a silicon oxide film.

37. A semiconductor device of the type, in which a plurality of inner leads are adhered to the principal surface of a semiconductor chip with an adhesive through insulators for insulating the semiconductor chip electrically, and in which the inner leads and the semiconductor chip are electrically connected through bonding wires, wherein the improvement resides in that the distance from the portions of the inner leads contacting with the semiconductor chip to the outer wall of a package is made larger than the distance from the side of the semiconductor chip opposite to the principal surface to the outer wall of the package.

38. A semiconductor device according to any of the foregoing items 1 to 37, wherein the semiconductor chip is two in which the bonding pads to the inner leads are disposed in mirror symmetry, and wherein the inner leads and the bonding pads of the semiconductor chip are electrically connected across the inner leads at the side of the principal surface of the two semiconductor chips and are sealed up with a mold resin.

39. A semiconductor device according to any of the foregoing items 34 to 38, wherein common inner leads are arranged in the vicinity of the X- or Y-directional center line of the semiconductor chips.

40. A semiconductor device according to any of the foregoing items 1 to 39, wherein the surface opposed to a substrate mounting said semiconductor device is formed with at least one of radiating groove which has its two ends opened to the outside at the sides of the semiconductor device.

41. A semiconductor device according to the foregoing item 40, wherein the side of the semiconductor device opposite to the side formed with the radiating groove is formed with a second radiating groove which is extended in the same direction of the first-named radiating groove and which has its two ends opened to the outside of the sides of the semiconductor device.

42. A semiconductor device according to the foregoing item 41 or 42, wherein the mold resin in the bottom of the radiating grooves formed in the surface opposed to the substrate mounting the semiconductor device has a thickness of 0.3 mm or less.

43. A semiconductor device according to any of the foregoing items 40 to 42, wherein common inner leads are arranged in the vicinity of the X- or Y-directional center line of the principal surface of the semiconductor chip.

44. A semiconductor device according to any of the foregoing items 40 to 43, wherein the semiconductor devices are so packed in their mounting substrates that their radiating grooves merge into each other.

45. A semiconductor device wherein leads arranged in the upper or lower surface of a chip packed in a package are partially folded outward with respect to the upper or lower surface of the chip.

According to the means of the foregoing item 1, the inner leads are so stepped that the gaps between the semiconductor chip at the outer lead side than the portions bonded to the insulators and said inner leads are wider than those from the portions bonded to the insulators. The stray capacity between the semiconductor chip and the leads can be made lower than that of the prior art to improve the signal transmission rate and reduce the electrical noises.

According to the means of the foregoing item 2, the area of the principal surface of the semiconductor chip occupied by the insulators is at most one half of the area of the semiconductor chip so that the moisture absorption by the insulating films can be dropped to reduce the influences of the heat during the reflow and in the temperature cycle.

Since, moreover, the stray capacity between the semiconductor chip and the leads is lower than that of the prior art, it is possible to improve the signal transmission rate and to reduce the electrical noises.

According to the means of the foregoing item 3, the area for bonding the insulators and the principal surface of the semiconductor chip is practically minimized to minimize the moisture absorption by the insulating films. As a result, it is possible to reduce the influences of the heat during the reflow and in the temperature cycle. Since, moreover, the stray capacity between the semiconductor chip and the leads is lower than that of the prior art, it is possible to improve the signal transmission rate and to reduce the electrical noises.

According to the means of the foregoing item 4, the insulators on the principal surface of the semiconductor chip are made of the resin molding including a portion of the inner leads to sufficiently enlarge the distance between the semiconductor chip and the inner leads so that the stray capacity between the semiconductor chip and the leads is far lower than that of the prior art. As a result, it is possible to improve the signal transmission rate and to reduce the electrical noises.

Since, moreover, the molding resin is selected as a material having a good matching with the sealing resin, it is possible to prevent the peeling between the molding resin and the sealing resin (or mold resin). As a result, it is possible to reduce the leakage between the inner leads.

According to the means of the foregoing item 5, the optimum insulator can be selected by the semiconductor element.

According to the means of the foregoing item 6, the semiconductor chip is adhered and fixed to those of the inner leads, which are not energized, whereas the remaining inner leads are arranged apart (i.e., electrically insulated) therefrom on the principal surface of the semiconductor chip. Since no insulating film is use, the moisture resistance can be improved. Moreover, the step of adhering the insulating film is eliminated.

According go the means of the foregoing item 7, the plural inner leads are arranged apart (or electrically insulated) from principal surface of a semiconductor chip, and the side of the semiconductor chip opposite to the principal surface is adhered and fixed through insulators by a portion of the inner leads, and in which the inner leads and the semiconductor chip are electrically connected through bonding wires and sealed up with a mold resin. Since the inner leads are not adhered to the principal surface of the semiconductor chip, this principal surface can be prevented from being broken or damaged. Since, moreover, no insulating film is used on the principal surface of the semiconductor chip, it is possible to improve the moisture resistance.

According to the means of the foregoing item 8, radiating leads electrically insulated from the semiconductor chip have their one-side ends held at the central portion of the longitudinal side of the package, and the other terminals of the radiating leads are extended to above the principal surface of the semiconductor chip outside the package. As a result, it is possible to improve the radiating efficiency of the heat of the exothermic portions of the semiconductor chip.

According to the means of the foregoing item 9, the other ends of the radiating leads of the means of the item 9 are extended to below the side opposite to the principal surface of the semiconductor chip outside of the package. As a result, it is possible to improve the radiating efficiency of the heat of the exothermic portions of the semiconductor chip.

According to the means of the foregoing item 10, the one-side ends of the radiating leads of the means of the foregoing item 9 are extended to above the exothermic portions of the principal surface of the semiconductor chip. As a result, it is possible to improve the radiating efficiency of the heat of the exothermic portions of the semiconductor chip.

According to the means of the foregoing item 11, one-side ends of radiating leads electrically insulated from the semiconductor chip of the means of the foregoing item 10 are held on the central portion of the longitudinal side of the package and on the side opposite to the principal surface of the semiconductor chip, and the other ends of the radiating leads are extended to above the principal surface of the semiconductor chip outside of the package or to below the side opposite to the principal surface of the semiconductor chip outside of the package. As a result, it is possible to improve the radiating efficiency of the heat of the exothermic portions of the semiconductor chip.

According to the means for the foregoing item 12, the radiating leads of the means of any of the foregoing items 8 to 11 are equipped at their outside with radiating plates. As a result, it is possible to further improve the radiating efficiency of the heat of the exothermic portions of the semiconductor chip.

According to the means of the foregoing item 13, common inner leads (i.e., bus bar inner leads) of the means of any of the foregoing items 1 to 12 are arranged in the vicinity of the X- or Y-directional center line of the principal surface of the semiconductor chip. As a result, the bonding wires of the reference voltage ($V_{SS}$) or the power source voltage ($V_{CC}$) in the semiconductor chip can be wired within a small area without any shorting. It is also possible to improve the workability of the wire bonding.

According to the means of the foregoing item 14, the bonding wires of the means of the foregoing item 13 are coated with insulators. As a result, the bonding wires for connecting the signal line inner leads and the semiconductor chip can be prevented from being shorted with the signal inner leads.

According to the means of the foregoing item 15, the semiconductor chip of the means of the foregoing item 14 has its principal surface arranged with bonding pads (i.e., external terminals) which do not intersect with the bonding wires arranged on the principal surface and the common inner leads (i.e., bus bar inner leads). As a result, the bonding wires for connecting the signal line inner leads and the semiconductor chip can be prevented from being shorted with the signal inner leads.

According to the means of the foregoing items 16 to 21:

(1) The sealing material using as a filler the substantially spherical molten silica having a particle size distribution of 0.1 to 100 microns, an average diameter of 5 to 20 microns and the maximum packing density of 0.8 or more has a lower molten viscosity and a higher material fluidity than the angular molten silica in current use. When in the molding operation, the gold (Au) wires or leads are neither deformed nor is flown away the semiconductor chip. It is also possible to pack the narrow gap of the package fully.

(2) Since the sealing material using the spherical molten silica is little influenced in its molten viscosity and fluidity, it is possible to increase the loading thereby to reduce the thermal expansion of the material.

(3) An excellent reliability can be attained if the resol type phenol resin and polyimide resin used are highly pure.

(4) The sealing material using the highly pure resol type phenol resin and polyimide resin provides moldings of high heat resistance and excellent mechanical strength at a high temperature. As a result, it is possible to attain both a reflow resistance (to package cracking) in case of the package absorbs moisture and a reliability in the moisture resistance and resistance to thermal shocks after the reflow.

According to the means of the foregoing item 22, a filler of spherical fine particles having a constant particle diameter is blended in the adhesive of the means of each of the foregoing items 1 to 21. As a result, the gap between the semiconductor chip and the leads can be controlled to a constant value (equal to the filler diameter) so that the dispersion of the capacity between the semiconductor chip and the leads can be reduced.

According to the means of the foregoing item 23, the semiconductor chip of the means of each of the foregoing items 1 to 21 is coated with an alpha ray shielding polyimide film at all its circuit forming region other than bonding pads, and the semiconductor chip is formed with an insulating film on its portions to which are adhered at least the leading ends of the inner leads or suspension leads. As a result, the whole circuit forming region can be shielded from the alpha rays by the alpha ray shielding polyimide film, and the semiconductor chip can be adhered and fixed by the insulating film.

Since, moreover, the insulating film is formed on the semiconductor chip at only the portions to which are adhered at least the leading ends of the inner leads and the suspension leads, it is possible to reduce the stray capacity between the semiconductor chip and the inner leads.

Incidentally, the wafer is not warped even if the thick insulators are formed by the wafer process but partially.

According to the means of the foregoing item 24, the insulating films of the means of the foregoing item 23 are made of a thermoset resin containing a printable inorganic filler. As a result, the insulating films can be made highly accurate in the wafer process.

According to the means of the foregoing item 25, the area occupied by the insulating films of the foregoing item 23 or 24 is at most one half of the chip area. As a result, the moisture absorption by the insulating films can be dropped to reduce the influences of the heat during the reflow and the in the temperature cycle.

Since, moreover, the stray capacity between the semiconductor chip and leads can be made smaller than that of the prior art, it is possible to improve the signal transmission rate and to reduce the electrical noises.

According to the means of the foregoing item 26, the semiconductor chip of the means of each of the foregoing items 22 to 24 is formed with a polyimide film at its side opposite to the principal surface. As a result, it is possible to prevent the cracking from being caused by the heat of the reflow.

According to the means of the foregoing item 27, the insulators of means of each of the foregoing items 23 to 26 are formed highly accurately by a wafer process including the steps of: a solvent-peeling type dry film to a semiconductor wafer; exposing and developing the dry film in an ordinary manner; applying a pasty insulator and burying it with squeezee; heating to cure the film; and peeling the film. Thus, the insulators can be formed highly accurately by the batch process to improve the productivity.

According to the means of the foregoing item 28, the insulators of the means of the foregoing item 26 are formed by developing and exposing a solder resist dry film. As a result, the productivity can be improved.

According to the means of the foregoing item 29, the insulating film is formed in a lead frame state on all or some of the inner leads opposed and closest to the semiconductor chip. As a result, the insulating film between the semiconductor chip and the inner leads of the means of the foregoing item 2 or 3 can be easily provided in an improved productivity.

According to the means of the foregoing item 30, the semiconductor chip has its principal surface covered wholly or partially with a substance which is more flexible or fluid than the sealing resin (or mold resin) to cover some or all of the bonding wires while the outside being sealed up with a resin. As a result, the mold resin can be kept away from direct contact with the bonding wires to prevent the bonding wires from being repeatedly deformed by the relative deformations between the semiconductor chip and the resin in the temperature cycle and accordingly from being broken due to fatigue.

According to the means of the foregoing item 31, the semiconductor chip has its principal surface covered wholly or partially with a bonding resin which covers some or all of the bonding wires while the outside being sealed up with the mold resin. As a result, the mold resin can be kept away from direct contact with the boding wires to prevent the bonding wires from being repeatedly deformed by the relative deformations between the semiconductor chip and the resin in the temperature cycle and accordingly from being broken due to fatigue.

According to the means of the foregoing item 32, the outer surface of the mold resin covering the side of the semiconductor chip of the means of the foregoing item 31 other than the main surface is recessed to expose a portion of the semiconductor chip substantially to the outside. The resin cracking during the reflow soldering operation can be prevented with neither poor moisture resistance of the bonding pads nor wire disconnection in the temperature cycle.

Here, the word "substantially" imagines that there exists either such a thin cover film of resin as will e inevitably formed on the surface of a semiconductor chip during the fabrication process or such a thin resin layer as will be broken in case a steam pressure is built up in the package.

According to the means of the foregoing item 33, the common inner leads (or bus bar inner leads) of the means of each of the foregoing items 30 to 32 are disposed in the vicinity of the X- or Y-directional center line of the principal surface of the semiconductor chip. As a result, the bonding wires of the reference voltage ($V_{SS}$) or the power source voltage ($V_{CC}$) in the semiconductor chip can be wired within a small area without any shorting. It is also possible to improve the workability of the wire bonding.

According to the means of the foregoing item 34, the semiconductor chip is formed with a recess or rise in its side other than the principal surface. As a result, the mold resin can be restricted by the semiconductor chip to reduce the stress which is to be generated in the mold resin portion of the corners of the non-circuit surface of the semiconductor chip to be subjected to the reflow cracking, so that this reflow cracking can be prevented.

According to the means of the foregoing item 35, the semiconductor chip is formed with a plurality of grooves in its non-circuit surface. As a result, the mold resin can be restricted by the semiconductor chip to reduce the stress which is to be generated in the mold resin portion of the corners of the non-circuit surface of the semiconductor chip to be subjected to the reflow cracking, so that this reflow cracking can be prevented.

According to the means of the foregoing item 36, the semiconductor chip is formed with a recess, a rise or a plurality of grooves in its side other than the principal surface while being left with a silicon oxide ($SiO_2$) film. Since the adhesion between the silicon oxide ($SiO_2$) film and the mold resin is strong, it is possible to prevent the peeling of the mold resin from the side of the semiconductor chip opposite to the circuit forming surface. Thanks to the recess or rise or the plural grooves, moreover, it is possible to reduce the stress which is generated in the mold resin portion of the corner of the non-circuit side of the semiconductor chip by the mold resin so that the reflow cracking can be prevented.

According to the means of the foregoing item 37, the distance from the portions of the inner leads contacting with the semiconductor chip to the outer wall of a package is made larger than the distance from the side of the semiconductor chip opposite to the principal surface to the outer wall of the package. As a result, the average flow speeds of the resin through the individual passages can be equalized to prevent the formation of voids and bending and shortage of packing of the bonding wires. Since, moreover, the resistances to the resin flows in the individual passages are equalized, the semiconductor chip and the leads can be prevented from changing to realize the molding of a highly reliable package.

According to the means for the foregoing item 38, the semiconductor chip is two in which the bonding pads to the inner leads are disposed in mirror symmetry, and wherein the inner leads and the bonding pads of the semiconductor chip are electrically connected across the inner leads at the side of the principal surface of the two semiconductor chips and are sealed up with a mold resin. As a result, it is possible to package the element having the twice capacity without changing the external shape.

According to the means of the foregoing item 39, the common inner leads (or bus bar inner leads) are arranged in the vicinity of the X- or Y-directional center line of the semiconductor chips of the means of each of the foregoing items 34 to 38. As a result, the bonding wires of the reference voltage ($V_{SS}$) or the power source voltage ($V_{CC}$) in the semiconductor chip can be wired within a small area without any shorting. It is also possible to improve the workability of the wire bonding.

According to the means of any of the foregoing items 40 to 42, the heat transfer surface area of the resin-sealed type semiconductor device can be enlarged to drop the heat resistance of the semiconductor device.

According to the means of the foregoing item 44, the semiconductor devices of the means of each of the foregoing items 40 to 43 are so packaged in their mounting substrates that their radiating grooves merge into each other. The cooling draft can be established in the direction of the radiating grooves and the second radiating grooves to cool the individual semiconductor devices efficiently.

According to the means of the foregoing item 45, the leads are partially folded outward with respect to the upper (or lower) side of the chip so that the distance between the chip and leads can be enlarged to reduce the aforementioned parasitic capacity.

DESCRIPTION OF THE PREFERRED EMBODIMENTS

Figure 1:
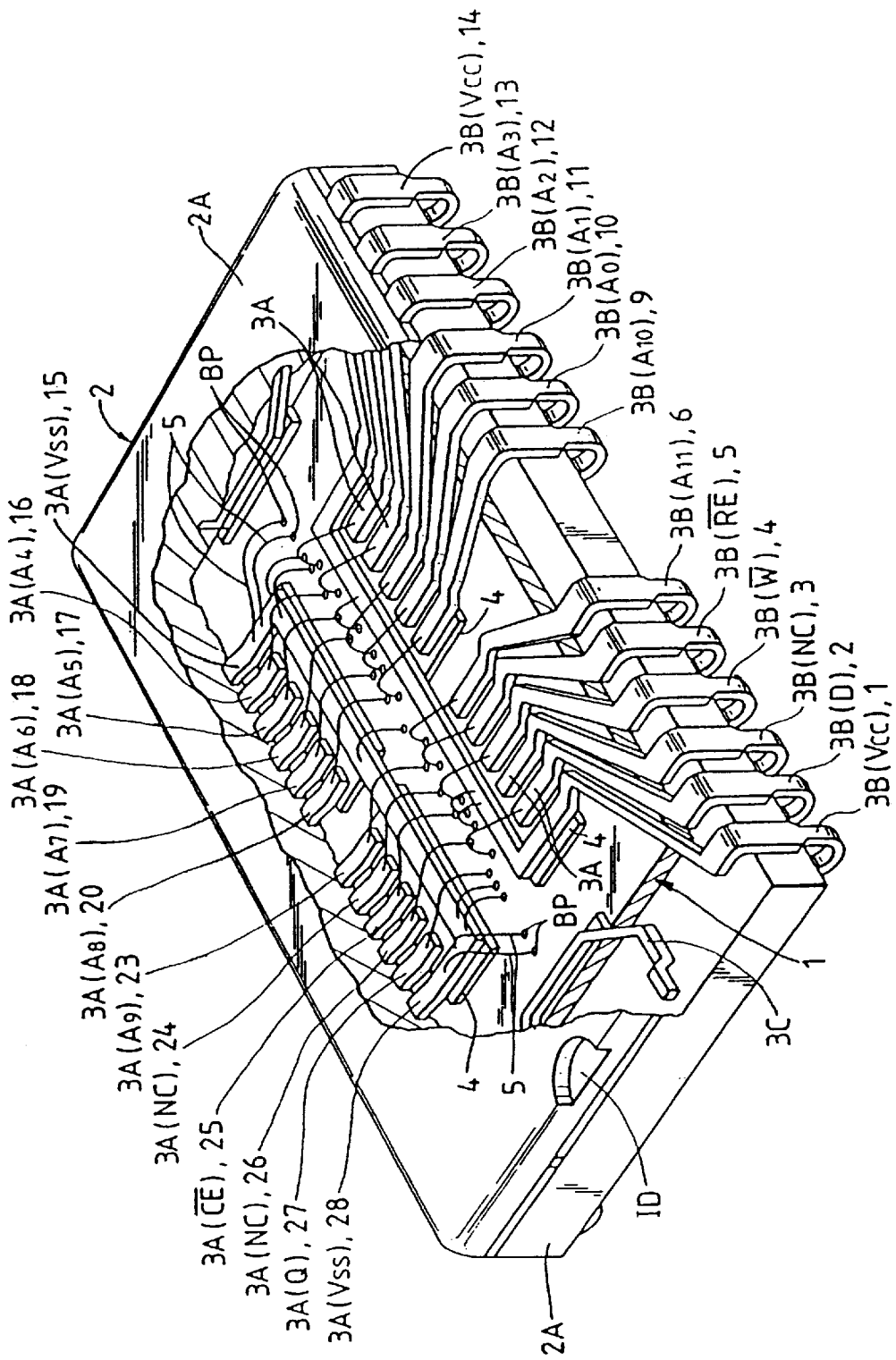
FIG. 1 is a partially sectional perspective view showing a resin-sealed type semiconductor device for sealing a DRAM according to Embodiment I of the present invention.

The present invention will be specifically described in the following in connection with the embodiments thereof with reference to the accompanying drawings.

Throughout all the drawings for explaining the embodiments, the portions having identical functions are designated at identical reference characters, and their repeated descriptions will be omitted.

Embodiment I

Figure 2:
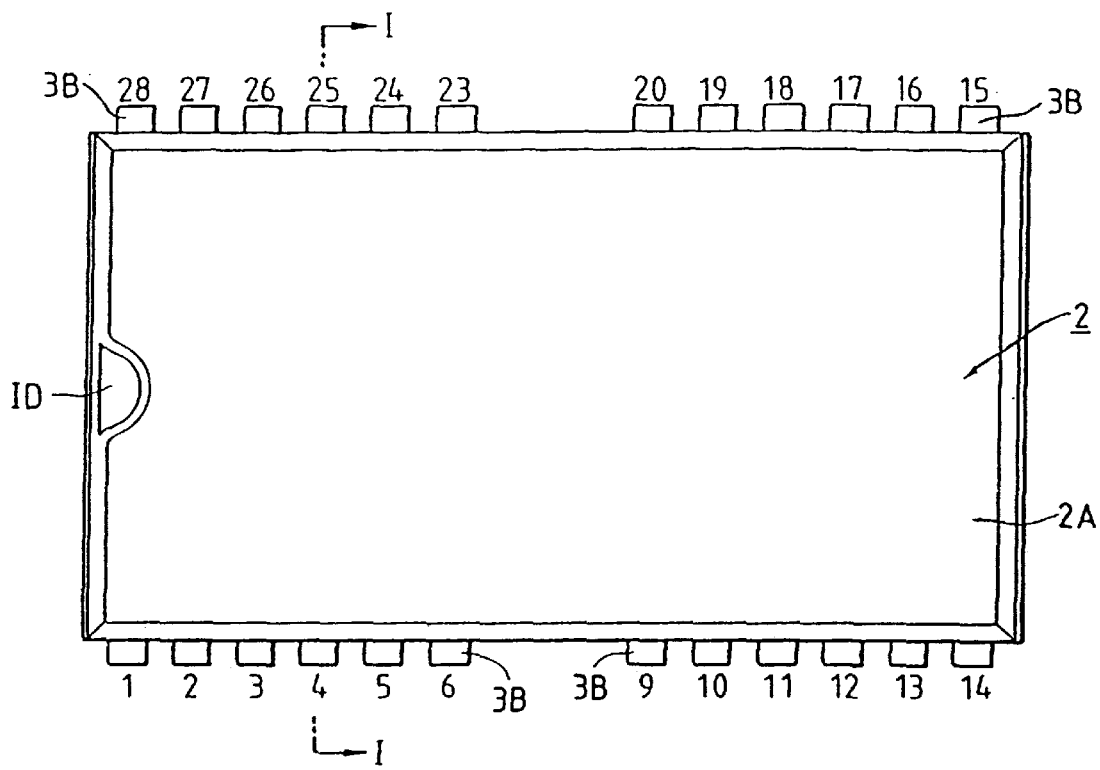
FIG. 2 is a top plan view of FIG. 1.
Figure 3:
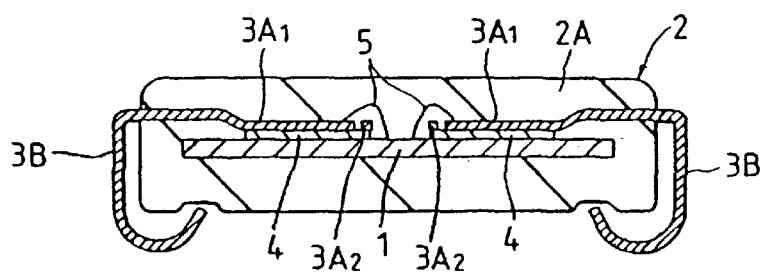
FIG. 3 is a section taken along line I—I of FIG. 2.

A resin-sealed type semiconductor device for sealing a DRAM according to the embodiment I of the present invention is shown in FIG. 1 (in partially sectional perspective view), in FIG. 2 (in top plan view) and in FIG. 3 (in section taken along line I—I of FIG. 2).

As shown in FIGS. 1, 2 and 3, a DRAM (i.e., a semiconductor chip) 1 is sealed with an SOJ (Small Outline J-bend) type resin-sealed package 2. The DRAM 1 is made to have a large capacity of 16 (Mbits)×1 (bit) and a rectangular area of 16.48 (mm)×8.54 (mm). This DRAM 1 is sealed with the resin-sealed package 2 of 400 (mil).

The DRAM 1 has its principal surface arranged mainly with a memory cell array and a peripheral circuit. The memory cell array is arranged in a matrix form with a plurality of memory cells (or elements) for storing information of 1 (bit), as will be described in detail hereinafter. The peripheral circuit is comprised of a direct peripheral circuit and an indirect peripheral circuit. The direct peripheral circuit is one for directly controlling the information writing and reading operations of the memory cells. This direct peripheral circuit includes a row-address decoder, a column address decoder and a sense amplifier. The indirect peripheral circuit is one for controlling the operations of the direct peripheral circuit indirectly. This indirect peripheral circuit includes a clock signal generator and a buffer.

The principal surface of the DRAM 1, i.e., the surface arranged with the memory cell array and the peripheral circuit is arranged with inner leads 3A. Insulating films 4 are sandwiched between the DRAM 1 and the inner leads 3A. The insulating films 4 are made of a resin film of polyimide or the like. The individual surfaces of the insulating films 4 at the sides of the DRAM 1 and the inner leads 3A are formed with adhesive layers. These adhesive layers are made of a resin such as a polyether amide-imide resin or an epoxy resin. The resin-sealed package 2 of this kind adopts the LOC (Lead On Chip) structure in which the inner leads 3A are arranged over the DRAM 1. The resin-sealed type package 2 adopting this LOC structure can handle the inner leads 3A freely without being restricted by the shape of the DRAM 1 so that it can seal up the DRAM 1 having a size enlarged according to the free handling. In other words, the resin-sealed package 2 adopting the LOC structure can suppress the sealing (or package) size, even if the DRAM 1 has its size enlarged according to the large capacity, thereby to enhance the packing density.

The inner leads 3A have their one-side ends made integral with outer leads 3B. These outer leads 3B are specified with signals to be applied thereto, on the basis of the standards and are numbered. In FIG. 1, the lefthand foremost one is the 1st terminal, and the righthand foremost one is the 14th terminal. The righthand rear one (the terminal number of which is shown at the inner lead 3A) is the 15th terminal, and the lefthand rear one is the 28th terminal. In short, the resin-sealed type package 2 is comprised of totally 24 terminals, i.e., the 1st to 6th terminals, the 9th to 14th terminals, 15th to 20th terminals and 23th to 28th terminals.

The 1st terminal is one for a power source voltage $V_{CC}$. This power source voltage $V_{CC}$ is at 5 (V) for operating the circuit, for example. The 2nd terminal is a data input signal terminal (D); the 3rd terminal is an idle terminal; the 4th terminal is a write enable signal terminal ($\overline{W}$); the 5th terminal is a row address strobe signal terminal ($\overline{RE}$); and the 6th terminal is an address signal terminal ($A_{11}$).

The 9th terminal is an address signal terminal ($A_{10}$); the 10th terminal is an address signal terminal ($A_0$); the 11th terminal is an address signal terminal ($A_1$); the 12th terminal is an address signal terminal ($A_2$); and the 13th terminal is an address signal terminal ($A_3$). The 14th terminal is a power source voltage $V_{CC}$ terminal.

The 15th terminal is a reference voltage $V_{SS}$ terminal. This reference voltage $V_{SS}$ is at the reference level of 0 (V) of the circuit. The 16th terminal is an address signal terminal ($A_4$); the 17th terminal is an address signal terminal ($A_5$); the 18th terminal is an address signal terminal ($A_6$); the 19th terminal is an address signal terminal ($A_7$); and the 20th terminal is an address signal terminal ($A_8$).

The 23th terminal is an address signal terminal ($A_9$); the 24th terminal is an idle terminal; the 25th terminal is a column address strobe signal terminal ($\overline{CAS}$); the 26th terminal is an idle terminal; and the 27th terminal is a data output signal terminal. The 28th terminal is a reference voltage $V_{SS}$ terminal.

The other-side ends of the inner leads 3A are extended across the longer sides of the rectangular DRAM 1 to the center of the DRAM 1. The other ends of the inner leads 3A have their extensions connected with bonding pads (or external terminals) BP arrayed at the center of the DRAM 1 through bonding wires 5. These bonding wires 5 are made of aluminum (Al) but may be exemplified by gold (Au) wires, copper (Cu) wires or coated wires which are prepared by coating metal wires with an insulating resin. The bonding wires 5 are bonded by the method using the hot contact bonding together with the ultrasonic vibrations.

Of the inner leads 3A, the 1st and 14th ($V_{CC}$) terminals 3A are made integral with each other, and their central portions of the DRAM 1 are extended in parallel with their longer sides (namely, the inner leads ($V_{CC}$) 3A are called the "common inner leads" or "bus bar inner leads"). Likewise, the 15th and 28th inner lead terminals ($V_{SS}$) 3A are made integral with each other, and their central portions of the DRAM 1 are extended in parallel with their longer sides (namely, these inner leads ($V_{SS}$) 3A are called the "common inner leads" or "bus inner leads"). The inner leads ($V_{CC}$) 3A and the inner leads ($V_{SS}$) 3A are extended in parallel in the regions which are defined by the other-side leading ends of the remaining inner leads 3A. These inner leads ($V_{CC}$) 3A and inner leads ($V_{SS}$) 3A are so constructed as can supply the power source voltage $V_{CC}$ and the reference voltage $V_{SS}$ in any position of the principal surface of the DRAM 1. In short, this resin-sealed type semiconductor device is constructed to absorb the power source noises easily and to speed up the operations of the DRAM 1.

The shorter side of the rectangular DRAM 1 is equipped with a chip supporting lead 3C.

The inner leads 3A, the outer leads 3B and the chip supporting lead 3C are cut from the lead frame and are molded. This lead frame is made of a Fe—Ni alloy (containing 42 to 50 (%) of Ni) or Cu.

The DRAM 1, bonding wires 5, inner leads 3A and chip supporting lead 3C thus far described are sealed up with a mold resin 2A. In order to drop the stress, this mold resin 2A is exemplified by an epoxy resin to which are added a phenol hardener, silicone rubber and a filler. The silicone rubber has an action to drop the modulus of elasticity of the epoxy resin as well as the thermal expansion coefficient. The filler is made of balls of silicon oxide and has an action to drop the thermal expansion coefficient. On the other hand, the package 2 is formed in its predetermined position with an index ID (in the form of a notch located at the lefthand end of FIGS. 1 and 2).

Figure 4:
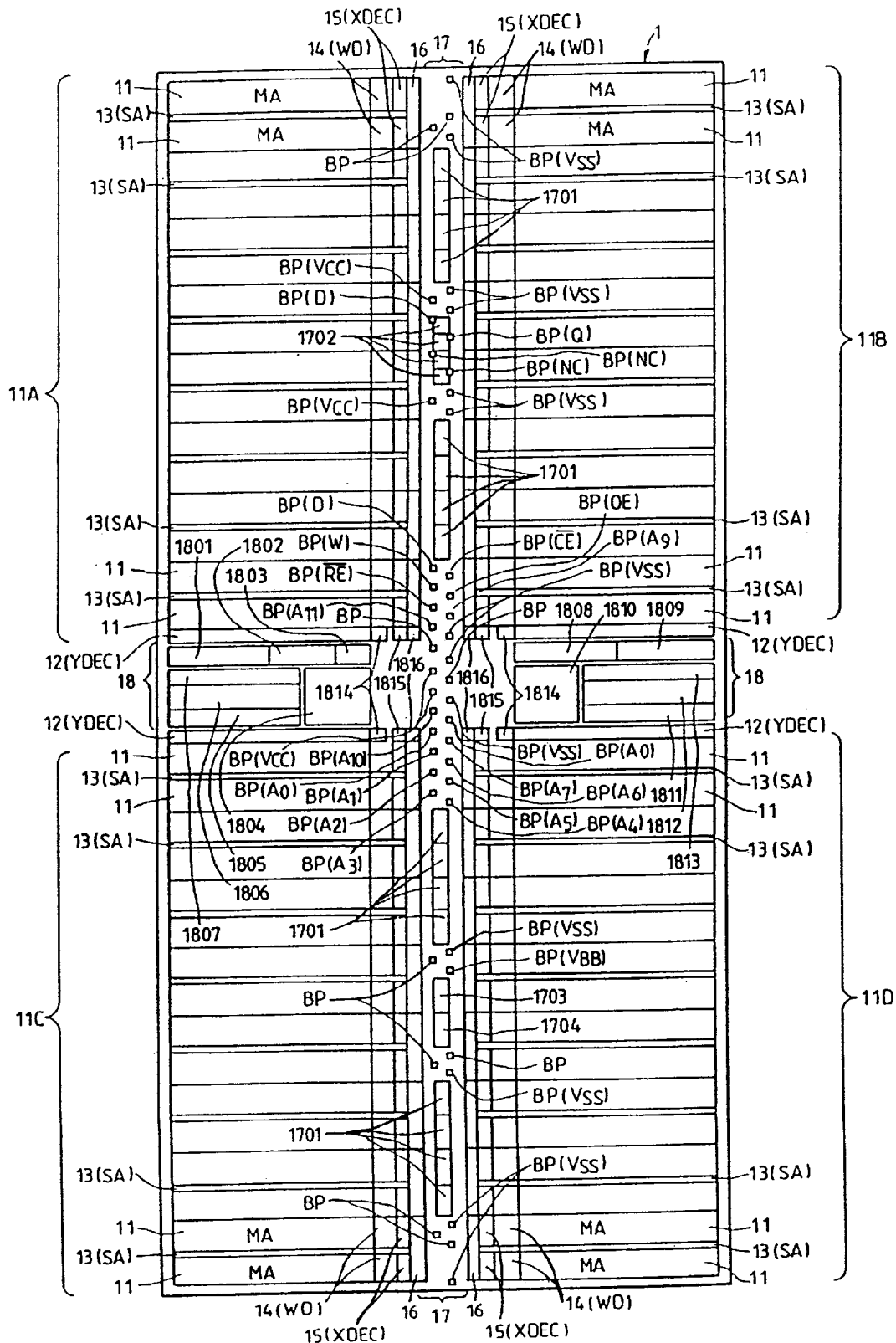
FIG. 4 is a layout showing the schematic structure of the DRAM shown in FIG. 1.

Next, the structure of the DRAM 1 sealed up with the resin-sealed type package 2 is schematically shown in FIG. 4 (in a chip layout).

As shown in FIG. 4, the DRAM 1 is arranged substantially all over its surface with a memory cell array (MA) 11.

The DRAM 1 of the present embodiment I has its memory cell array coarsely divided into four memory cell arrays 11A to 11D, although not limitative thereto. As shown in FIG. 4, the two memory cell arrays 11A and 11B are arranged at the upper side of the DRAM 1 whereas the two memory cell arrays 11C and 11D are arranged at the lower side. Each of these four memory cell arrays 11A and 11D is finely divided into sixteen memory cell arrays (MA) 11. In short, the DRAM 1 is arranged with sixty four memory cell arrays 11. Each of these sixty four memory cell arrays 11 has a capacity of 256 (Kbits).

Between every two of the sixty four memory cell arrays 11 of the DRAM 1, there is arranged a sense amplifier (SA) 13. This sense amplifier 13 is constructed of a complementary MOSFET (i.e., CMOS). Of the four memory cell arrays of the DRAM 1, each of the memory cell arrays 11A and 11B is arranged at its lower end with a column address decoder (YDEC) 12. Likewise, each of the memory cell arrays 11C and 11D is arranged at its upper end with a column address decoder (YDEC) 12.

Of the four memory cell arrays of the DRAM 1, each of the memory cell arrays 11A and 11C is arranged at its righthand end with a word driver (WD) 14, a row address decoder (XDEC) 15 and a unit mat controller 16, which are disposed sequentially from the left to the right. Likewise, each of the memory cell arrays 11A and 11C is arranged at its lefthand end with a word driver (WD) 14, a row address decoder (XDEC) 15 and a unit mat controller 16, which are disposed sequentially from the right to the left.

Each of the sense amplifier 13, column address decoder 12, word driver 14 and row address decoder 15 described above constitutes of the direct one of the peripheral circuits of the DRAM 1. This direct peripheral circuit is one for directly controlling the memory cells which are arranged in the finely-divided memory cell arrays 11.

Peripheral circuits 17 and external terminals BP are interposed between the memory cell arrays 11A and 11B and between the memory cell arrays 11C and 11D of the four memory cell arrays of the DRAM 1. The peripheral circuits 17 are exemplified by a main amplifier 1701, an output buffer 1702, a substrate potential generator (i.e., $V_{BB}$ generator) 1703 and a power source circuit 1704. Totally sixteen main amplifiers 1701 are arranged four at a unit. Totally four output buffers 1702 are arranged.

The external terminals BP are arranged at the center of the DRAM 1 because the aforementioned resin-sealed type semiconductor device 2 is constructed to have the LOC structure so that the inner leads 3A are extended to the center of the DRAM 1. The external terminals 1 are arranged from the upper to the lower sides of the DRAM 1 within the regions which are defined by the memory cell arrays 11A and 11C, and 11B and 11D. The signals to be fed to the bonding pads (or external terminals) BP have been described before in connection with the resin-sealed type semiconductor device 2 shown in FIG. 4, and their descriptions will be omitted here. Since the inner leads 3A fed with the reference voltage ($V_{SS}$) and the power source voltage ($V_{CC}$) are basically extended from the upper to the lower sides on the surface of the DRAM 1, the DRAM 1 is arranged the plural external terminals BP for the reference voltage ($V_{SS}$) and the power source voltage ($V_{CC}$) in the extending direction thereof. In short, the DRAM 1 is so constructed as can feed the reference voltage ($V_{SS}$) and the power source voltage ($V_{CC}$) sufficiently. The data input signals (D), the data output signals (Q), the address signals ($A_0$ to $A_{11}$), the clock signals and the control signals are concentrated at the center of the DRAM 1.

Peripheral circuits 18 are interposed between the memory cell arrays 11A and 11C and the memory cell arrays 11B and 11D of the four memory cell arrays of the DRAM 1. These peripheral circuits 18 are exemplified at a lefthand side by a row address strobe (RE) circuit 1801, a write enable (W) circuit 1802, a data input buffer 1803, a power source voltage ($V_{CC}$) limiter 1804, an X-address driver (or logical stage) 1805, an X-redundancy circuit 1806, and an X-address buffer 1807. The righthand side of the peripheral circuits are exemplified by a column address strobe (CE) circuit 1808, a test circuit 1809, a VDL limiter 1801, a Y-address driver (or logical stage) 1811, a Y-redundancy circuit 1812 and a Y-address buffer 1813. The center of the peripheral circuits 18 are exemplified by a Y-address driver (or drive stage) 1814, an X-address driver (or drive stage) 1815 and a mat selection signal circuit (or drive stage) 1816.

The aforementioned peripheral circuits 17 and 18 (and 16) are used as the indirect peripheral circuits of the DRAM 1.

Next, the detail of the lead frame will be described in the following.

Figure 5:
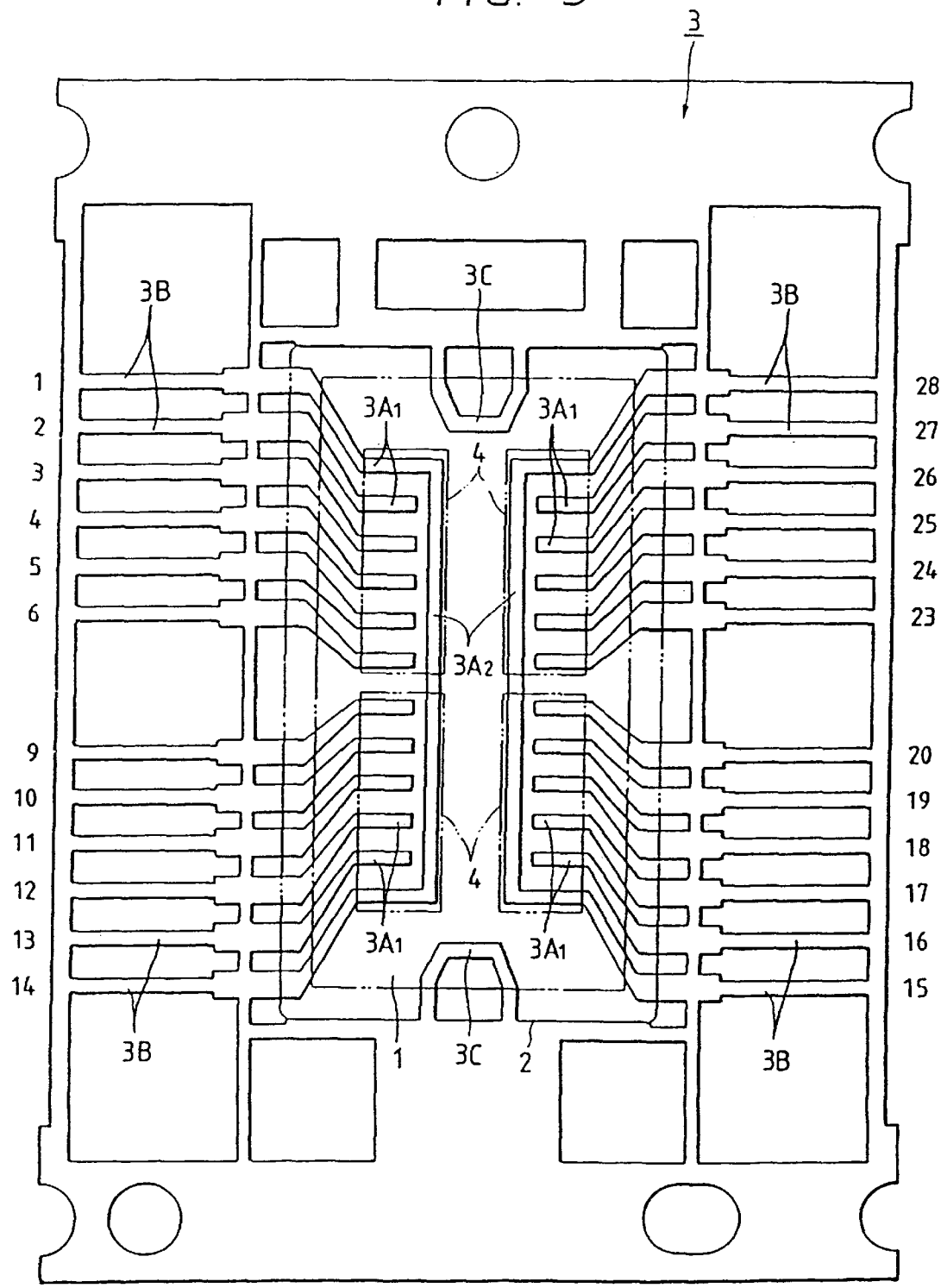
FIG. 5 is an overall top plan view showing the lead frame shown in FIG. 1.

The lead frame of the present embodiment I is equipped, as shown in FIG. 1 and FIG. 5 (i.e., in a top plan view of the whole lead frame), with twenty signal inner leads $3A_1$ and two common inner leads $3A_2$. The inner leads 3A (i.e., the signal inner leads $3A_1$ and the common inner leads $3A_2$) are so stepped that the gap between the portions of the inner leads 3A to be adhered to the insulating films (or members) 4 and the semiconductor chip 1 is larger than the gap between the portion to be bonded to the insulating films (or members) 4 and the semiconductor chip 1. Thanks to the stepped structure of the inner leads 3A, the stray capacity between the semiconductor chip and the leads is smaller than that of the prior art. As a result, it is possible to improve the signal transmission rate and to drop the electrical noises.

Figure 6:
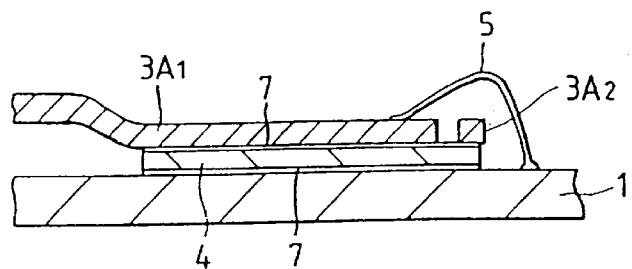
FIGS. 6 and 7 are sections showing essential portions showing the relations between the inner leads and the semiconductor chip shown in FIG. 1.
Figure 7:
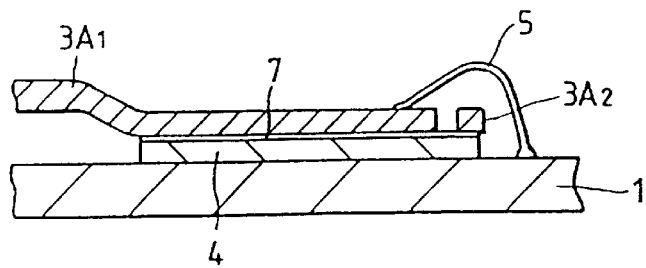

On the other hand, the adhesion between the principal surface of the semiconductor chip 1 and the insulating film 4 and the adhesion between the insulating film 4 and the inner leads 3A are effected by means of an adhesive 7, as shown in FIG. 6. Alternatively, this adhesive 7 may be used not for adhering the principal surface of the semiconductor chip 1 and the insulating film 4 but only for adhering the insulating film 4 and the inner leads 3A, as shown in FIG. 7.

Incidentally, the inner leads 3A can attain the aforementioned effects even if they are applied to a package having none of the common inner leads $3A_2$.

In the predetermined positions of the lead frame, as shown in FIGS. 1 and 5, there are disposed the chip supporting (or suspending) leads 3C which are not supplied with any electric power but for adhering and fixing the principal surface of the semiconductor chip 1.

Since the semiconductor chip 1 is firmly fixed by adhering and fixing the principal surface of the semiconductor chip 1 by means of the suspending leads 3C of no power supply, it is possible to improve the reliability and the moisture resistance of the semiconductor device.

Next, the detail of the insulating films 4 will be described in the following.

The area of the principal surface of the semiconductor chip 1 occupied by the insulating films 4 is at most one half of the area of the semiconductor chip 1. Since the area of the insulating films 4 is thus made at most one half of the area of the semiconductor chip 1, the moisture adsorption by the insulating films 4 can be reduced to prevent the influences of both the heat during the reflow and the steam which is generated by the heat of the temperature cycle. In other words, the package can be prevented from being cracked to improve the reliability of the semiconductor device.

Since, moreover, the stray capacity between the semiconductor chip 1 and the leads is smaller than that of the prior art, it is possible to improve the signal transmission rate and to drop the electrical noises.

Still moreover, the aforementioned effects can be made more prominent by practically minimizing the area of bonding the insulating films 4 and the principal surface of the semiconductor chip 1. On the other hand, the leakage between the leads can be reduced because only the portions of the inner leads to be adhered to the semiconductor chip are covered with the insulating films.

Figure 8:
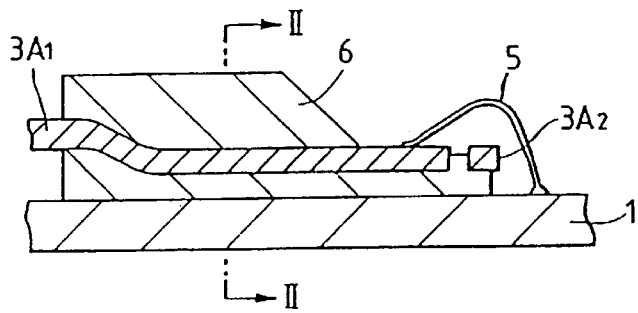
FIG. 8 is a section showing the schematic structure of the resin molding according to another embodiment of the insulator shown in FIG. 1.
Figure 9:
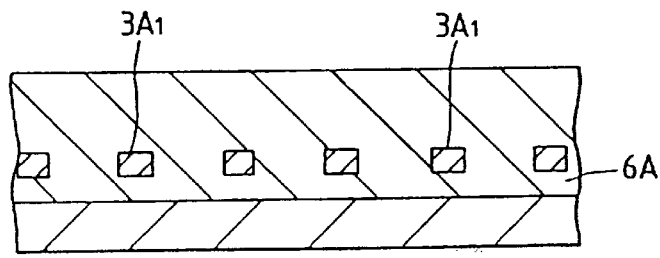
FIG. 9 is a section taken along line II—II of FIG. 8.

On the other hand, the insulating films 4 over the principal surface of the semiconductor chip 1 may be modified, as shown in FIG. 8, such that a resin molding 6 containing portions of the aforementioned inner leads 3A is used to sufficiently enlarge the gap between the semiconductor chip 1 and the inner leads 3A thereby to reduce the stray capacity between the semiconductor chip 1 and the inner leads 3A.

Thus, the resin molding 6 and the mold resin 2A can be made of the material of good affinity so that the leads can be less peeled at their interfaces.

Figure 10:
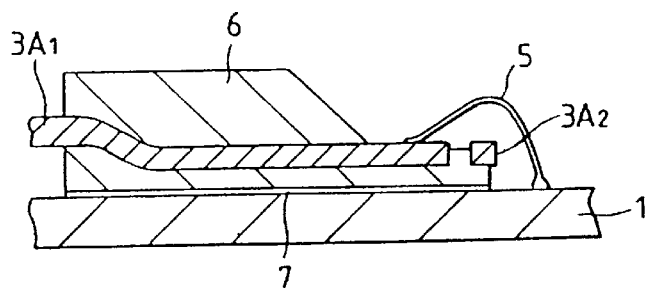
FIG. 10 is a section showing the adhered portions of the resin molding and the semiconductor chip of FIG. 8.

The adhesion between the resin molding 6 and the semiconductor chip 1 may be effected by means of the adhesive 7, as shown in FIG. 10.

The base material of the insulating films 4 and the resin molding 6 are molded of: one or more major components, which are selected from an epoxy resin, a BT (Bismaleimide Triazine) resin, a phenol resin (i.e., resol) and a polyimide resin (e.g., aromatic polyimide or cycloaliphatic polyimide containing ether and carbonyl bonds; and an inorganic filler, a fibrous hardener or various additives, if necessary.

Other examples of the base material of the insulating films 4 and the resin molding 6 are molded of: a major component of a thermoplastic resin such as cycloaliphatic polyimide, polyester, polysulfone, aromatic polyether amide, aromatic polyester imide, polyphenylene sulfide, polyamide-imide or its modified, polyether etherketone, polyether sulfone or polyether amide-imide; and an inorganic filler, fibers and an additive, if necessary.

On the other hand, the adhesive for bonding the insulating films 4 or the resin molding 6 to the inner leads 3A and the semiconductor chip 1 can be selected from one of: an epoxy resin, a BT resin, a phenol resin (or resol), a polyimide resin, an isomelanic resin and a silicon resin; a thermoset resin modified from the above-specified resins; and a thermoplastic resin such as aromatic polyether amide, polyether-etherketone, polysulfone, aromatic polyester imide, polyester or cycloaliphatic polyimide.

In the face mounting package type integrated circuit such as SOJ, the vapor-phase reflow solder method or the infrared reflow solder method is used in the case of solder packaging on a printed circuit board (PCB). In this case, however, the moisture in the package may be gasified and expanded by the reflow temperature (at 215 to 260° C.) to peel the adhesion at the chip interface until the the internal pressure in the peeled faces is raised to crack the sealing resin.

Since the LOC structure is made by bonding the inner leads 3A and the semiconductor chip 1 with the insulating films 4 and the resin molding 6, the aforementioned phenomena are accelerated by the moisture absorption of the insulating films 4 or the resin molding 6. For avoiding the phenomena, therefore, it is effective to reduce the volume of the insulating films 4 thereby to decrease the moisture absorption.

The lower limit of the bonded area is that which can stand the external force to be borne at the wire bonding step and the resin molding step.

Here will be examined the physical properties of the insulator of the aforementioned insulating films 4 or the resin molding 6.

The bonding insulating material to be used between the inner leads 3A and the semiconductor chip 1 of the semiconductor device having the LOC structure or the COL (Chip On Lead) structure has to satisfy at least two of the following seven conditions:

(1) The saturated moisture absorption is equal to lower than that of the sealing resin;

This condition is effective for preventing the resin cracking when in the vapor-phase solder (VPS).

(2) The dielectric constant is 4.0 or less (at $10^3$ Hz at the room temperature to 200° C.);

This condition reduces the stray capacity between the inner leads and the semiconductor chip.

(3) The barcol hardness at 200° C. is 20 or more;

This condition improves the wire bonding properties.

(4) The contents of U and Th are 1 ppb or less, and the amount of an soluble halogen extracted at 120° C. for 100 hours is 10 ppm or less;

This condition is effective for preventing the soft error and improving the moisture resistance.

(5) The contactness of the semiconductor chip and the inner leads is excellent;

This condition can retain the wire bonding property, improve the moisture resistance and prevent the current leakage between the inner leads.

(6) The linear thermal expansion coefficient is $20 \times 10^{-6}$/°C. or less; and This condition reduces the warpage, in case an insulating material is bonded to the inner leads 3A, to improve the bondability to the semiconductor chip at a subsequent step.

(7) The glass transition temperature Tg is 220° C. or higher in the case of the thermoplastic resin.

This condition is effective for preventing the material having a glass transition temperature Tg of 220° C. or lower from being thermally deformed at a high temperature (e.g., 215° C.) in the reflow solder to cause a package cracking.

Examples of the material satisfying at least two of the above-specified conditions will be described in the following.

For example, the film prepared by the following process was the material satisfying the above conditions except the item (1): The process includes: the step of roughing the two sides of the Kapton 500 H (i.e., the polyimide film produced by Du Pont or Upilex S (i.e., the polyimide film produced by Ube Kosan K.K.); and the step of coating the two sides with 25 microns of polyether amide having a glass transition temperature Tg of 320 or more.

The conditions (1) to (6) were satisfied by the film which was prepared by applying and drying an adhesive of 10 to 25 microns, which was selected from an epoxy resin, a resol resin, an isomelamine resin, a phenol-modified epoxy resin and an epoxy-modified polyimide resin, to the two sides of a bismaleimide, epoxy or epoxy-modified polyimide film of 125 microns reinforced by highly pure quartz fibers or aramid fibers.

On the other hand, the following film satisfied all the conditions and was features in its low moisture absorptibity and small dielectric constant. The film was prepared: by improving the adhesiveness of the two sides of the film of Teflon PFA (i.e., a copolymer of tetraethylenefluoride-perfluoroalkoxy, Teflon EFP (i.e., a copolymer of tetraethylenefluoride-perhexapropylenefluoride) or Kapton F-type (i.e., the product of Toray and Du Pont, the Kapton film having its two sides thinly coated with the Teflon FEP); and by coating the two sides of the film with an adhesive selected from an epoxy resin, a resol resin,, an aromatic polyetheramide resin and a polyimide precursor.

Here will be described the method of adhering and fixing the semiconductor chip 1 to the lead frame 3 through the insulating films 4 means of an adhesive.

Figure 11:
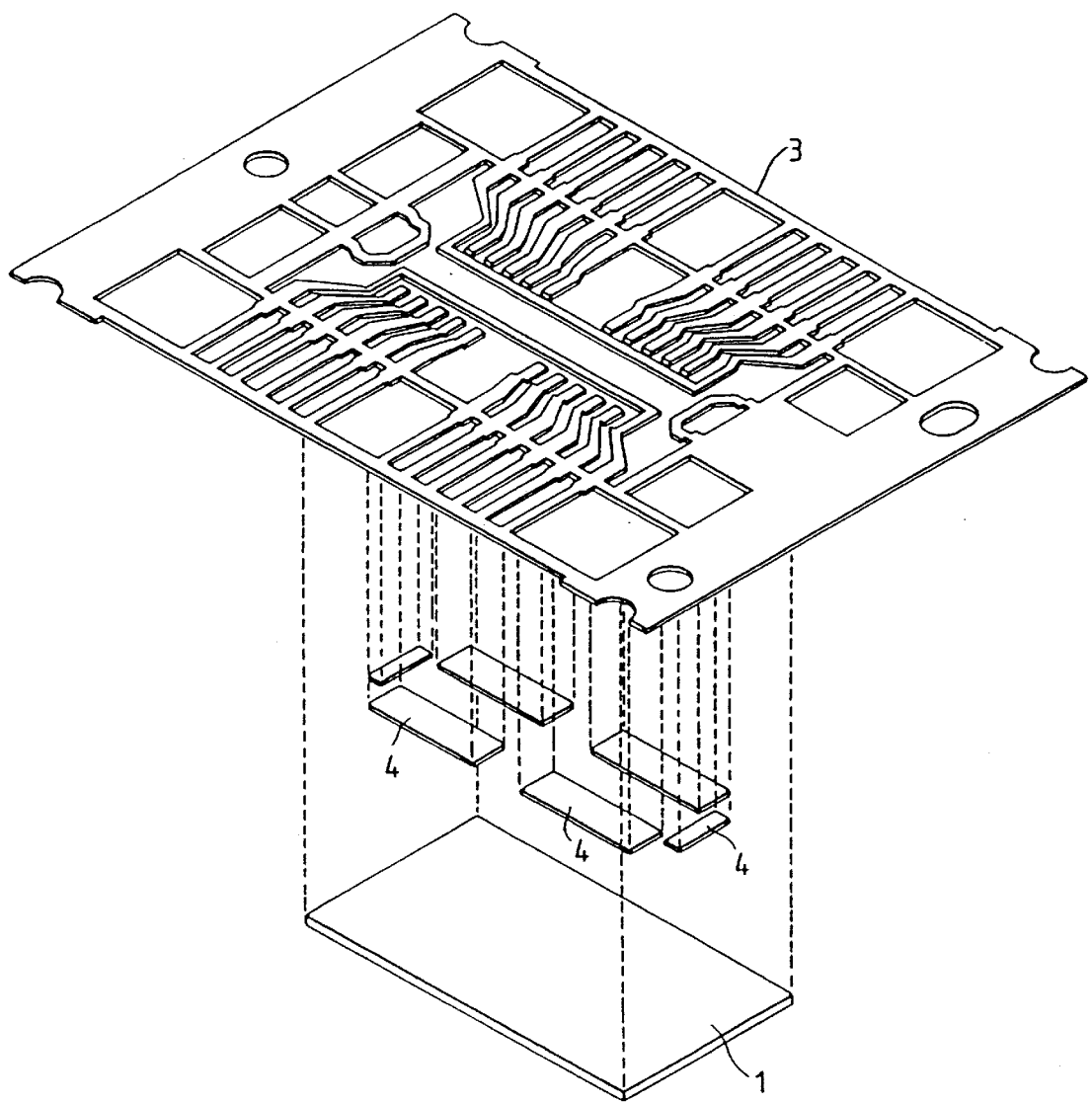
FIG. 11 is an exploded assembly view showing the relations among the semiconductor chip, the insulator and the lead frame shown in FIG. 1.

As shown in FIG. 11 (in a development presenting the relations among the lead frame 3, the insulating films 4 and the semiconductor chip 1), the insulating films 4 are divided and adhered to those portions of the principal surface of the semiconductor chip 1, which face the signal inner leads 3A, the common inner leads $3A_2$ and the suspending leads 3C, by means of the adhesive 7 (shown in FIGS. 1 and 6). Next, as shown in FIG. 6, the signal inner leads $3A_1$, the common inner leads $3A_2$ and the suspending leads 3C of the lead frame 3 are fixedly adhered by the adhesive 7.

The examples of the mold resin material (or resin) will be described in the following:

(1) The resin composite to be used is exemplified by a thermoset resin which is blended with 70 wt. % of a substantially spherical inorganic filler having a particle size distribution of 0.1 to 100 microns, an average particle diameter of 5 to 20 microns and the maximum packing density of 0.8 or more.

The resin component in this case may be any of epoxy, resol or polyimide.

Figure 12:
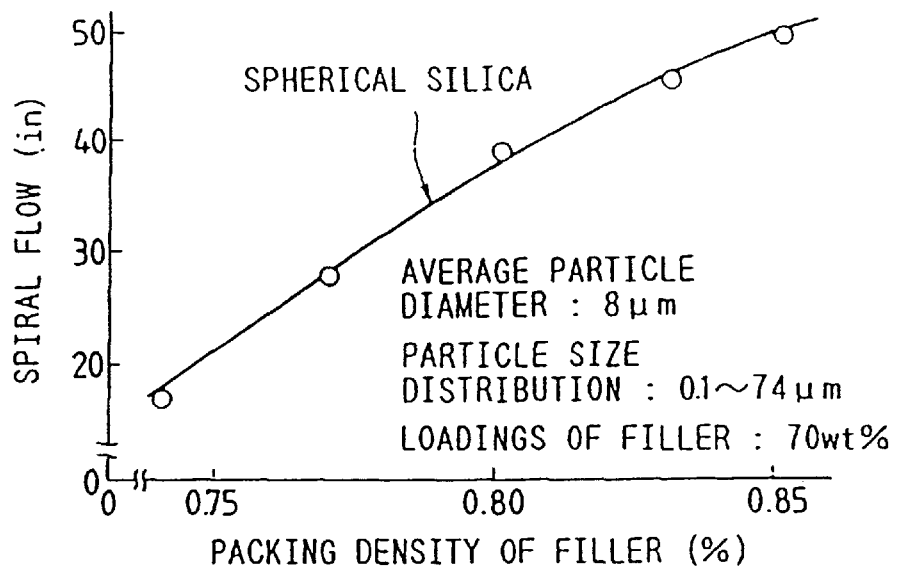
FIGS. 12, 13 and 14 are diagrams for explaining the characteristics of mold resin materials.
Figure 13:
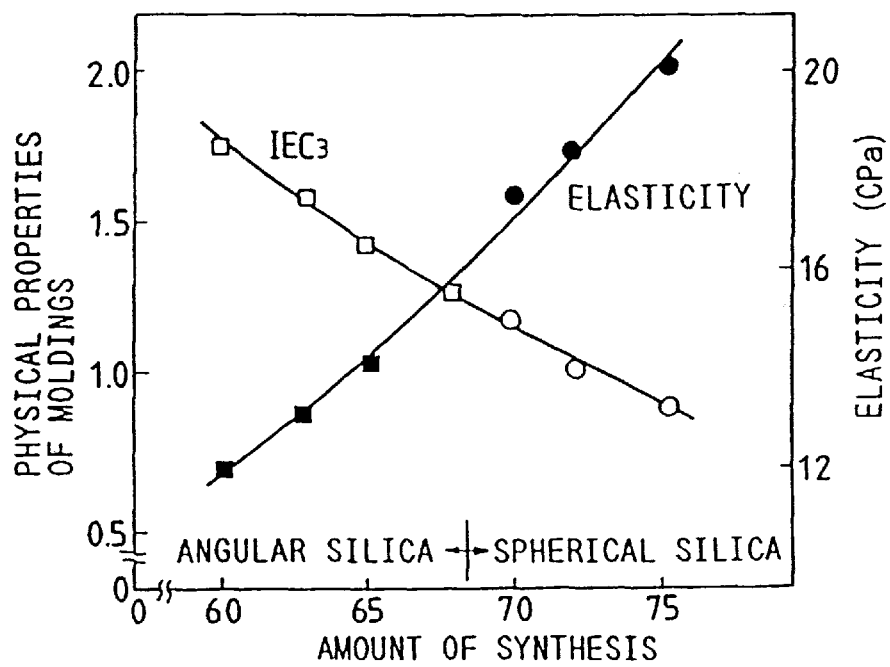
Figure 14:
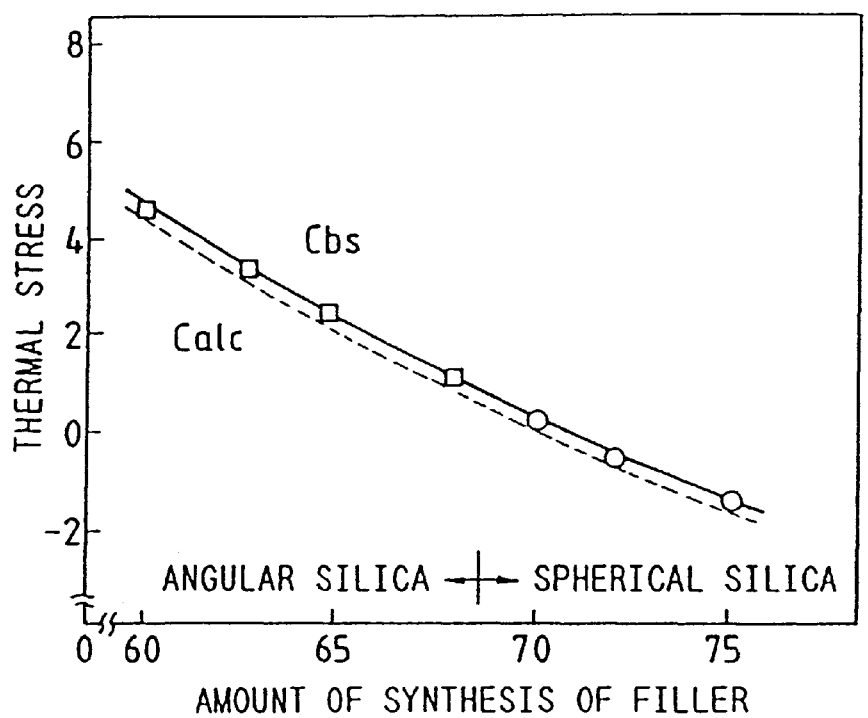

Thus, the mold resin material using the above-specified spherical inorganic filler (e.g., molten silica) can be more blended to reduce the thermal expansion of the material, because its material exerts little influence upon the molten viscosity and fluidity, as shown in FIG. 12 (plotting the relation between the packing density of the filler and the fluidicity). By increasing the loading of the filler, moreover, the thermal stress of the moldings can be dropped, as shown in FIG. 13 (plotting the relations between the amount of synthesis of the filler and the physical properties of the moldings) and FIG. 14 (plotting the relations between the amount of synthesis of the filler and the thermal stress). This improves the cracking resistance to a satisfactory extent.

Thus, it is possible to prevent a semiconductor device, which has an especially fine structure such as the LOC structure, from being deformed or damaged when it is to be molded.

(2) The resin compound to be used is comprised mainly of at least one kind of a highly pure phenol-set type epoxy resin, resol type phenol resin and bismaleimide resin.

The properties of the set device in case the an unpurified resol resin is used are highly different from those of the purified device such that the bulk resistance is different by three figures or more at 140° C., as tabulated in Table 1 (as located at the tailing page). Because of much ionic impurity, moreover, there is also found a large difference in the electric conductivity of an extracted liquid.

The purified resol resin was produced, for example, by pouring 500 g of phenol, 550 g of formalin of 30% and 5 g of zinc acetate as a hardener into a flask, by gradually agitating and heating them, and by circulating and heating them at 90° C. for 60 minutes. After this, the inside of the flask was evacuated to 20 mmHg, and the condensate and the unreacted components were removed. Next, 300 g of acetone was added to dissolve the reaction products, and pure water was added to agitate them violently at 50° C. for 30 minutes. After the cooling, the upper water layer was removed, and the reaction products were dissolved again into 300 g of acetone. Pure water was then added to agitate them violently at 50° C. for 30 minutes. After the cooling, the upper water layer was removed. These cleaning operations were repeated five times. After each of these cleaning operations, the reaction products were partially taken out and dried at 40° C. for 48 hours under an evacuated condition, to produce six kinds of resol type phenol resins of different degrees of refinement.

The number of purifications, the melting point and the setting characteristics of the resol type phenol resins thus obtained; the analytical results of the hydrogen ion density (pH) and the electric conductivity of the extracted water, which was prepared by adding 50 g of pure water to 50 g of resol type phenol resins and by heating them at 120° C. for 120 hours; and the analytical result of the concentration of the ionic impurities extracted are tabulated in Table 2 (as located at the trailing page).

As is apparent from Table 2, the resol type phenol resins having been subjected to the aforementioned cleaning operations by five times contain remarkably small amounts of ion impurities.

Thus, the purifications can improve the reliabilities in the moisture resistance of the moldings, the hot lifetime of the Au/Al bonded portions, and the characteristics of the element due to the differences in the aforementioned characteristics.

(3) The molding resin materials to be used are exemplified by the examples 2 and 3 of Table 1, which are comprised mainly of resol type phenol resins or bismaleimide resins of high purity and whose moldings have a bending strength of 3 kgf/mm² or more at 215° C.

Since the sealing materials using the resol type phenol resins or polyimide resins of high purity have a high heat resistance for their moldings and a bending strength of 3 kgf/mm² or more at 215° C., the reflow resistance (to package cracking) in the case of the packages having absorbed the moisture and the reliabilities in the moisture resistance and the resistance to the thermal shocks are improved to a remarkably statistactory extent.

(4) The inorganic filler to be blended into the base resin of the foregoing item (2) or (3) is exemplified by any of the Examples 1, 2 and 3 of Table 1, i.e., substantially spherical silica having a particle size distribution of 0.1 to 100 microns, an average particle diameter of 5 to 20 microns and the maximum packing density of 0.8 or more.

Thus, the sealing material using the above-specified spherical molten silica has its molten viscosity and fluidicity little influenced so that its thermal expansion can be dropped by increasing its loading. As a result, the package acquires an excellent cracking resistance in addition to the effects of the foregoing item (2) and (3).

(5) The aforementioned resin sealing material is a composite, in which more than 67.5 vol. % of spherical molten silica having a particle size distribution of 0.1 to 100 microns, an average particle diameter of 5 to 20 microns and the maximum packing density of 0.3 or more is blended as the inorganic filler and whose molding has a linear expansion coefficient of $1.4 \times 10^{-5}/°C$. This resin sealing material is exemplified by any of the Examples 1, 2 and 3 of Table 1.

Thus, the aforementioned effects of the spherical molten silica can be further improved.

(6) The aforementioned resin sealing material is exemplified by any of the Examples 1, 2 and 3 of Table 1, which is mixed with ion exchange water in an amount of ten times, and which has a pH of 3 to 7 as an extracted liquid, in case it is extracted at 120° C. for 100 hours, an electric conductivity of 200 $\mu$S/cm and an extraction of ions of halogen, ammonia and metal of 10 ppm or less.

Next, one experiment of the Examples (1) to (6) of the above-specified resin sealing materials will be described in the following.

Three kinds of resin sealing materials were prepared, as tabulated in Table 1: by using an epoxy resin, the resol type phenol resin (Example 1) and the bismaleimide resin (Example 2) as the base material of the thermoset resin; by adding to this base material both spherical molten silica having a particle size distribution of 0.1 to 100 microns, an average particle diameter of 5 to 20 microns and the maximum packing density of 0.90 as a filler and a variety of additives; by melting and heating the resultant mixture by a biaxial roll heated to about 80° C.; and by pulverizing the heated mixture after a cooling.

Next, each of the resin sealing materials was used to mold a semiconductor device having the LOC structure shown in FIG. 1, i.e., the 16MDRAM by a transfer molding machine. The molding process was accomplished at a mold temperature of 180° C., under a transfer pressure of 70 kgf/mm² and for a molding period of 90 secs.

According to the experiment, the following effects could be attained:

(1) The sealing material, which used as its filler the substantially spherical molten silica having the particle size distribution of 0.1 to 100 microns, the average particle diameter of 5 to 20 microns and the maximum packing density of 0.8 or more, had a lower molten viscosity and a better fluidicity than the sealing material using the generally existing square molten silica. During the molding process, therefore, the bonding wires 5 of Au or the like and the lead frame 3 were neither deformed nor forced the semiconductor chip 1 to flow. In addition, the sealing material could fill up the narrow gap of the package excellently.

(2) The above-specified spherical molten silica exerted little influence upon the molten viscosity and fluidicity of the material so that the thermal expansion of the material could be dropped by increasing the loading of the molten silica. As a result, the package had an excellent cracking resistance.

(3) In the semiconductor sealing material of the prior art, the epoxy resin was used, but the phenol resin or the polyimide resin were not used, because the latter two resins contained many ionic impurities and were inferior in electric characteristics and the reliabilities in the moisture resistance so that they were not practical. If, however, a highly pure resol type phenol resin or polyimide resin was used, satisfactory reliabilities could be attained.

(4) The sealing resin using the highly pure resol type phenol resin or polyimide resin had a high heat resistance in its molding form and was excellent especially in the mechanical strength at a high temperature. As a result, the sealing resin was remarkably excellent either in the reflow resistance (to package cracking) in case the package absorbed moisture or in the reliabilities in the moisture resistance and the resistance to the thermal shocks after the reflow.

Here will be described means for preventing formation of voids and bending and charge shortage of the bonding wires when the resin sealing material is to be poured into a mold.

Figure 15:
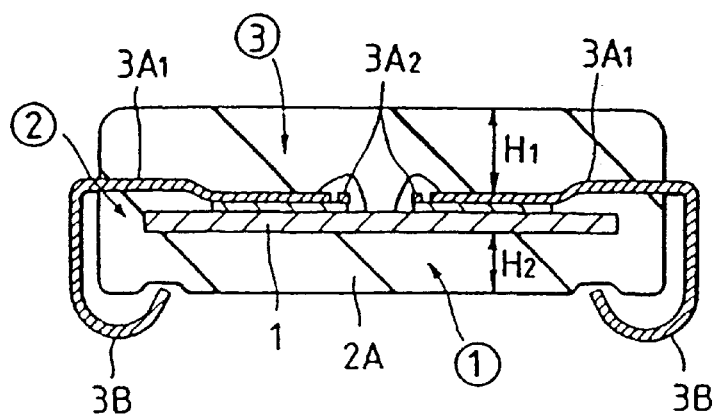
FIGS. 15 to 19 are diagrams for explaining a package optimized for injecting the mold resin of the resin-sealed semiconductor device shown in FIG. 1 into a mold.

As shown in FIG. 1, the plural inner leads 3A are adhered to the principal surface of the semiconductor chip 1 through the insulating films 4 for electrically insulating them from the semiconductor chip 1, by means of the adhesive 7. The inner leads 3A and the semiconductor chip 1 are electrically connected through the bonding wires 5 and are sealed up with the resin, thus producing the 16MDRAM. In this 16MDRAM, as shown in FIG. 15 (presenting the section of an essential portion of FIG. 1), the package structure is made such that the distance $H_1$ between the portion of the inner leads 3A adhered to the semiconductor chip 1 and the outer wall of the package 2 is larger than the distance $H_2$ between the side of the semiconductor chip opposite to the circuit-formed side and the outer wall of the package.

Figure 16:
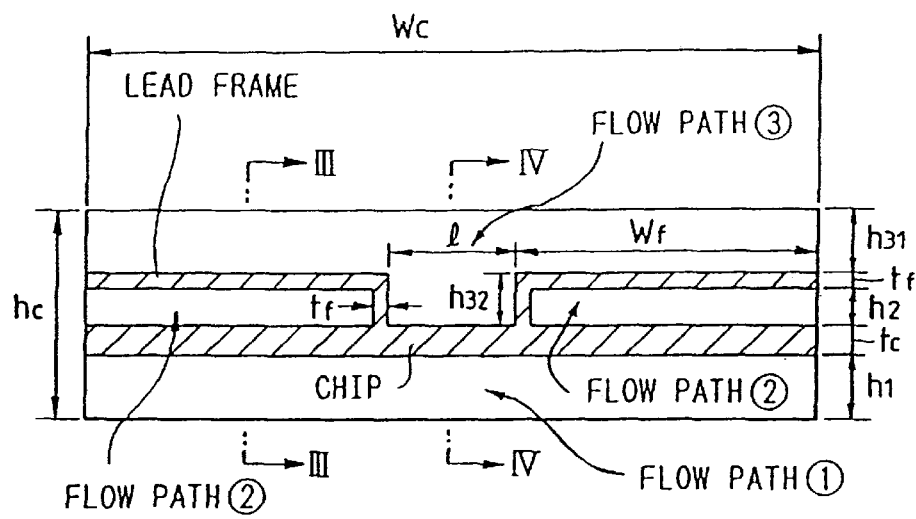
Figure 17:
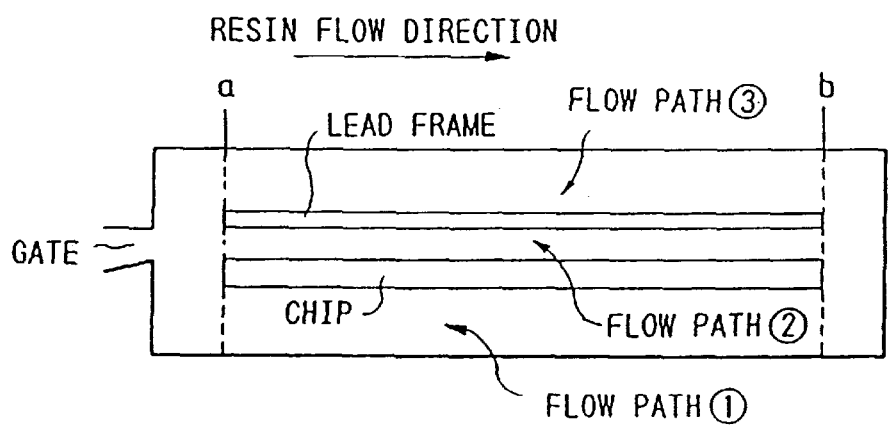
Figure 18:
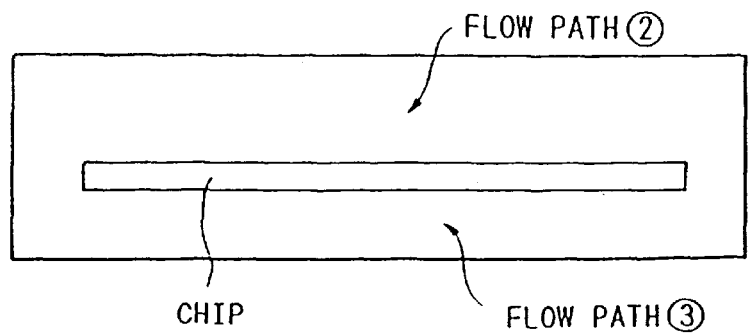

Thanks to this package structure, as shown in FIG. 16 (presenting the section of a model of FIG. 15), FIG. 17 (presenting the section taken along line III—III of FIG. 16) and FIG. 18 (presenting the section taken along line IV—IV of FIG. 16), the relations among the depths $h_{31}$ and $h_{32}$ of flow paths of the upper portions of the inner leads 3A, the depth $h_2$ of an intermediate portion between the inner leads 3A and the semiconductor chip 1, and the depth $h_1$ of a flow path of the lower portion of the semiconductor chip 1 are expressed by the following Equations:

$$h_1 = h_2 = (h_c - t_c - 2W_f t_f / W_c)/2(1 + W/W_c);$$

$$h_{31} = h_c - 2h_{10/2} - t - t_c;$$

and $$h_{32} = h_{10/2} + t,$$

wherein:

$h_c$: Cavity depth;

$t_c$: Chip thickness;

$t_f$: Lead frame thickness;

$W_c$: Cavity width; and $W_f$: Length of the lead frame floating from the chip.

Figure 19:
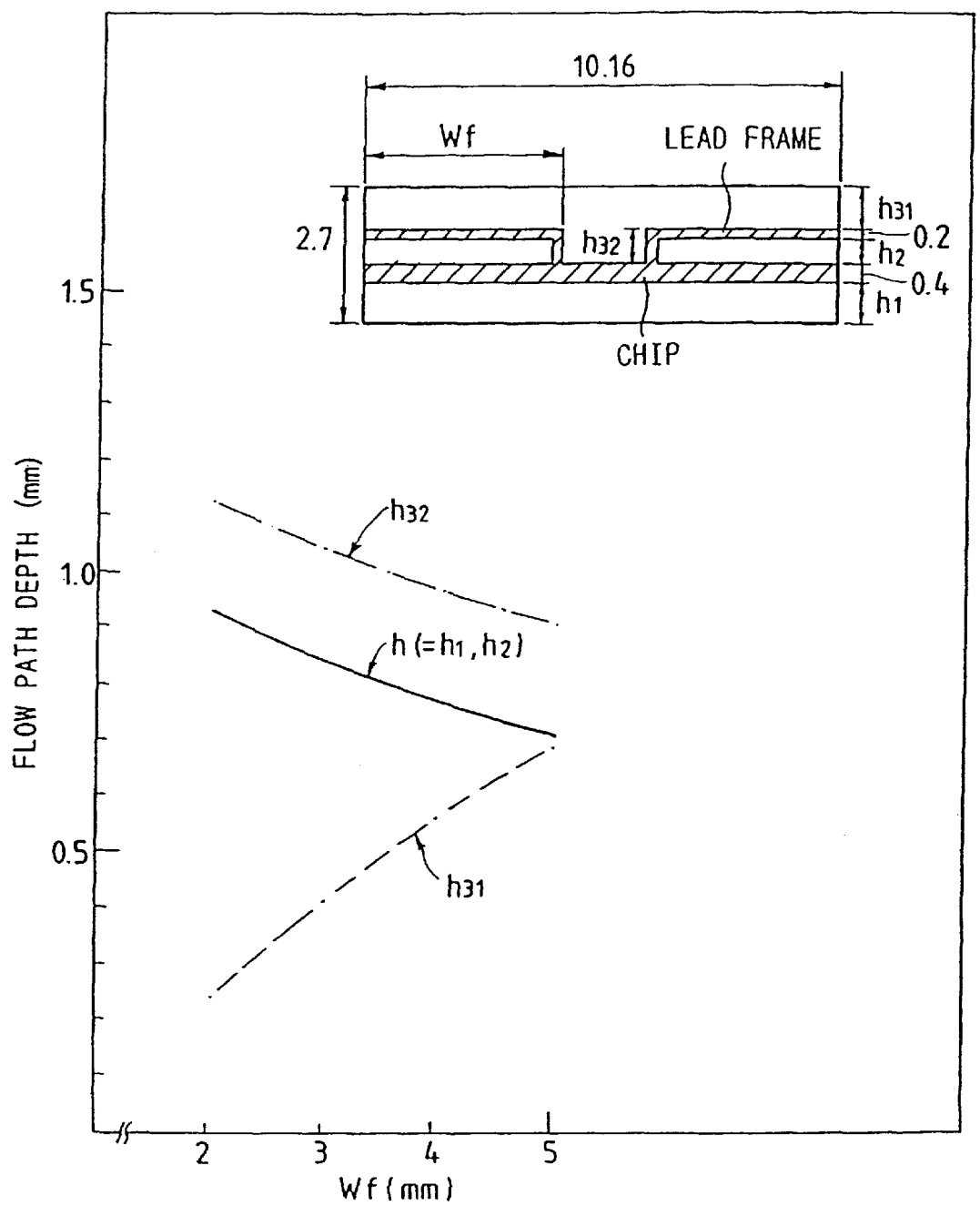

The above-specified Equations are graphically plotted in FIG. 19.

Thus, the resin flow passage of the package 2 is divided into three: the upper flow path of the inner leads 3A; the intermediate flow path between the inner leads 3A and the semiconductor chip 1; and the lower flow path of the semiconductor chip 1. The individual flow path depths and the resin flow path structures are so set as to equalize the average resin flow speeds in the individual flow paths. As a result, the average resin flow speeds in the flow paths, as indicated at circled numerals 1, 2 and 3 in FIG. 17, can be equalized to prevent the generation of voids, the bending of the bonding wires (of Au) and the packing shortage.

Since, moreover, the average flow speeds of the flow paths designated at the circled numerals 1, 2 and 3 are equal, the semiconductor chip 1 and the inner leads 3A can be prevented from being deformed so that a highly reliable package can be produced.

(Embodiment II)

In the semiconductor integrated circuit device according to the Embodiment II of the present invention is constructed, as shown in FIG. 20, FIGS. 21A and 21B and FIGS. 22A and 22B, the insulating films 4 adhered to the principal surface of the semiconductor chip 1 of the foregoing Embodiment I are modified such that insulating films 4A are arranged all over or partially of those sides of the signal inner leads 3A$_1$ and the common inner leads 3A$_2$, which are located in the closest position to face the semiconductor chip 1.

Figure 20:
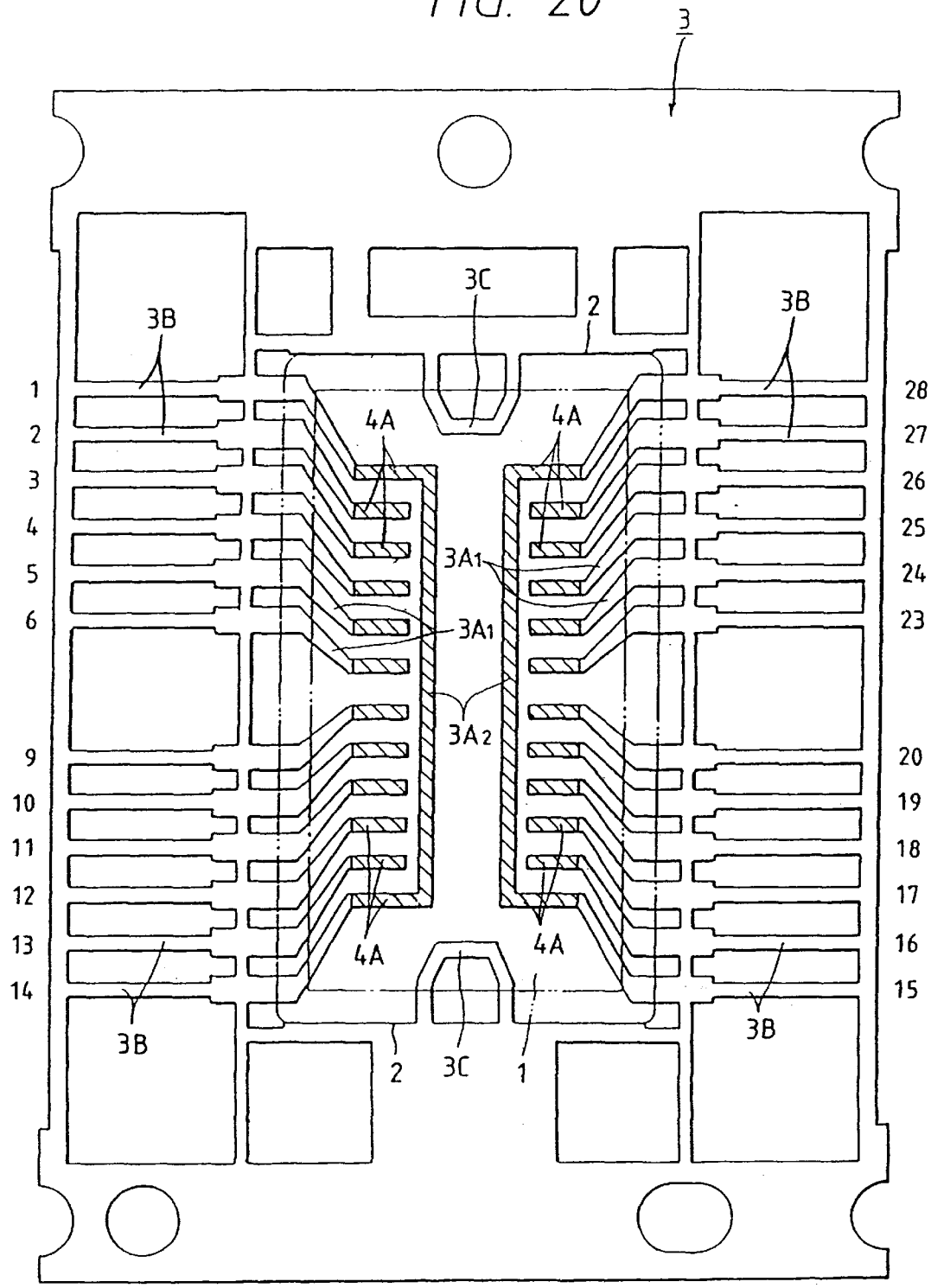
FIGS. 20, 21A, 21B, 22A and 22B are diagrams for explaining the schematic structure of a resin-sealed semi-conductor device according to Embodiment II of the present invention and a process for fabricating the same.

More specifically, as shown in FIG. 20, the aforementioned insulating films 4A are placed in advance all over the most closest sides of the signal inner leads 3A$_1$ and the common inner leads 3A$_2$ facing the principal surface of the semiconductor chip 1 and are then fixedly adhered to the semiconductor chip 1, when assembled.

The lead frame 3 thus carrying the insulating films 4A is manufactured altogether with the signal inner leads 3A$_1$, the common inner leads 3A$_2$ and the insulating films 4A by adhering the insulating films 4 to that whole principal surface of the thin sheet for the inner leads, which is the closest to face the semiconductor chip 1, and by shaping and cutting the insulating films 4 by a press.

Thus, the area of the insulating films 4 can be reduced. Moreover, the signal inner leads 3A$_1$, the common inner leads 3A$_2$ and the insulating films 4A can be held in predetermined positions. Furthermore, the signal inner leads 3A$_1$ and the common leads 3A$_2$ can be prevented from any leakage because no insulating film 4 is interposed inbetween.

Here, these insulating films 4 can be less influenced by the thermal stress, if divided into a plurality or four sheets, than they are adhered in a single sheet.

Figure 21A:
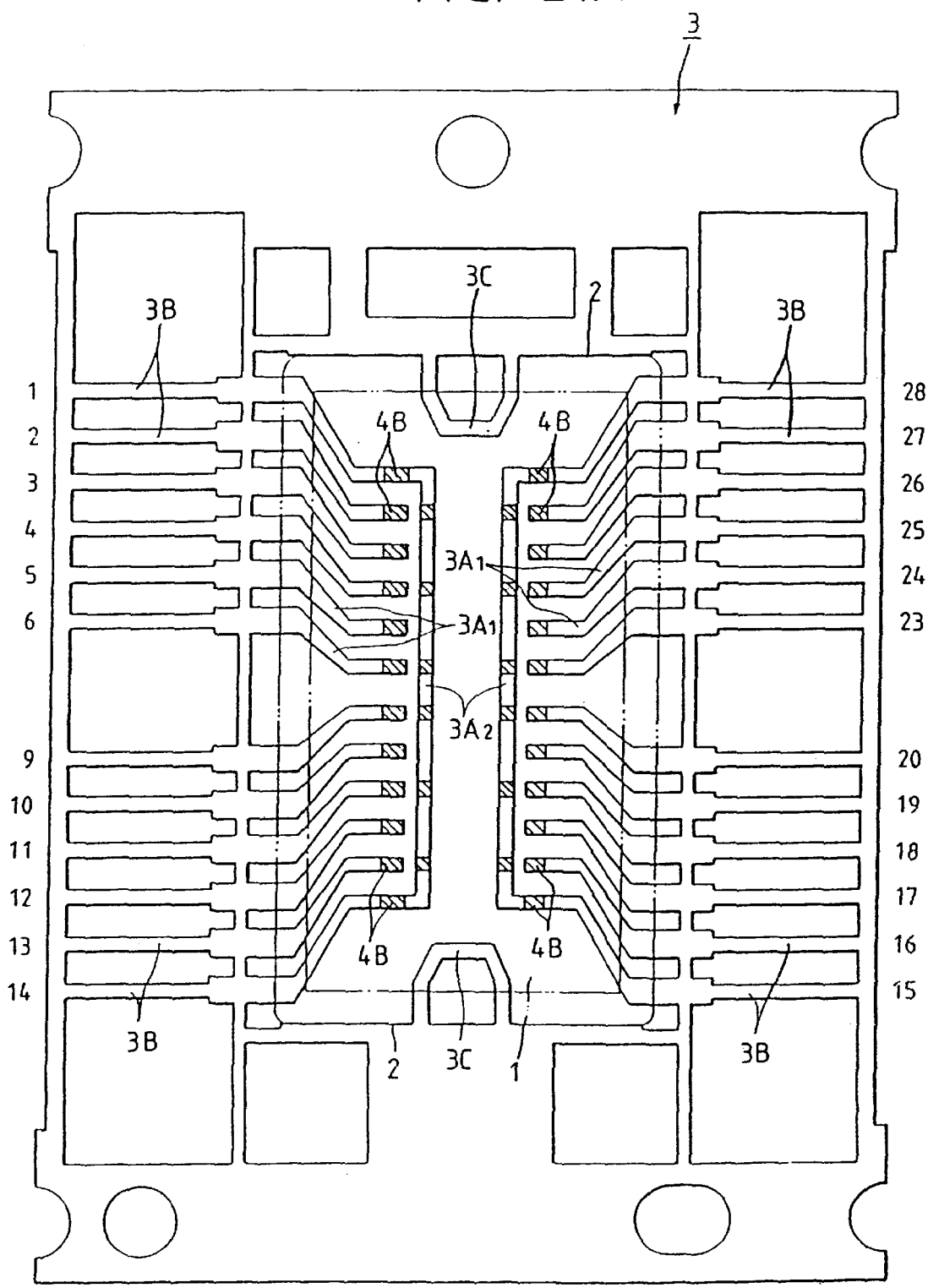

As shown in FIG. 21A, moreover, of the whole (back) side facing and closest to the principal surface of the semiconductor chip 1, only the side portions corresponding to the signal inner leads 3A$_1$ and the common leads 3A$_2$ are arranged with the insulating films 4B. Then, the area of the semiconductor chip 1 to be occupied by the insulating films 4 can be minimized.

Figure 21B:
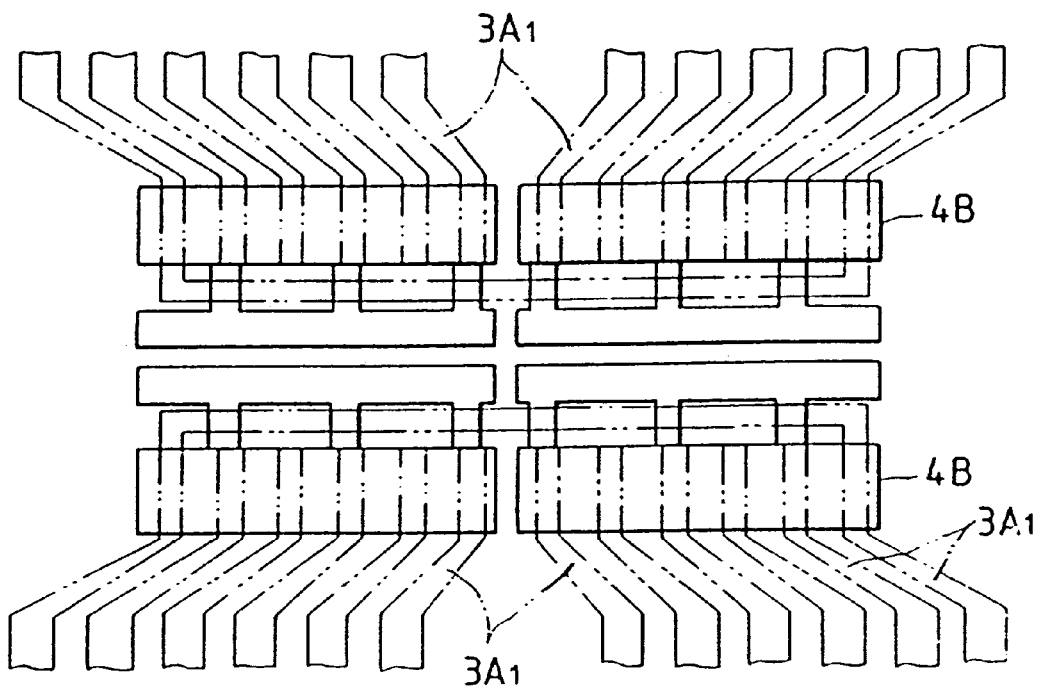

The lead frame 3 with the insulating films 4B occupying the minimum area of the semiconductor chip 1 is prepared, as shown in FIG. 21B, by adhering four sheets of insulating films 4 having holes a in predetermined positions, to the whole sides of the signal inner leads 3A$_1$ and the common leads 3A$_2$ facing and closest to the principal surface of the semiconductor chip 1, and by shaping and cutting them by a press to adhere the insulating films 4B to only the positions corresponding to the bonding portions of the signal inner leads 3A$_1$ and the common leads 3A$_2$.

As compared with the Embodiment shown in FIG. 20, the amount of the insulating films can be made smaller to reduce the moisture absorption. Moreover, the semiconductor chip 1 can be fixed more easily with the suspending leads.

In the embodiment shown in FIG. 21A, the insulating films 4A are arranged only in the portions corresponding to the bonding portions but may be arranged partially in other portions, if necessary.

Figure 22B:
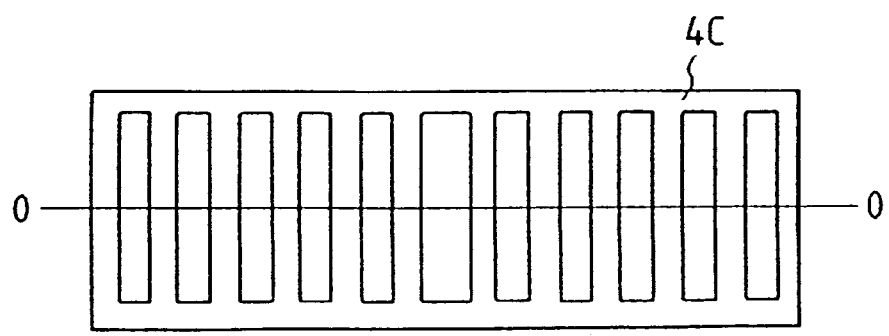
Figure 22A:
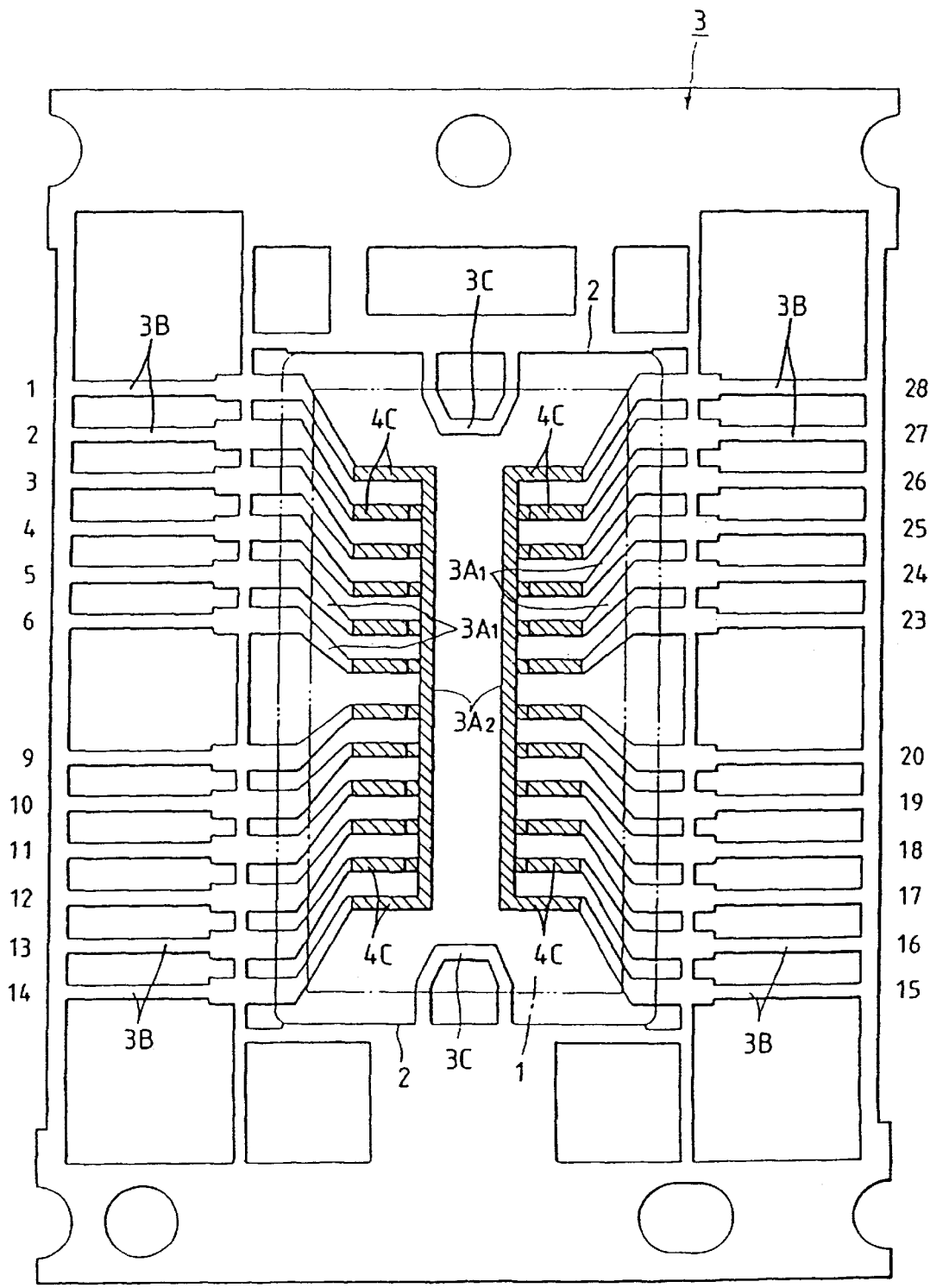

As shown in FIG. 22A, on the other hand, the insulating films 4A shown in FIG. 20 are also arranged with insulating films 4C to extend and intersect the common inner leads 3A$_2$ and the signal inner leads 3A$_1$.

The inner leads 3A with the insulating films 4C are prepared, as shown in FIG. 22B, by forming one sheet of insulating film 4 having holes b leaving only the portions corresponding to the signal inner leads 3A$_1$, and by cutting the insulating film 4 along the longitudinal center line into two halves. These two insulating film halves 4C are adhered to the common inner leads 3A$_2$ and the signal inner leads 3A$_1$.

Thus, it is sufficient to cut the insulating film 4 in advance in the predetermined pattern to form the insulating films 4C and to adhere the insulating films 4C to the common inner leads 3A$_2$ and the signal inner leads 3A$_1$. As a result, the method of preparing the insulating films 4C can be facilitated. Since, moreover, the insulating films 4C are adhered to the common inner leads 3A$_2$ and the signal inner leads 3A$_1$, the leading ends of the signal inner leads 3A$_1$ can be flattened to facilitate the subsequent working steps.

The adhesions between the insulating films 4C and the common inner leads 3A$_2$ and the signal inner leads 3A$_1$ are effected by the contact hot bonding in the case of a thermoplastic adhesive and are effected by the setting after the tack holding in the case of a thermoset adhesive.

Incidentally, the insulating films 4A, 4B and 4C shown in FIGS. 20, 21A and 22A may be either wider or narrower than the inner leads.

As is now apparent from the description made above, according to the present embodiment II, the insulating films 4 to be sandwiched between the semiconductor chip 1 and the signal inner leads $3A_1$ and the common leads $3A_2$ are far less than those of the prior art so that the amount of moisture to be absorbed by the semiconductor device can be reduced even if the device is held in a wet circumstance for a long time. As a result, the vapor pressure in the semiconductor device during the solder reflow step can be dropped to provide a semiconductor device freed from the resin cracking.

Embodiment III

Figure 23:
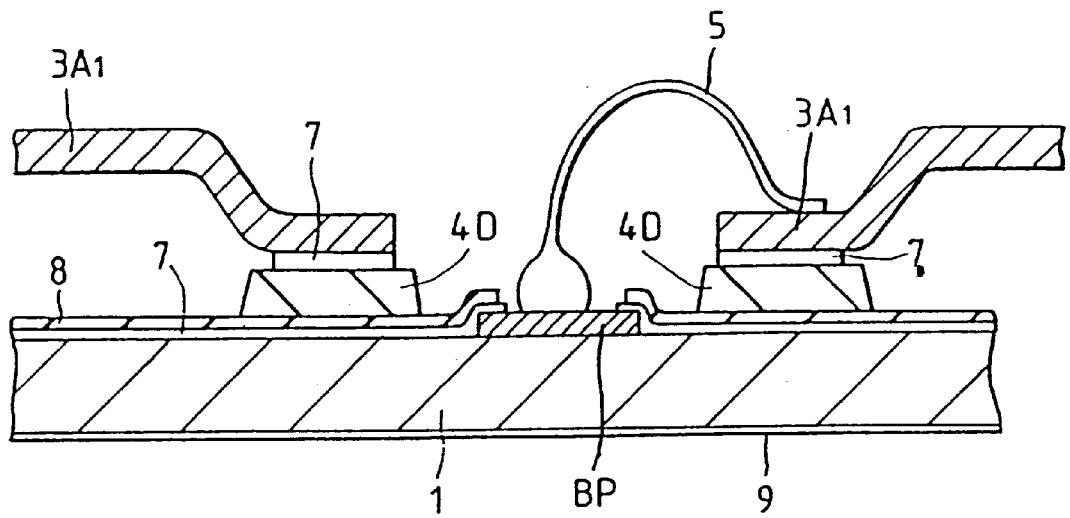
FIGS. 23 to 28 are diagrams for explaining the schematic structure of a resin-sealed semiconductor device according to Embodiment III of the present invention and a process for fabricating the same.

In the semiconductor integrated circuit device according to the Embodiment III of the present invention, as shown in FIG. 23, the whole region of the principal surface of the semiconductor chip 1 except the bonding pads BP of the principal surface of the semiconductor chip 1 of the foregoing Embodiment I is coated with an alpha ray shielding polyimide film 8. and the principal surface of the semiconductor chip 1 is further formed with insulating films 4D on its portions to which at least the signal inner leads $3A_1$ and the common leads $3A_2$.

The alpha ray shielding polyimide film 8 has a thickness of 2.0 to 10.0 microns.

The insulating films 4D have a thickness of 75 microns or more. The resin suited for the insulating films 4D is exemplified by a thremoset resin containing a printable inorganic filler.

The area occupied by the insulating films 4D is at most one half of that of the semiconductor chip 1.

The semiconductor chip 1 is further formed with a polyimide film 9 on the side opposed to its principal surface.

Figure 24A:
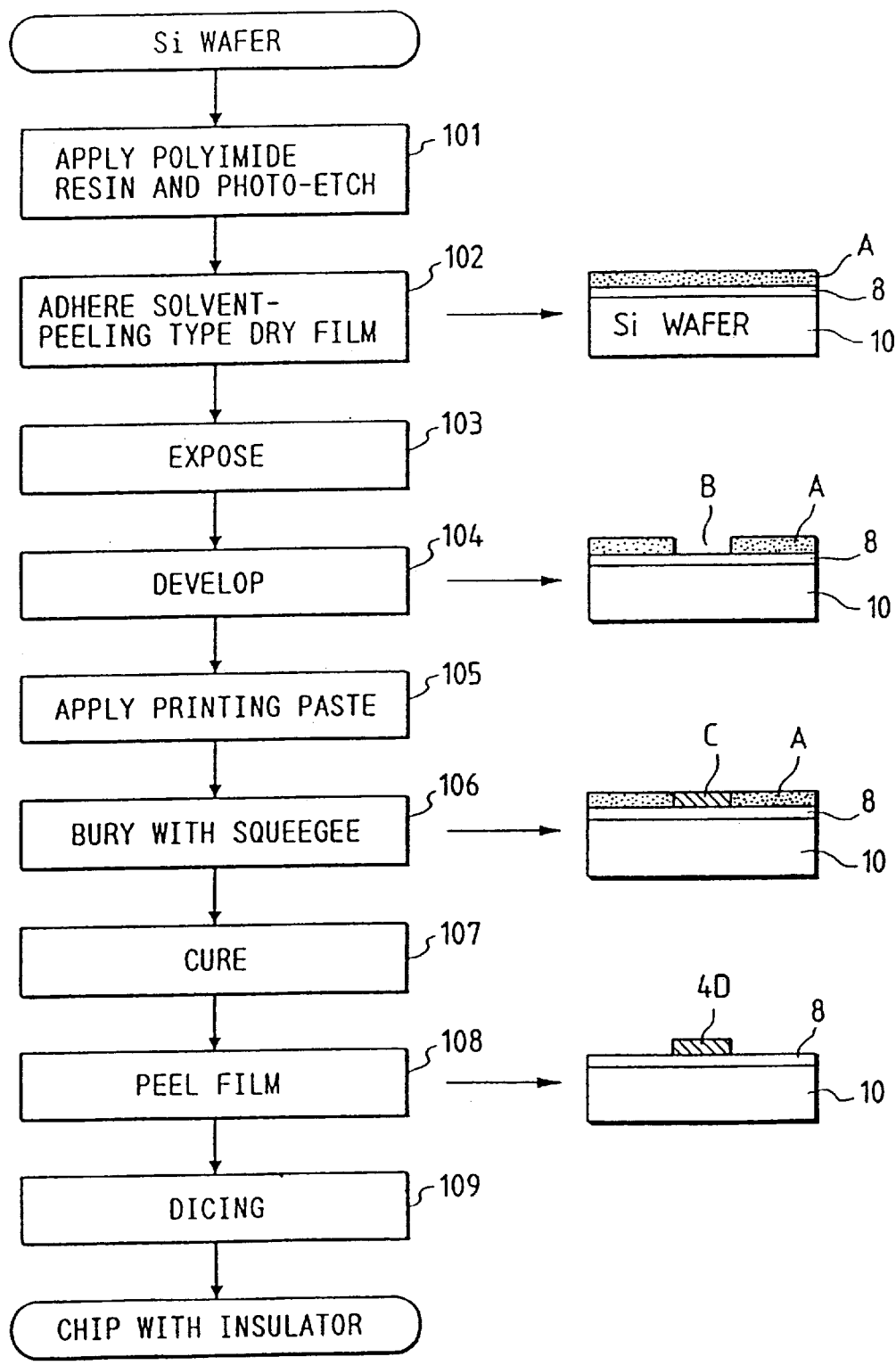

With reference to FIGS. 23 and 24A (presenting the flow chart of fabrication and the sections of the individual steps), there will be described one embodiment of the method of coating the whole region of the principal surface of the semiconductor chip 1 except the bonding pads BP of the principal surface of the semiconductor chip 1 with the alpha ray shielding polyimide film 8 and forming the insulating films 4D on the principal surface of the semiconductor chip 1 on its portions to which at least the signal inner leads $3A_1$ and the common inner leads $3A_2$ are to be adhered.

Figure 25:
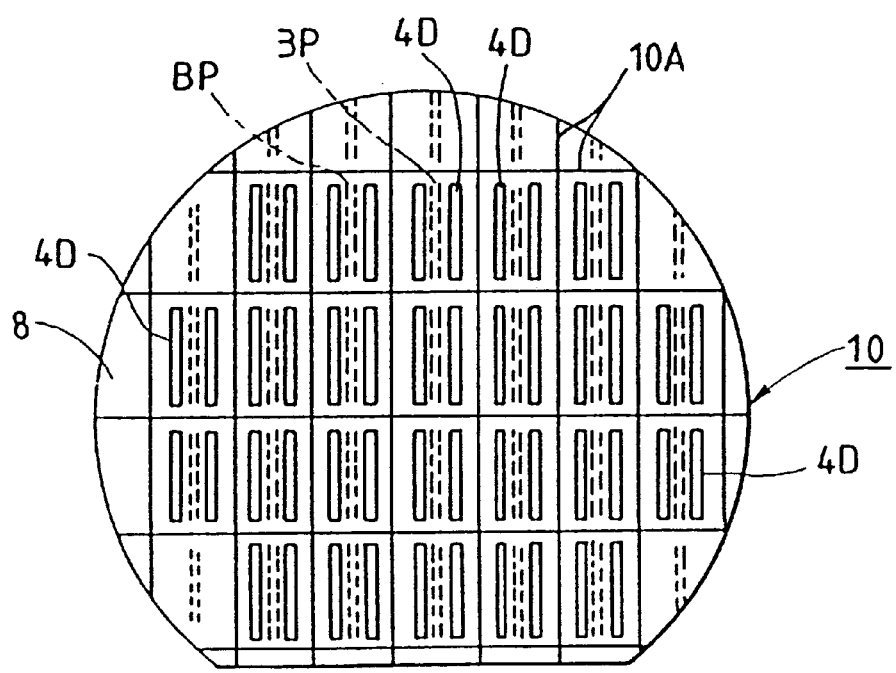

First of all, the alpha ray shielding polyimide film 8 is applied to the whole region of a silicon wafer 10, as shown in FIG. 25 (presenting the top plan view of the principal surface of the silicon wafer). After partially set, the polyimide film 8 is photo-etched to expose the bonding pads (or external terminals) BP to the outside (as indicated at Step 101 in FIG. 24A).

Next, a solvent-peeling type dry film A is adhered (at Step 102). This solvent-peeling type dry film A is exposed (at Step 103) to a predetermined pattern and then developed (at Step 104) to form a hold B.

Next, a pasty insulating material (or printing paste) C is applied, buried with (printing) squeeze and cured (at Steps 105, 106 and 107). Then, the solvent-peeling type dry film A is peeled to form the insulating films 4D. After this, a dicing is accomplished along the solid lines over the silicon wafer 10 shown in FIG. 25, thus completing the semiconductor chip with the insulating film 4D.

Figure 24B:
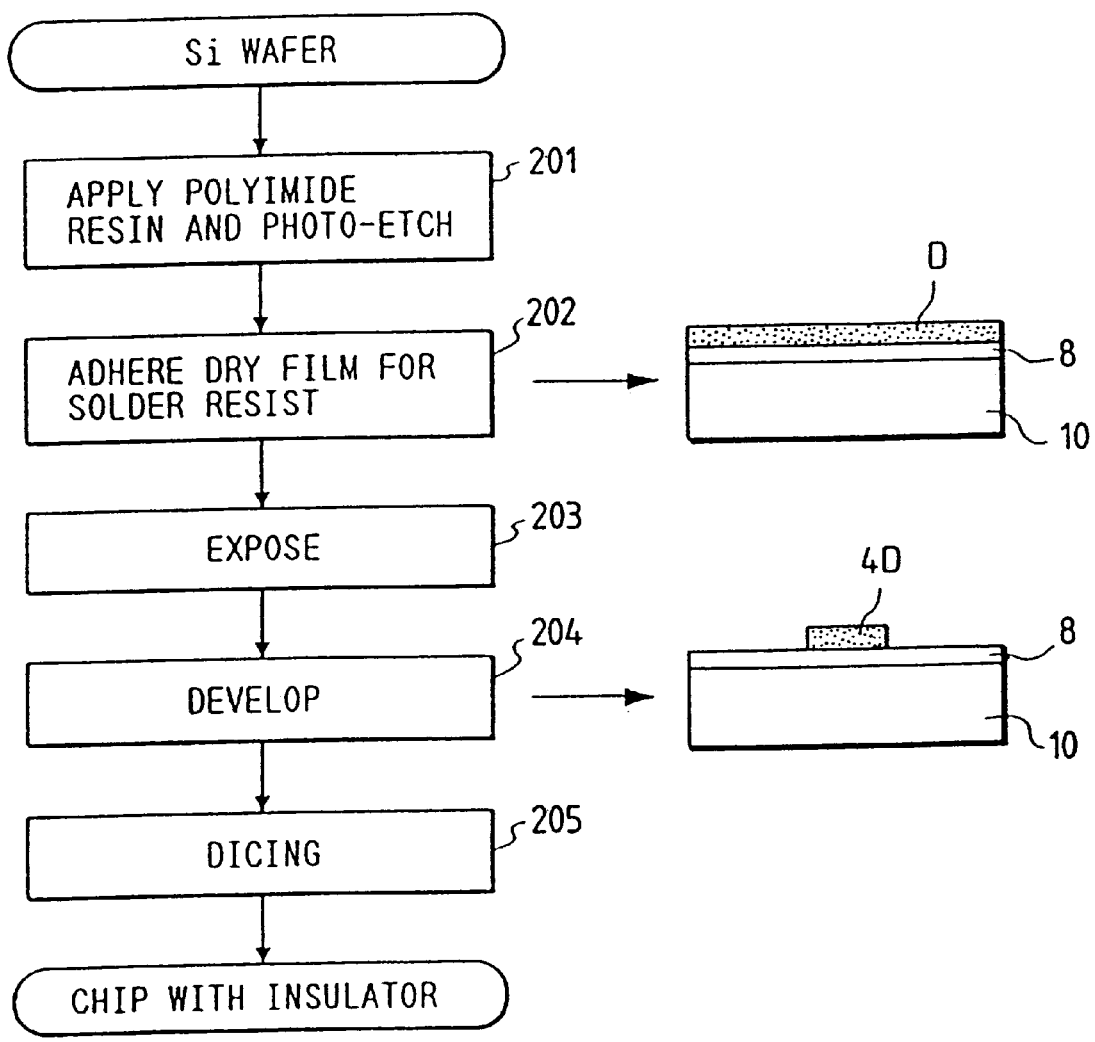

Another embodiment of the method of forming the aforementioned alpha ray shielding polyimide film 8 and the insulating films 4D is shown in FIG. 24B (presenting the fabrication flow chart and the sections of the chip at the individual steps). As shown, the alpha ray shielding polyimide film 8 is applied to the whole region of the silicon wafer 10 and is photo-etched to expose the bonding pads (or external terminals) BP (at Step 201 in FIG. 24B).

Next, a dry film D for solder resists is adhered (at Step 202). This solder resist dry film D is exposed (at Step 203) to a predetermined pattern and is developed (at Step 204) to form the insulating films 4D. After this, a dicing is accomplished along the solid lines of the silicon wafer 10 shown in FIG. 25 to complete the semiconductor chip with the insulating films 4D.

Incidentally, the silicon wafer 10 is not warped even if the insulating films 4D having the aforementioned thickness are prepared by the silicon wafer process, because the films 4D are formed only partially.

Figure 26:
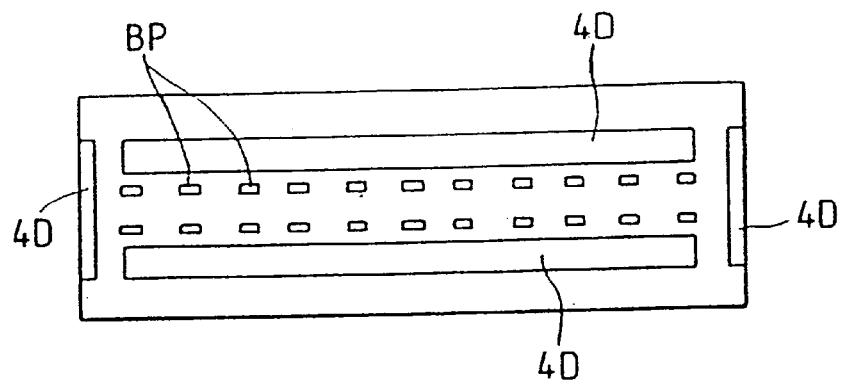
Figure 27:
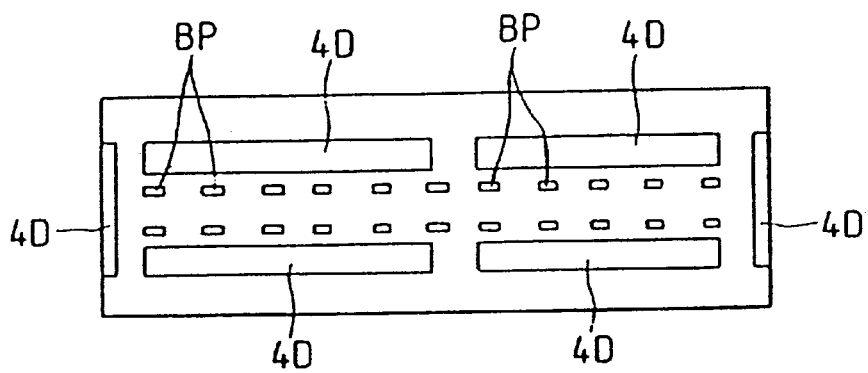
Figure 28:
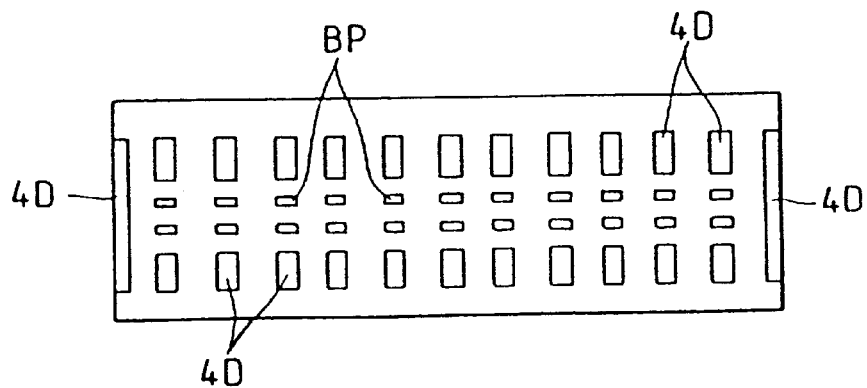

On the other hand, FIGS. 26 to 28 present various patterns of the insulating films 4D to be formed in the portions of the principal surface of the semiconductor chip 1, to which at least the leading ends of the signal inner leads $3A_1$ and the common inner leads $3A_2$, and the suspending leads are to be adhered.

As is now apparent from the foregoing description, according to the present Embodiment III, the whole region of the principal surface of the semiconductor chip 1 except the bonding pads (or external terminals) BP is coated with the alpha ray shielding polyimide film 8, and the principal surface of the semiconductor chip 1 is formed with the insulating films 4D at the portions to which at least the leading ends of the signal inner leads $3A_1$ and the common inner leads $3A_2$ are to be adhered. As a result, the whole region of the circuit can be shielded from the alpha ray shielding polyimide film 8, and the semiconductor chip 1 can be fixedly adhered by the insulating films 4D.

Since, moreover, the insulating films 4D are formed at the portions on the principal surface of the semiconductor chip 1, to which at least the leading ends of the inner leads 3A and the suspending leads 3C are adhered, it is possible to reduce the stray capacity between the semiconductor chip 1 and the inner leads 3A.

Since, furthermore, the insulating films 4D are made of the thermoset resin containing the printable inorganic filler, they can be formed highly accurately during the wafer process.

Since, furthermore, the semiconductor wafer chip 1 and the resin are excellently adhered by forming the polyimide film 9 on the side of the semiconductor chip 1 opposite to the principal surface, it is possible to prevent the package cracking.

Furthermore, the insulating films 4D are formed highly accurately by the batch wafer process including the steps of: adhering the solvent-peeling type dry film A to the silicon wafer 10; applying the pasty insulator (or printing paste) after the ordinary exposing and developing steps; burying it with the squeeze; heating and curing it; and peeling the solvent-peeling type dry film. Thus, it is possible to improve the productivity.

Since, furthermore, the insulating films 4D are formed only by exposing and developing the solder resist dry film D, the productivity can be further improved.

Embodiment IV

Figure 29:
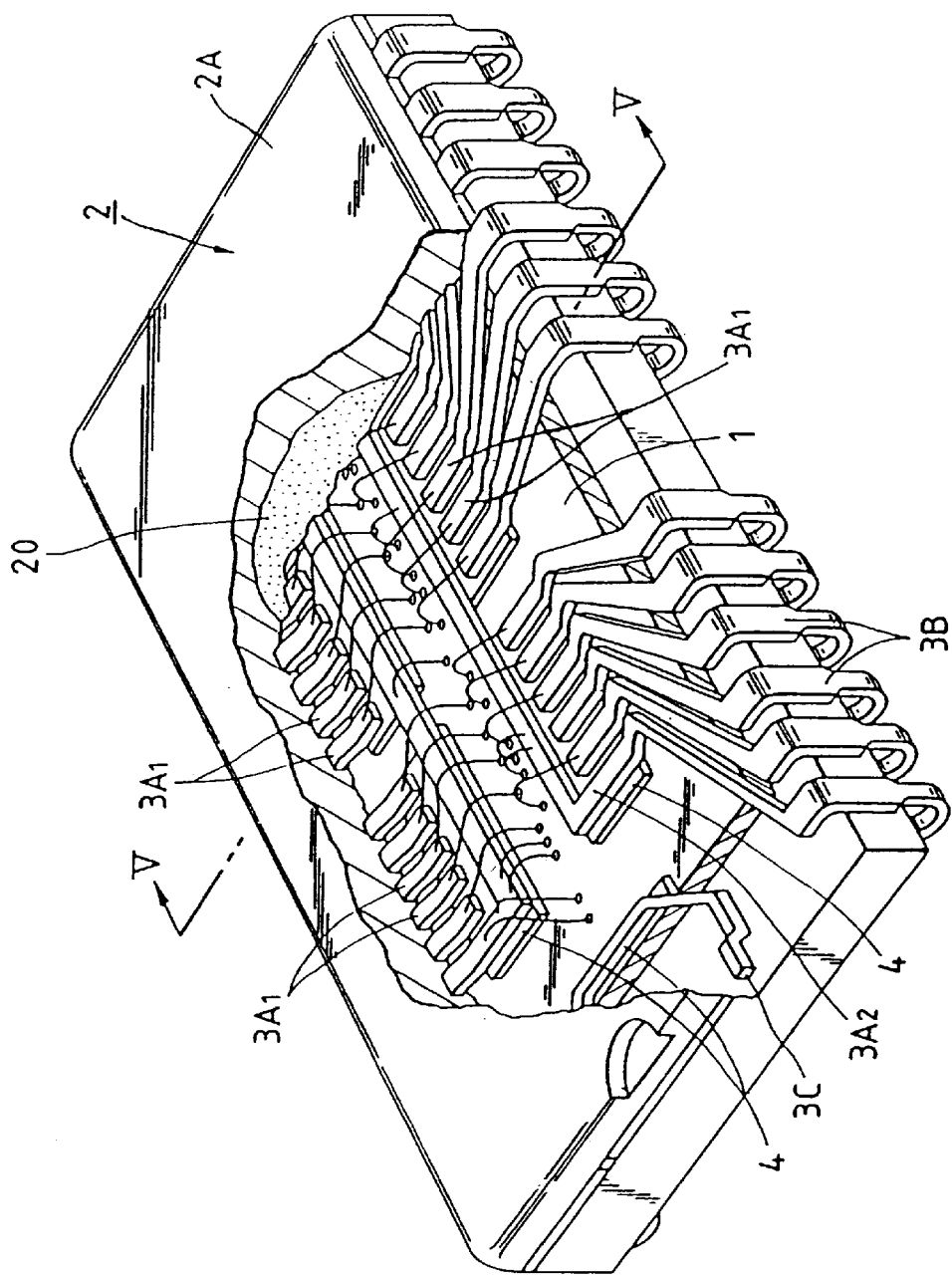
FIG. 29 is a partially sectional perspective view showing the schematic structure of a resin-sealed type semiconductor device according to Embodiment IV of the present invention.
Figure 30:
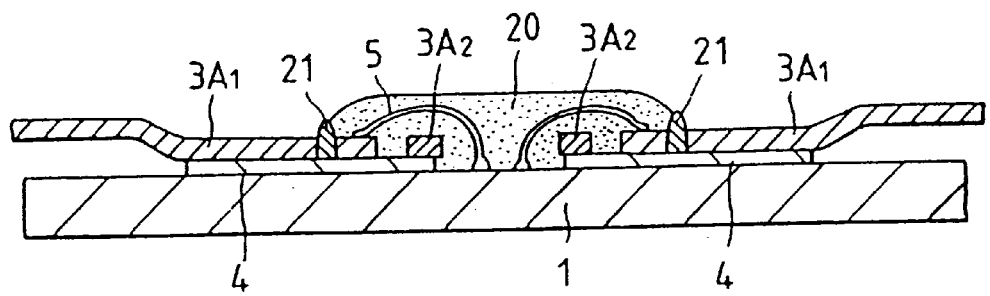
FIG. 30 is a section taken along V—V of FIG. 29 and showing the state before the resin molding.

The resin-sealed type semiconductor device according to the Embodiment IV of the present invention is constructed, as shown in FIG. 29 (presenting a perspective view in partial section): such that the signal inner leads $3A_1$ and the common inner leads $3A_2$ are adhered to the principal surface of the semiconductor chip 1 of the foregoing Embodiment I through the insulating films 4 for insulating them electrically from the semiconductor chip 1; and such that the signal inner leads $3A_1$, the common inner leads $3A_2$ and the semiconductor chip 1 are electrically connected through the bonding wires 5 and sealed with a mold resin 2A. The semiconductor device is further constructed, as shown in FIG. 30 (presenting a section taken along lone V—V of FIG. 29 and showing the state before molded with a resin), such that the principal surface of the semiconductor chip 1 is so partially covered with a substance 20, which is more flexible or fluid than the mold resin, as to shield all over the bonding wires 5, and such that the substance 20 is sealed up at its outer side with the resin 2A.

More specifically, there is provided a dam 21 for covering all over the bonding wires 5 extending across the common inner leads $3A_2$ with the flexible/fluid substance 20. This substance 20 may be made of fluid silicone gel, for example, and is dropped and set on the bonding wires 5 until it is sealed with the resin by the transfer mold.

The dam 21 is made of silicone rubber containing a highly viscous silica filler.

On the other hand, the aforementioned flexible/fluid substance 20 need not always be the above-specified gel but may be exemplified by various materials such as silicone grease or rubber if it has such a flexibility or fluidity as to deform the bonding wires 5 therein. Thus, the bonding wires 5 can freely follow the deformations, even if the principal surface of the semiconductor chip 1 is peeled to expand the steam when the package having absorbed moisture is to be subjected to the reflow soldering treatment, so that they can be prevented from being broken.

Moreover, the bonding wires 5 are suppressed from being deformed during the transfer molding of the mold resin 2A. Even if the wires 5 are extended to run across the common inner leads $3A_2$, the bonding wires 5 can be prevented form being deformed during the molding, from being shorted to each other or from contacting with the common inner leads $3A_2$.

On the other hand, the substance covering the bonding wires 5 need not be the flexible/fluid substance if it is used with a view to preventing the deformations of the bonding wires 5. The substance may be exemplified by an epoxy resin having a modulus of elasticity as high as that of the outer resin 2A transfer-molded, if it can pot the bonding wires 5 over the principal surface of the semiconductor chip 1.

In case the flexible/fluid substance 20 has a fluidity, its viscosity has to be higher than the molten viscosity of the resin 2A in the transfer mold.

Since, moreover, the resin 2A is kept away from direct contact with the bonding wires 5 by the flexible/fluid substance 20, the bonding wires 5 are prevented form being repeatedly deformed in the temperature cycle by the relative thermal deformations between the semiconductor chip 1 and the mold resin 2A so that they are not broken by the fatigue.

In case the flexible/fluid substance 20 is used, the bonding pads BP are prevented from having their surfaces gapped by the thermal stress so that their aluiminum can be prevented from being corroded by the moisture.

Figure 31:
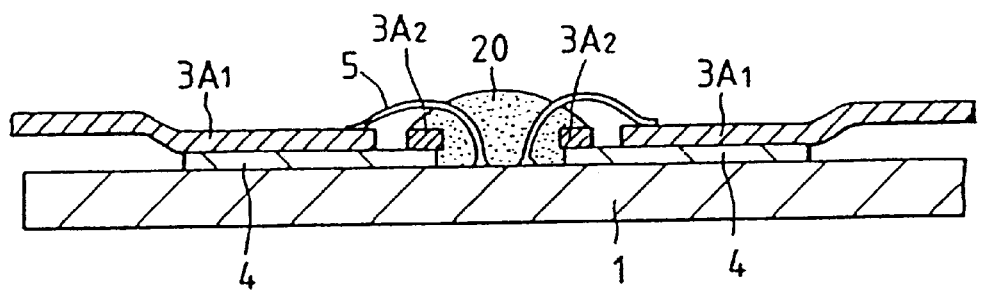
FIG. 31 is a section showing a resin-sealed type semi-conductor device according to another embodiment before the resin molding in case a flexible/fluid substance of FIG. 29 is used.

FIG. 31 is a section showing the state before the resin mold showing the resin-sealed type semiconductor device according to another embodiment in case the flexible/fluid substance 20 is used.

Since the interfaces between the signal inner leads $3A_1$ and the resin 2A are more reluctant to be gapped than the principal surface of the semiconductor chip 1, as shown in FIG. 31, the bonding portions of the bonding wires 5 at the side of the signal inner leads $3A_1$ are less broken. According to this embodiment, therefore, only the (first) bonding portions liable to be broken at the semiconductor chip 1 are formed with the flexible/fluid substance 20. As a result, a break preventing effect can be attained to some extent if the bonding wires 5 can be freely deformed.

Moreover, this embodiment makes use of the common inner leads $3A_2$ in place of the foregoing dam 21 of FIG. 30.

Since, in the case of this embodiment, all the bonding wires 5 are not covered with the flexible/fluid substance 20, they are subjected to repeated deformations by the relative thermal deformations between the semiconductor chip 1 and the mold resin 2A, in case the package is held in the temperature cycle, so that they are more liable to be broken due to fatigue than those of the embodiment of FIG. 30.

Figure 32:
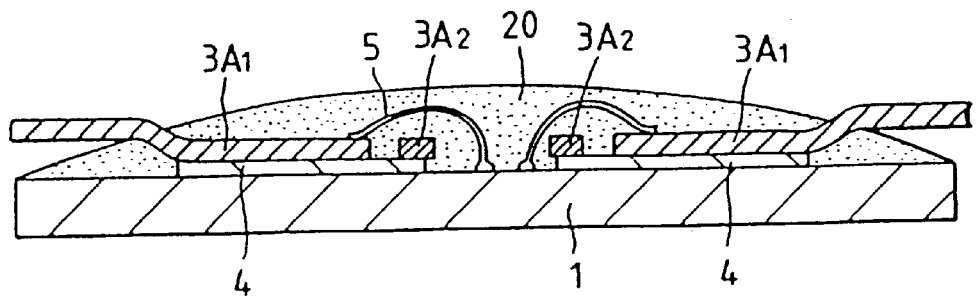
FIGS. 32 and 33 are sections showing a resin-sealed type semiconductor device according to another embodiment before the resin molding in case a flexible/fluid substance is used.

Since, moreover, the flexible/fluid substance 20 can be made less and lower, it is possible not only to prevent the disconnections during the reflow soldering operations and the wire deformations during the transfer mold but also to thin the package as a whole thereby to improve the packing density. FIG. 32 is a section showing the state before the resin mold of the resin-sealed type semiconductor device according to another embodiment of the present invention in case the flexible/fluid substance 20 is used.

According to this embodiment, as shown in FIG. 32, all the bonding wires 5 are covered to shield all over the principal surface of the semiconductor chip 1 with the flexible/fluid substance 20.

Effects similar to those of the foregoing embodiment of FIG. 30 can be attained, and the whole region of the principal surface of the semiconductor chip 1 is covered with the flexible/fluid substance 20 so that the moisture resistance can be better improved.

Since, however, the flexible/fluid substance 20 has a large surface area, the interfaces with the mold resin 2A are gapped during the reflow soldering operation so that the upper mold resin 2A is liable to be cracked when it is exposed to a vapor pressure.

Figure 33:
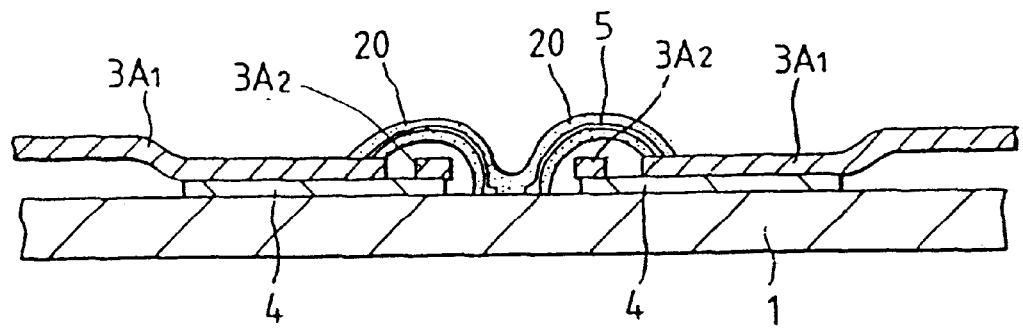

FIG. 33 is a section showing the state before the resin mold of the resin-sealed type semiconductor device of another embodiment in case the flexible/fluid substance 20 is used.

According to this embodiment, as shown in FIG. 33, all the bonding wires 5 mounted over the principal surface of the semiconductor chip 1 are covered with the substance 20 which is more flexible or fluid than the mold resin 2A.

The flexible/fluid substance 20 covering the bonding wires 5 need not be shaped to rise on the principal surface of the semiconductor chip 1 but may be applied to only the surfaces of the bonding wires 5.

In order to effect such coverage, the flexible, fluid substance 20 is first diluted to a low viscosity with a solvent and is then dropped to the semiconductor chip 1 to cover the bonding wires 5. After this, the solvent is evaporated to make the coverage.

In this case, the thicker layer of the flexible/fluid substance over the surfaces of the bonding wires 5 has the better effects for preventing the disconnections and the deformations of the bonding wires 5.

Thanks to this structure, the amount of the flexible/fluid substance 20 for attaining the effects similar to those of the foregoing embodiment shown in FIG. 30 can be reduced to prevent the package crack which might otherwise be caused by the vapor pressure between the flexible/fluid substance 20 and the mold resin 2A.

Figure 34:
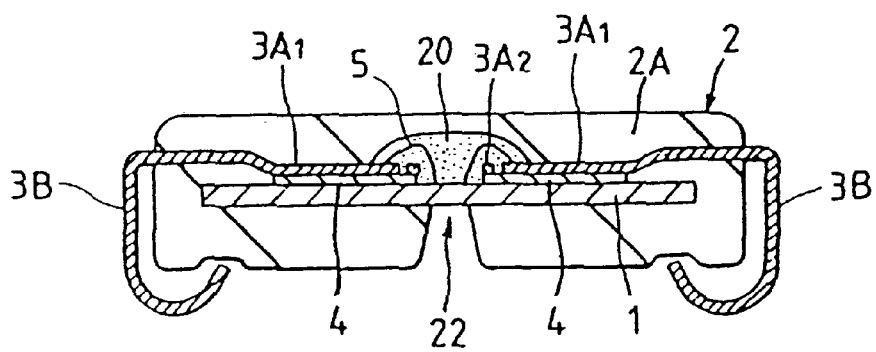
FIG. 34 is a section showing a resin-sealed type semi-conductor device according to another embodiment before the resin molding in case a flexible/fluid substance is used.

FIG. 34 is a section before the resin mold of the resin-sealed type semiconductor device according to another embodiment in case the flexible/fluid substance 20 is used.

According to this embodiment, as shown in FIG. 34, the bonding wires 5 are covered with the flexible/fluid substance 20, and the mold resin 2A at the side opposite site to the principal surface of the semiconductor chip 1 is bored with a hole 22 to expose a portion of the semiconductor chip 1 substantially to the outside.

Here, the word "substantially" imagines the inevitable existence of either a thin cover film of the mold resin 2A at the side opposite to the principal surface of the semiconductor chip or such a thin resin layer as will be easily broken in case the steam pressure is established in the package 2.

Since the moisture resistance of the bonding pads BP can be retained by the flexible/fluid substance 20 without breaking the bonding wires 5 in the temperature cycle when in the reflow soldering operations, it is not degraded even if the hole 22 is formed in the portion of the mold resin 2A.

Since, moreover, the steam generated in the package during the reflow soldering operation is released through the hole 22 to the outside, the pressure is not built up to prevent the resin cracking.

Furthermore, the side of the hole opposite to the principal surface of the semiconductor chip 1 need not be completely exposed but may be clogged with the mold resin 2A if this resin 2A can be easily cleared by the vapor pressure.

As is now apparent from the description thus far made, according to the embodiment IV, the bonding wires 5 can be prevented from being broken, even if the principal surface of the semiconductor chip 1 is peeled to expand the steam during the reflow soldering operation.

It is also possible to prevent the bonding wires 5 from being shorted during the transfer mold or from contacting with the common inner leads 3A$_2$.

The resin cracking during the reflow soldering operation can be prevented without degrading the moisture resistance of the bonding pads BP and causing the disconnections of the bonding wires 5 in the temperature cycle.

Embodiment V

Figure 35:
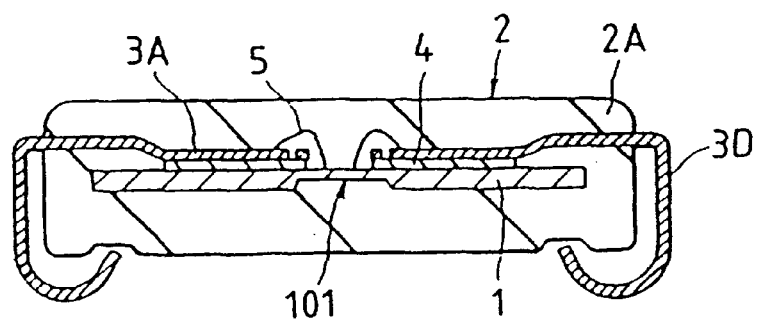
FIG. 35 is a section showing the schematic section of a resin-sealed type semiconductor device according to Embodiment V of the present invention.

The resin-sealed type semiconductor device according to the Embodiment V of the present invention is modified from the resin-sealed type semiconductor device of the foregoing Embodiment I such that the side of the semiconductor chip 1 opposite to the principal surface is recessed or raised at 101, i.e., formed with a round recess, as shown in FIG. 35 (presenting a section).

The mold resin 2A is restrained on the semiconductor chip 1 by that recess 101 so that the reflow cracking can be prevented by reducing the stress which is to be established in the mold resin portions of the corners of the side of the semiconductor chip 1 opposed to the principal surface.

Here, the recess 101 may be formed by the etching or another method.

Figure 36A:
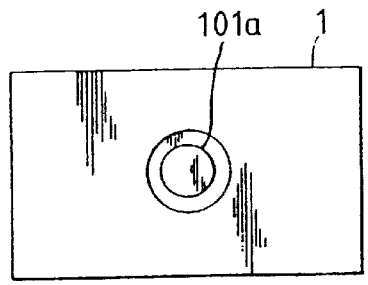
FIGS. 36A, 37A, 38A, 39A, 40A and 41A are top plan views taken from the opposite side to the modified principal surface of the semiconductor chip of FIG. 35.
Figure 36B:
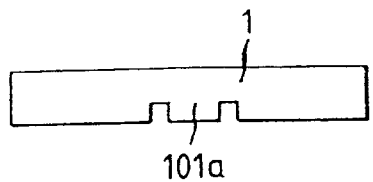
FIGS. 36B, 37B, 38B, 39B, 40B and 41B are sections taken along the transverse center lines of FIGS. 36A, 37A, 38A, 39A, 40A and 41A.

FIG. 36A (presenting a top plan view taken from the side opposite to the principal surface of FIG. 3) and FIG. 36B (presenting section taken on the transverse center line of FIG. 26A) show a modification of the recess 101 which is formed in the side opposite to the principal surface of the semiconductor chip 1. In this modification, an annular recess 101a is formed in the side opposite to the principal surface of the semiconductor chip 1.

Figure 37A:
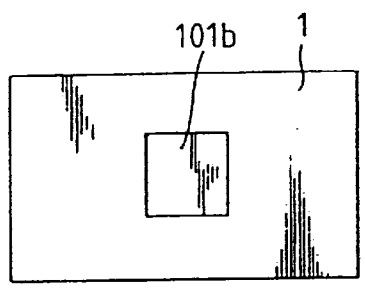
Figure 37B:
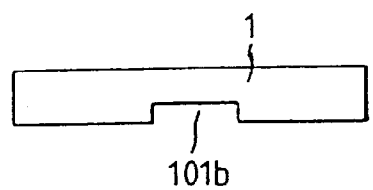

FIG. 37A (presenting a top plan view) and FIG. 37B (presenting a section) show another modification of the recess 101 which is formed in the side opposite to the principal surface of the semiconductor chip 1. In this modification, a square recess 101b is formed in the side opposite to the principal surface of the semiconductor chip 1.

Figure 38A:
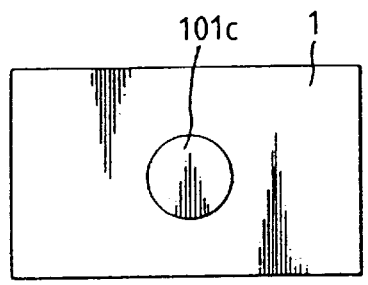
Figure 38B:
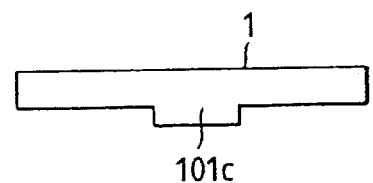

FIG. 38A (presenting a top plan view) and FIG. 38B (presenting a side elevation) show another modification of the recess 101 which is formed in the side opposite to the principal surface of the semiconductor chip 1. In this modification, a round rise 101c is formed in the side opposite to the principal surface of the semiconductor chip 1.

Figure 39A:
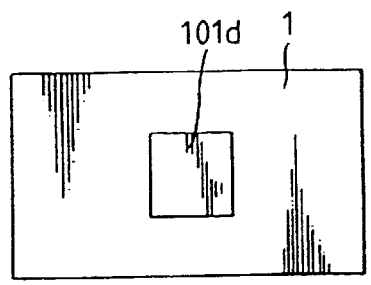
Figure 39B:
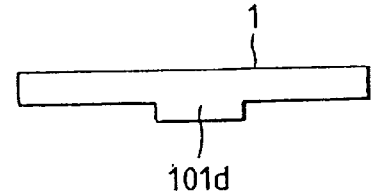

FIG. 39A (presenting a top plan view) and FIG. 39B (presenting a side elevation) show another modification of the recess 101 which is formed in the side opposite to the principal surface of the semiconductor chip 1. In this modification, a square rise 101d is formed in the side opposite to the principal surface of the semiconductor chip 1.

Figure 40A:
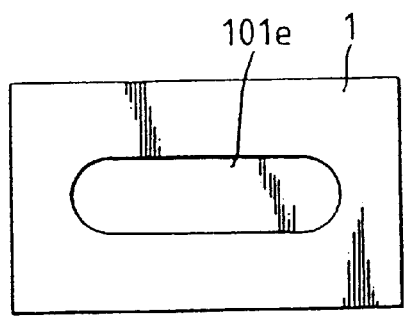
Figure 40B:
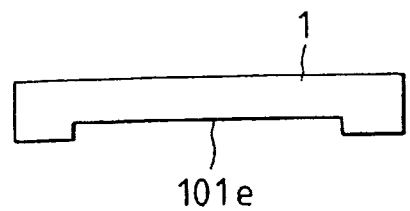

FIG. 40A (presenting a top plan view) and FIG. 40B (presenting a side elevation) show another modification of the recess 101 which is formed in the side opposite to the principal surface of the semiconductor chip 1. In this modification, an elliptical recess 101e is formed in the side opposite to the principal surface of the semiconductor chip 1.

Figure 41A:
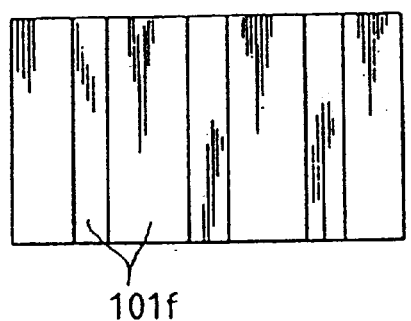
Figure 41B:
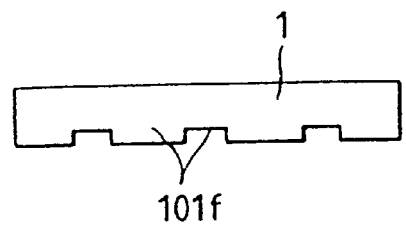

FIG. 41A (presenting a top plan view) and FIG. 41B (presenting a side elevation) show another modification of the recess or rise 101 which is formed in the side opposite to the principal surface of the semiconductor chip 1. In this modification, recesses or rises 101f are formed in the groove shape in the side opposite to the principal surface of the semiconductor chip 1. The grooves may take in the form of a lattice.

Since one of the recesses or rises 101a to 101f is formed in the side opposite to the principal surface of the semiconductor chip 1, as has been described above, the semiconductor chip 1 can be firmly restricted by the mold resin 2A.

It is also possible to reduce the stress which is generated in the mold resin 2A by the corner portions at the side opposite to the principal surface of the semiconductor chip 1.

Figure 42:
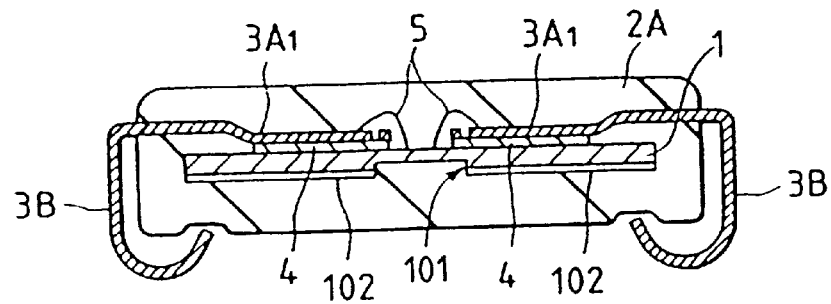
FIG. 42 i a section showing another embodiment relating to the Embodiment V.

FIG. 42 shows another embodiment according to the present invention and belonging to the Embodiment V. The aforementioned recess or rise 101 is formed in the side opposite to the principal surface of the semiconductor chip 1 while leaving an silicon oxide film 102 on the side opposite to the principal surface of the semiconductor chip 1 of the Embodiment V.

Since the silicon oxide film 102 is thus left on the side opposite to the principal surface of the semiconductor chip 1, the adhesion between the silicon oxide film 102 and the mold resin 2A is so strong that the mold resin 2A can be prevented from being peeled off from the side opposite to the principal surface of the semiconductor chip 1.

Thanks to the recess or rise 101, moreover, the semiconductor chip 1 can be firmly restricted by the mold resin 2A.

Embodiment VI

Figure 43:
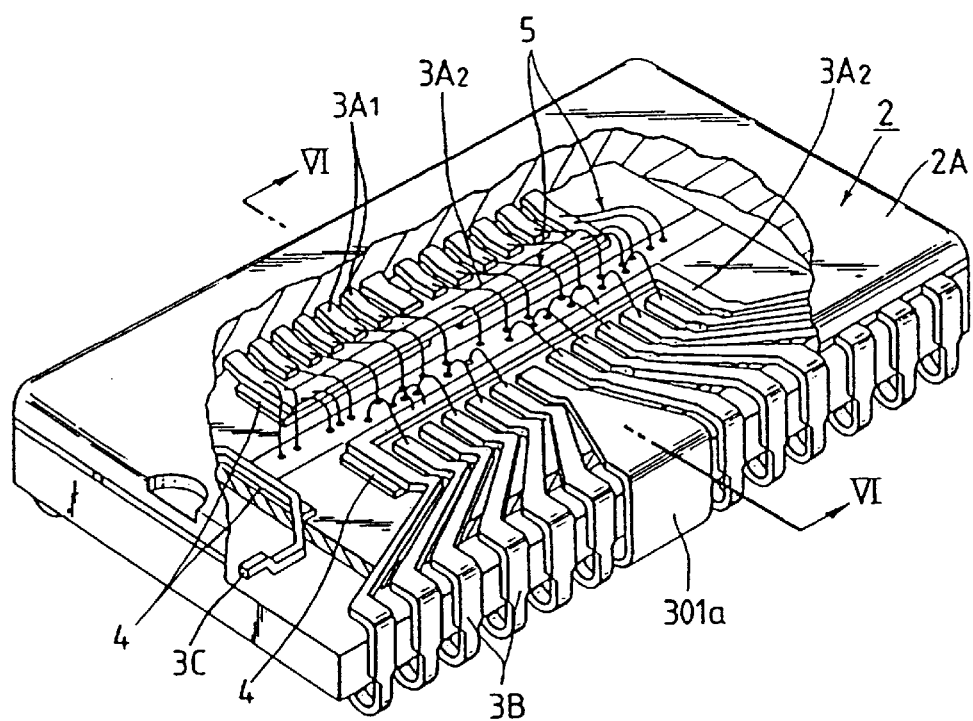
FIG. 43 is a partially sectional perspective view showing the schematic structure of a resin-sealed type semiconductor device according to Embodiment VI of the present invention.
Figure 44:
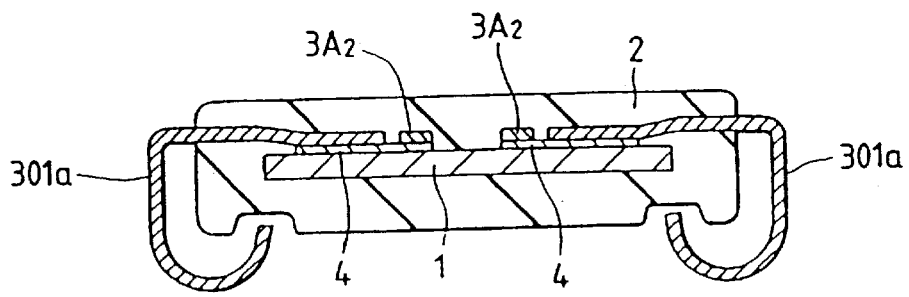
FIG. 44 is a section taken along line VI—VI of FIG. 43.

The resin-sealed type semiconductor device according to the Embodiment VI of the present invention is constructed, as shown in FIG. 43 (presenting a perspective view in partial section) and FIG. 44 (presenting a section taken along line VI—VI of FIG. 43): such that the signal inner leads $3A_1$ and the common inner leads $3A_2$ are adhered to the principal surface of the semiconductor chip 1 of the foregoing Embodiment I through the insulating films 4 for insulating them electrically from the semiconductor chip 1; and such that the signal inner leads $3A_1$, the common inner leads $3A_2$ and the semiconductor chip 1 are electrically connected through the bonding wires 5 and sealed with a mold resin 2A. The semiconductor device is equipped at the longitudinal centers of the sides of the package 2 with radiating leads 301A which are insulated from the semiconductor chip 1 and which have their one-side ends extended to above the exothermic portions of the principal surface of the semiconductor chip 1 and their other ends extended to below the outside of the side of the package 2 opposite to the principal surface of the semiconductor chip 1.

Thus, the one-side ends of the radiating leads 301a electrically insulated from the semiconductor chip 1 are extended at the longitudinal centers of the sides of the package to above the exothermic portions of the principal surface of the semiconductor chip 1, and the other ends of the radiating leads 301a are extended to below the outside of the package 2 opposite to the principal surface of the semiconductor chip 1, so that the radiation efficiency of the exothermic portions of the semiconductor chip 1 can be improved.

Figure 45:
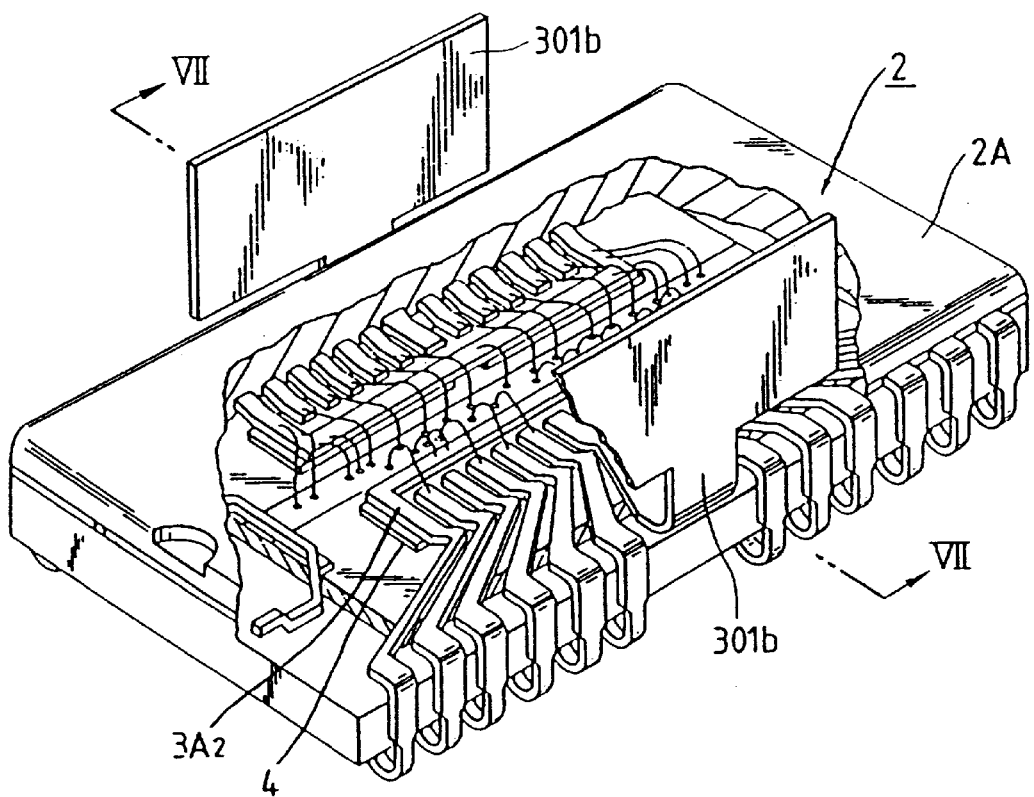
FIG. 45 is a partially sectional perspective view showing the schematic structure of a resin-sealed type semiconductor device modified from the Embodiment VI of the present invention.
Figure 46:
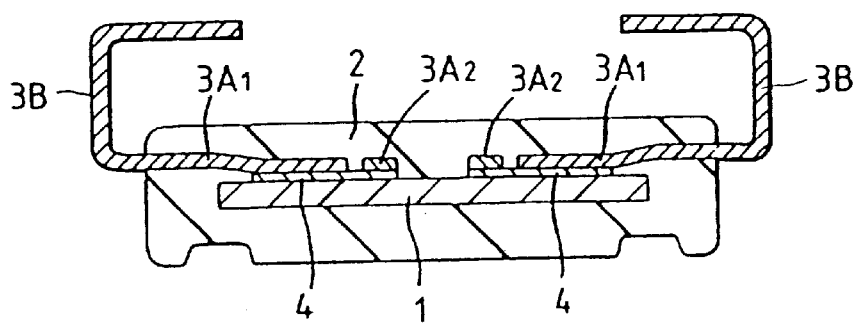
FIG. 46 is a section taken along line VII—VII of FIG. 45.

FIGS. 45 (presenting a perspective view in partial section) and FIG. 46 (presenting a section taken along line VII—VII of FIG. 45) show a modification of the radiating leads 301a shown in FIG. 43. The modified radiating leads 301b have their one-side ends extended to above the exothermic portions of the principal surface of the semiconductor chip 1 and their other ends extended to above the outside of the package 2 at the side of the principal surface of the semiconductor chip 1.

The radiating leads 301b have their extensions providing the radiating plates.

Thus, at the longitudinal centers of the sides of the package, the one-side ends of the radiating leads 301b electrically insulated semiconductor chip 1 are extended to above the exothermic portions of the principal surface of the semiconductor chip 1, and the other ends of the radiating leads 301b are extended to above the outside of the package 2 at the side of the principal surface of the semiconductor chip 1, so that the radiating efficiency of the exothermic portions of the semiconductor chip 1 can be improved.

Here, the other ends of the radiating leads 301b extended to above the outside of the package 2 at the side of the principal surface of the semiconductor chip 1 may be folded to have their volumes reduced, as indicated by broken line in FIG. 46.

On the other hand, the lead frames for the aforementioned radiating leads 301a and 301b are fabricated integrally with the signal lead frame.

Figure 47:
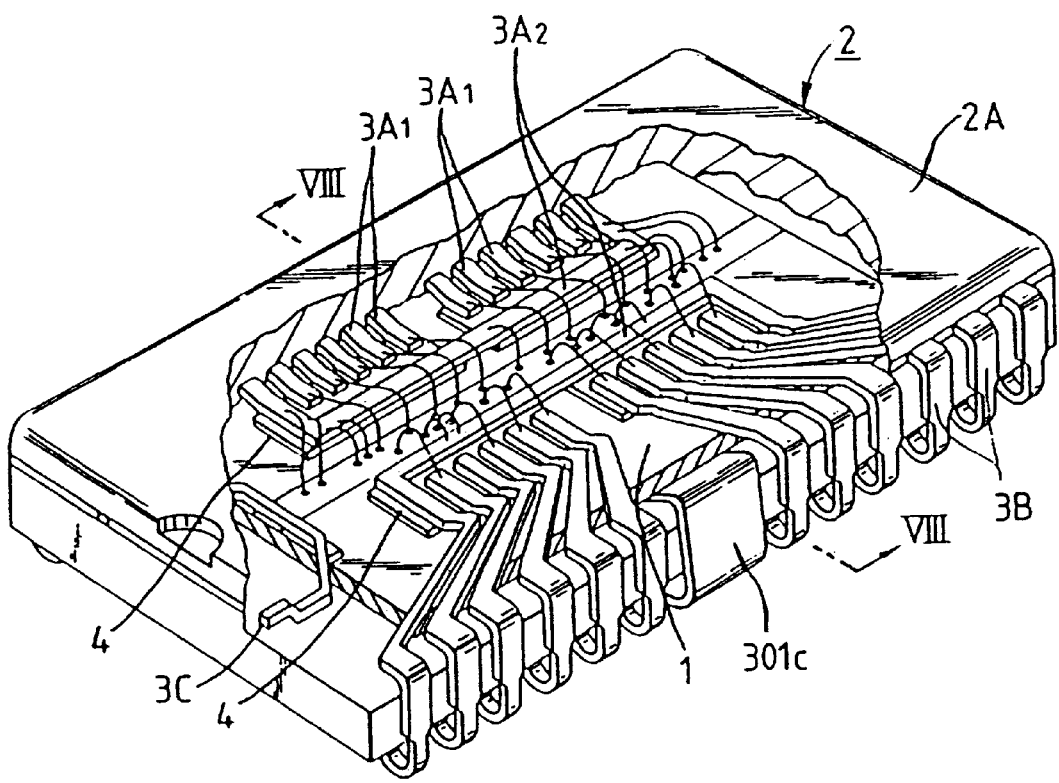
FIG. 47 is a partially sectional perspective view showing the schematic structure of a resin-sealed type semiconductor device modified from the Embodiment VI of the present invention.
Figure 48:
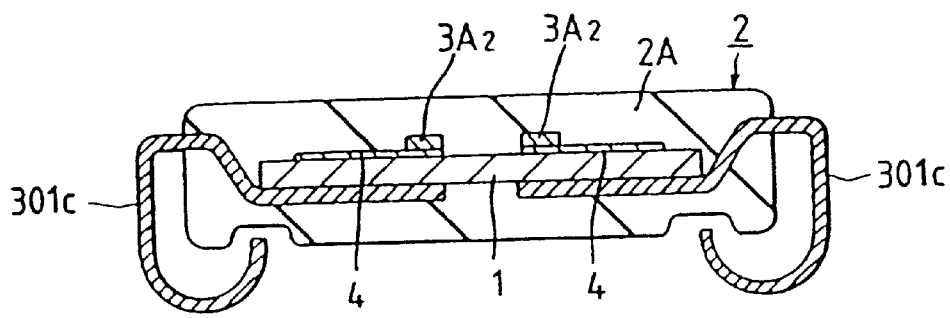
FIG. 48 is a section taken along line VIII—VIII of FIG. 47.

FIG. 47 (presenting a perspective view in partial section) and FIG. 48 (presenting a section taken along line VIII—VIII of FIG. 48) show a modification of the Embodiment VI shown in FIG. 39. In this modification, radiating leads 301c have their one-side ends extended to the sides opposite to the exothermic portions of the principal surface of the semiconductor chip 1 and their other ends extended below the outside of the package 2 opposite to the principal surface of the semiconductor chip 1.

Thus, at the longitudinal centers of the sides of the package, the one-side ends of the radiating leads 301c electrically insulated from the semiconductor chip 1 are extended to the sides opposite to the exothermic portions of the principal surface of the semiconductor chip 1, and the other ends of the radiating leads 301c are extended to below the outside of the package 2 opposite to the principal surface of the semiconductor chip 1, so that the radiating efficiency of the exothermic portions of the semiconductor chip 1 can be improved.

The one-side ends of the radiating leads 301c need not always be electrically insulated from the semiconductor chip 1 by means of the insulating film.

In this case, moreover, the lead frame of the radiating leads 301c is fabricated separately of the signal lead frame.

Embodiment VII

Figure 49:
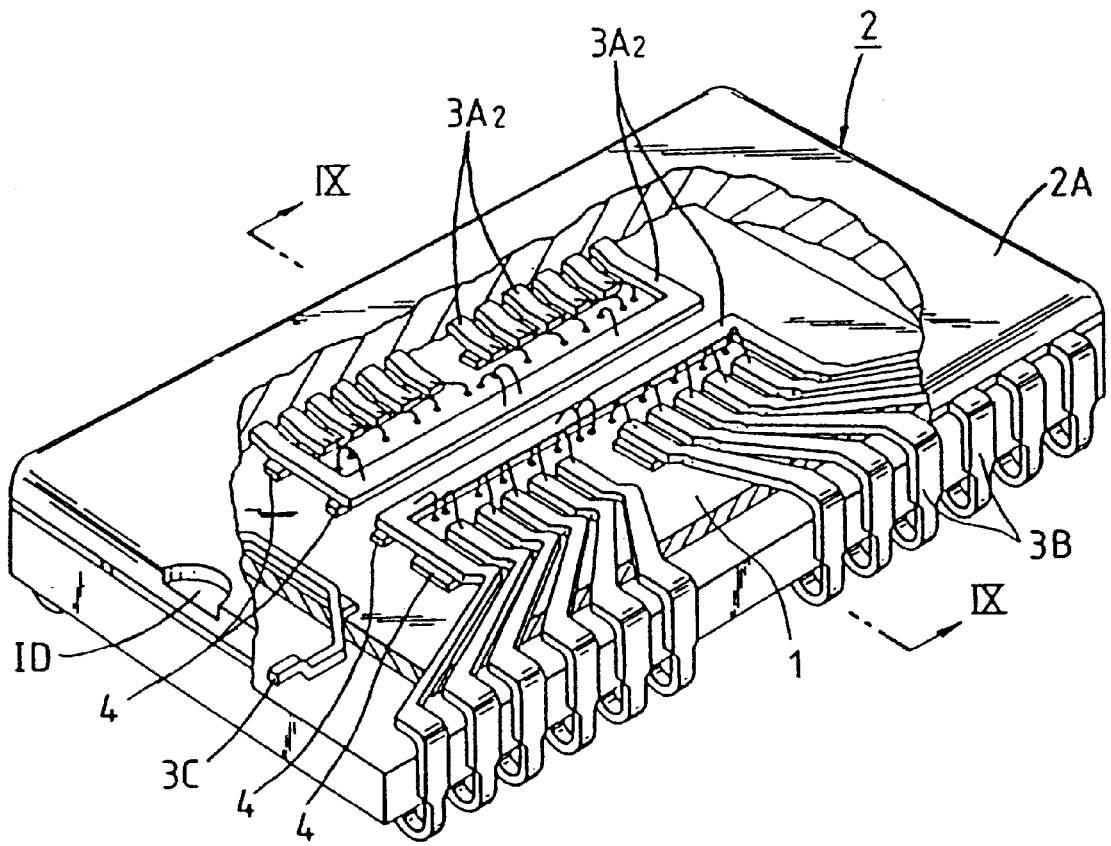
FIG. 49 is a partially sectional perspective view showing the schematic structure of a resin-sealed type semiconductor device according to Embodiment VII of the present invention.
Figure 50:
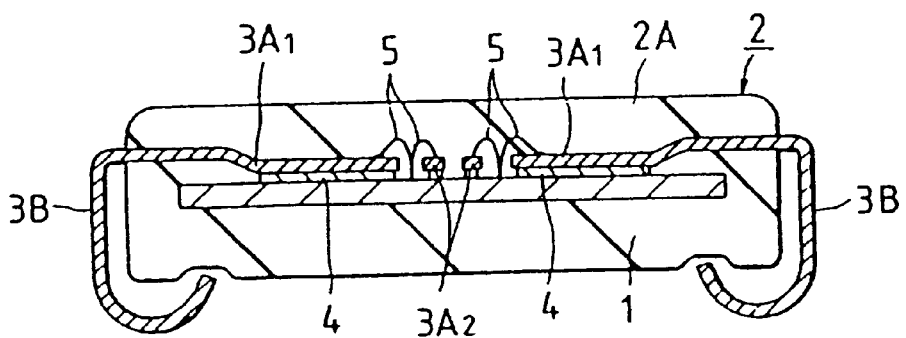
FIG. 50 is a section taken along lien IX—IX of FIG. 49.

The resin-sealed type semiconductor device according to the Embodiment VII of the present invention is constructed, as shown in FIG. 49 (presenting a perspective view in partial section) and FIG. 50 (presenting a section taken along line IX—IX of FIG. 49): such that the signal inner leads $3A_1$ and the common inner leads $3A_2$ are adhered to the principal surface of the semiconductor chip 1 of the foregoing Embodiment I shown in FIG. 1 through the insulating films 4 for insulating them electrically from the semiconductor chip 1; and such that the signal inner leads $3A_1$, the common inner leads $3A_2$ and the semiconductor chip 1 are electrically connected through the bonding wires 5 and sealed with a resin. In this semiconductor device, the principal surface of the semiconductor chip 1 is arranged with the bonding pads BP which do not intersect the bonding wires 5 and the common inner leads $3A_2$ arranged on the principal surface.

Figure 51:
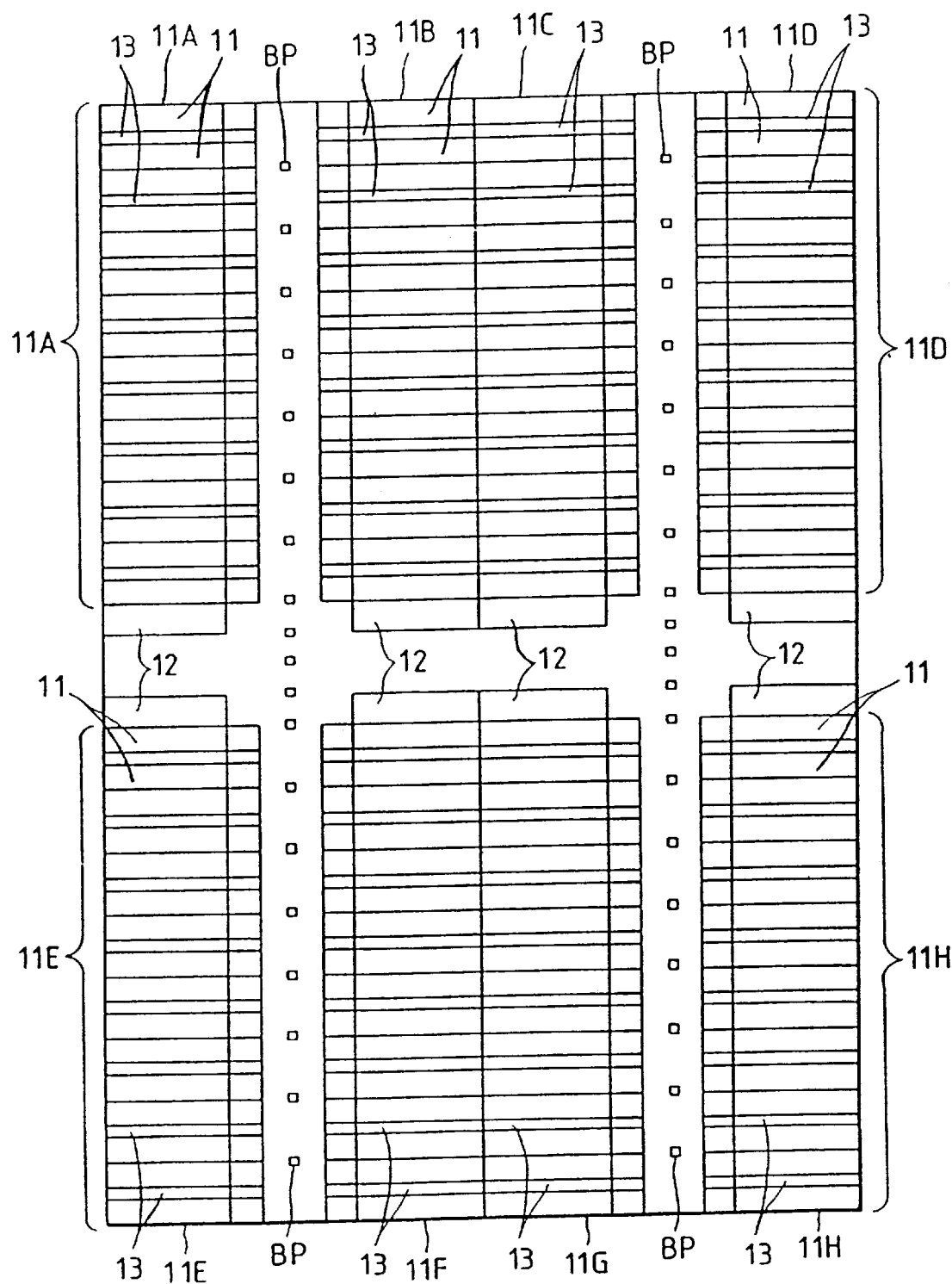
FIG. 51 is a top plan view showing the layout of the element of the semiconductor chip of the Embodiment VII and the layout of the bonding pads BP.

The element layout and bonding pads BP of the semiconductor chip 1 of the present Embodiment VII are shown in FIG. 51 (presenting a layout top plan view).

Specifically, the memory array (MA) is arranged substantially all over the area of the DRAM 1. In this DRAM 1 of the present embodiment VII, the memory cell array is coarsely divided into eight memory cell arrays 11A to 11H, although not limitative thereto. As shown in FIG. 51, the four memory cell arrays 11A, 11B, 11C and 11D are arranged at the upper side of the DRAM 1, and the four memory cell arrays 11E, 11F, 11G and 11H are arranged at the lower side. Each of these eight memory cell arrays 11A to 11H is further finely divided into sixteen memory cell arrays (MA) 11. In short, the DRAM 1 is arranged with one hundred and twenty eight memory cell arrays 11E. Each of the 128 memory cell arrays 11 has a capacity of 128 [Kbits].

The sense amplifier (SA) 13 is interposed between the two of the 128 memory cell arrays 11 of the DRAM 1. The sense amplifier 13 is constructed of a complementary MOSFET (CMOS). The column address decoder (YDEC) 12 is arranged at one lower end of each of the four 11A, 11B, 11C and 11D of the eight memory cell arrays of the DRAM 1. Likewise, the column address decoder (YDEC) 12 is arranged at one upper end of each of the memory cell arrays 11E, 11F, 11G and 11H.

The peripheral circuit 17 and the external terminals BP are interposed between the two 11A and 11B, the two 11C and 11D, the two 11E and 11F, and the two 11G and 11H of the eight memory cell arrays of the DRAM 1. On the other hand, the peripheral circuits 17 and the peripheral circuits 18 are disposed at the individual lower regions of the memory cell arrays 11A, 11B, 11C and 11D and at the individual upper regions of the memory cell arrays 11E, 11F, 11G and 11H. The peripheral circuits 17 are exemplified by a main amplifier, an output buffer circuit, a substrate potential generator (or $V_{BB}$ generator) and a power source circuit.

The peripheral circuit 18 is further exemplified by a row address strobe (RAS) circuit, a write enable (WE) circuit, a data input buffer, a $V_{CC}$ limitter, an X-address driver (i.e., logical stage), an X-redundancy circuit, an X-address buffer, a column address strobe (CAS) circuit, a test circuit, a VDL limittter, a Y-address driver (i.e., logical stage), a Y-redundancy circuit, a Y-address buffer, a Y-address driver (i.e., drive stage), an X-address driver (i.e., drive stage), and a mat selecting signal circuit (i.e., drive stage) (as should be referred to FIG. 4 and its description).

Since the aforementioned resin-sealed type semiconductor device 2 is constructed to have the LOC structure and since the inner leads 3A are extended to the central portion of the DRAM 1, the external terminals BP are arranged at the central portion of the DRAM 1 and on the principal surface of the semiconductor chip 1 such that they are kept away from intersecting the bonding wires 5 and the common inner leads $3A_2$ arranged on the principal surface of the semiconductor chip 1.

The external terminals BP are arranged within the regions defined by the memory cell arrays 11A, 11B, 11C, 11D, 11E, 11F, 11G and 11H from the upper to the lower ends of the DRAM 1. The signals to be applied to the external terminals BP will not be described here because they have been described in connection with the resin-sealed type semiconductor device 2 shown in FIG. 1.

Since the inner leads 3A supplied with the reference voltage ($V_{SS}$) and the power source voltage ($V_{CC}$) surface of the DRAM 1, the DRAM 1 is arranged with the plural external terminals BP for the reference voltage ($V_{SS}$) and the power source voltage ($V_{CC}$) in the extending direction. In short, the DRAM 1 is constructed to effect sufficient supply of the reference voltage ($V_{SS}$) and the power source voltage ($V_{CC}$).

As has been described above, according to the present Embodiment VII, the principal surface of the semiconductor chip 1 is arranged with the bonding pads BP which do not intersect with the bonding wires 5 and the common inner leads $3A_2$ arranged on the same surface. Thus, it is possible to prevent the shorting between the bonding wires 5 for connecting the signal inner leads $3A_1$ and the semiconductor chip 1 and the common inner leads $3A_2$.

Next, the lead frame will be described in detail in the following.

Figure 52:
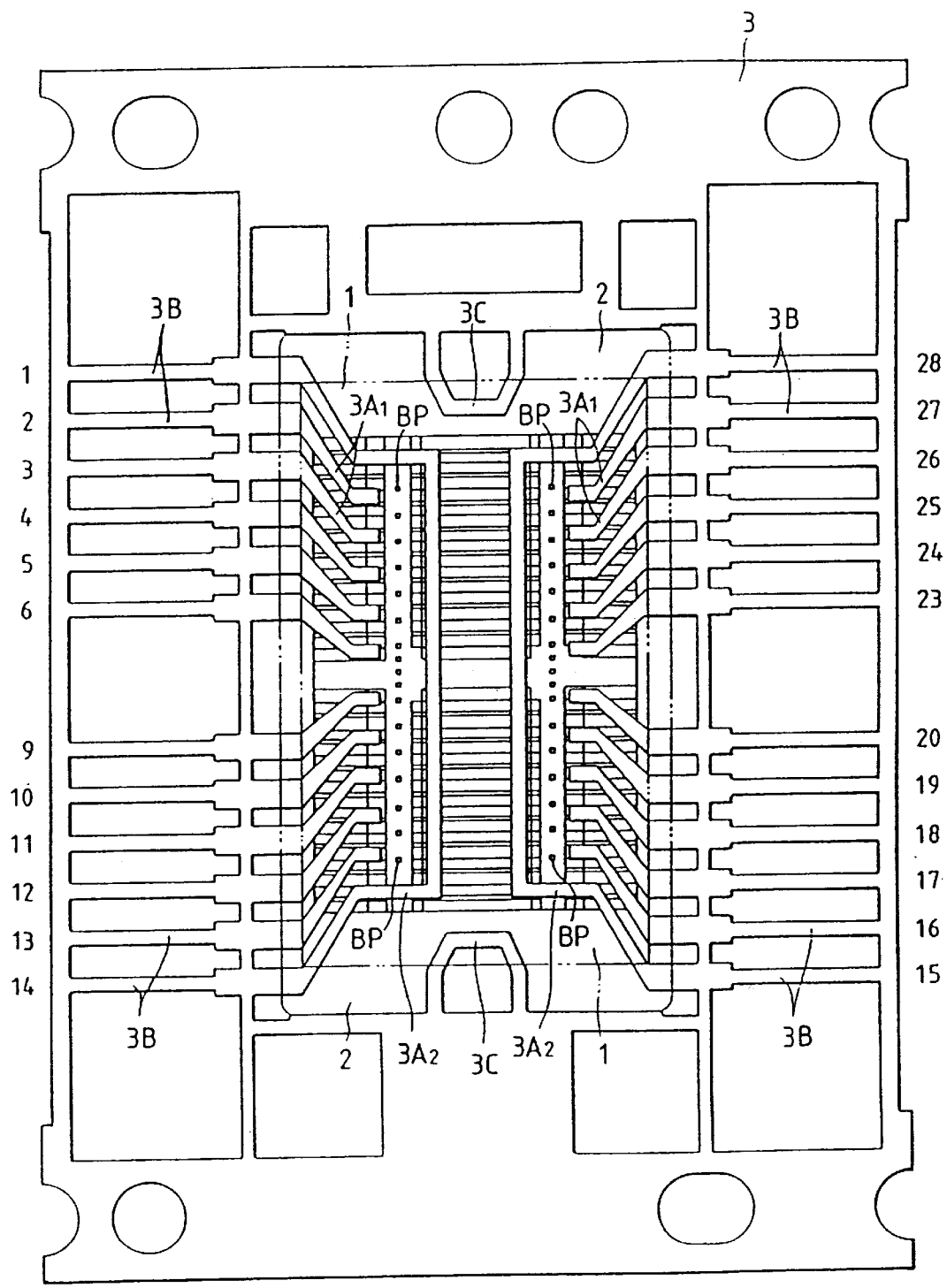
FIG. 52 is an overall top plan view showing the lead frame of the Embodiment VII.

As shown in FIG. 52 (presenting an overall top plan view of the lead frame, the lead frame 3 of the present Embodiment VII is equipped with twenty signal inner leads $3A_1$ and two common inner leads $3A_2$. The inner leads $3A_1$ are stepped, as shown in FIG. 50 (presenting a section, such that the gap between their portions nearer the outer leads 3B than their portions contacting with the insulating films 4 and the semiconductor chip is larger than the gap between their portions contacting with the insulating films (or insulators) 4 and the semiconductor chip 1. By thus adopting the stepped structure in the semiconductor chip 1, the stray capacity between the semiconductor chip 1 and the signal inner leads $3A_1$ can be reduced to a lower level than that of the prior art to improve the signal transmission rate and to drop the electrical noises.

The present Embodiment VII is identical to the foregoing Embodiment I except the arrangement of the bonding pads BP on the principal surface of the semiconductor chip 1 and the lead frame.

Incidentally, the techniques of the foregoing Embodiments II–VI can naturally be applied to the present Embodiment VII.

Embodiment VIII

Figure 53:
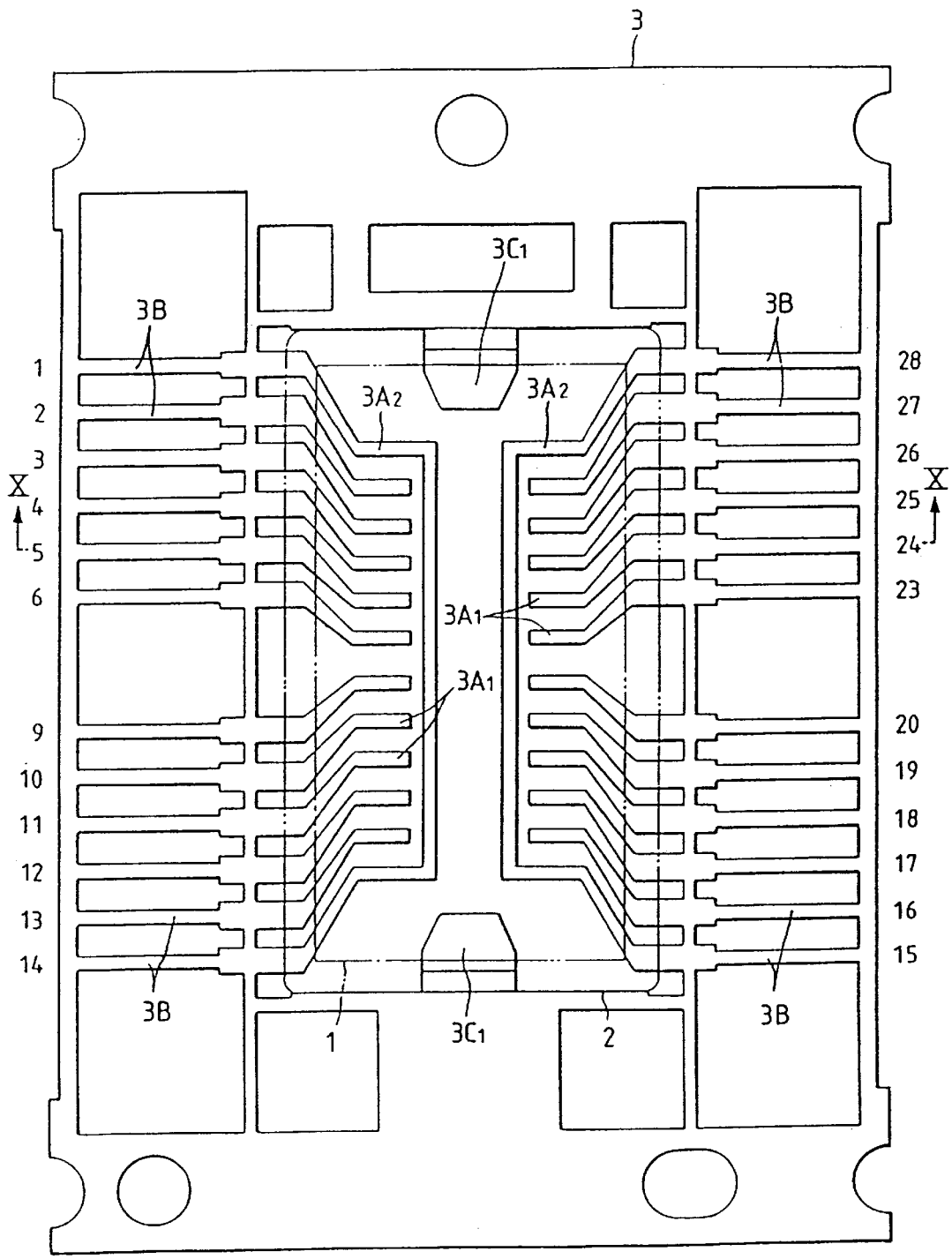
FIG. 53 is a top plan view showing the schematic structure of the lead frame of a resin-sealed type semiconductor device according to Embodiment VIII of the present invention.

The resin-sealed type semiconductor device according to the Embodiment VIII of the present invention is, as shown in FIG. 53 (plan presenting the schematic mechanism of the lead frame in Embodiment VIII) a modification of the lead frame of the foregoing Embodiment I, in which inner leads $3C_1$ (suspending leads) to be supplied with no power are folded to fix the side of the semiconductor chip 1 opposite to the principal surface.

Figure 54A:
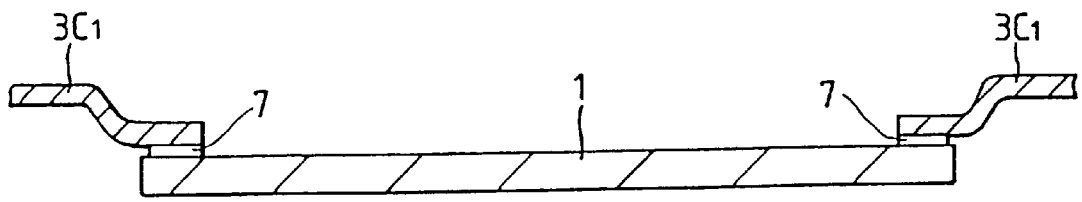
FIGS. 54A, 54B and 54C are sections showing the semiconductor chip fixing portions of the resin-sealed type semiconductor device according to the Embodiment VIII of the present invention, respectively.
Figure 56:
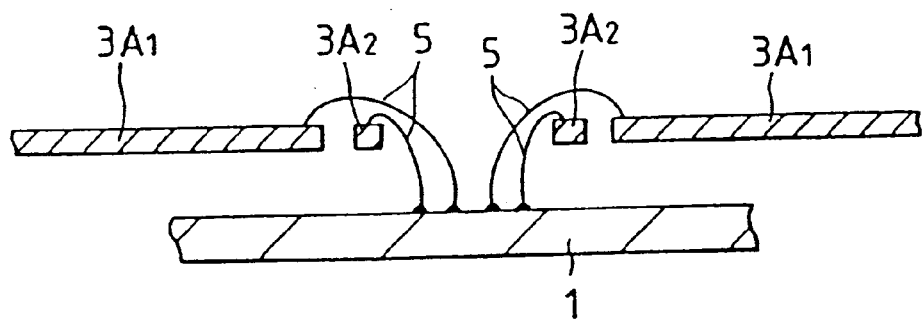

As shown in FIG. 54A (presenting a section showing the semiconductor chip fixing portion) and FIG. 56 (presenting a section showing the signal inner leads and the common inner leads before the resin molding), moreover, the semiconductor chip 1 is adhered and fixed with the adhesive 7 by the suspending leads $3C_1$ such that the signal inner leads $3A_1$ and the common inner leads $3A_2$ are arranged in floating states from the principal surface of the semiconductor chip 1.

The adhesive 7 may be any of the aforementioned adhesives such as epoxy resins or resol resins.

On the other hand, the adhesions may be effected through the insulating films 4 between the suspending leads $3C_1$ and the semiconductor chip 1.

In this case, the connections of the signal inner leads $3A_1$ and the common inner leads $3A_2$ and the bonding pads BP of the semiconductor chip 1 by means of the bonding wires 5 are accomplished by holding the signal inner leads $3A_1$ and the common inner leads $3A_2$ on the semiconductor chip 1 by means of a jig. If the holding jig is removed after the wire bondings, the signal inner leads $3A_1$ and the common inner leads $3A_2$ are brought into the state shown in FIG. 56 by the spring-back effect of the suspending leads $3C_1$.

Figure 54B:
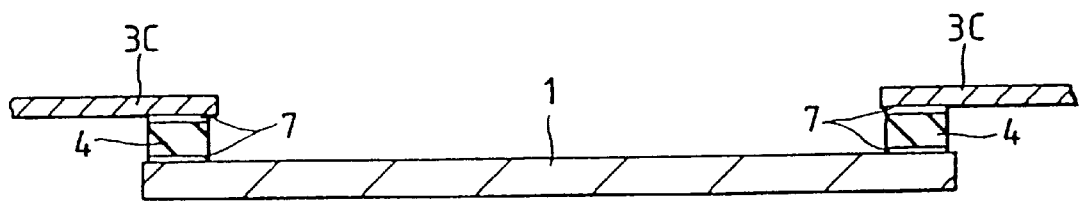

As shown in FIG. 54B, on the other hand, the signal inner leads $3A_1$ and the common inner leads $3A_2$ may be arranged in a floating state from the principal surface of the semiconductor chip 1 (as shown in FIG. 56) by sandwiching the insulating films 4 of a predetermined thickness between the suspending leads 3C of the lead frame 3 applied to the foregoing Embodiment 1 and the principal surface of the semiconductor chip 1 and adhering them by means of the adhesive 7. In this case, the insulating films 4 ordinarily have a thickness of 150 microns but can have a larger thickness.

Figure 55:
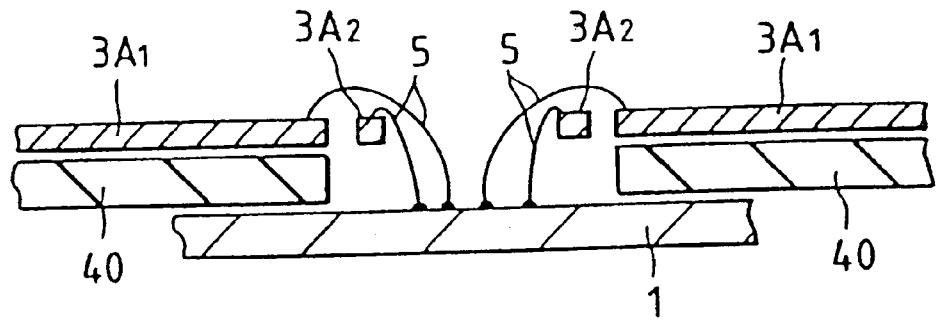
FIGS. 55, 56 and 57 are sections showing the modifications of the resin-sealed type semiconductor device according to the Embodiment VIII of the present invention before the resin molding.

As shown in FIG. 55 (presenting a section showing the state before the resin molding), on the other hand, insulating plates 40 may be sandwiched between the signal inner leads $3A_1$ and the common inner leads $3A_2$ and the principal surface of the semiconductor chip 1 to connect the signal inner leads $3A_1$, the common inner leads $3A_2$ and the semiconductor chip 1 electrically by the bonding wires 5 and to seal them up with the mold resin.

Figure 57:
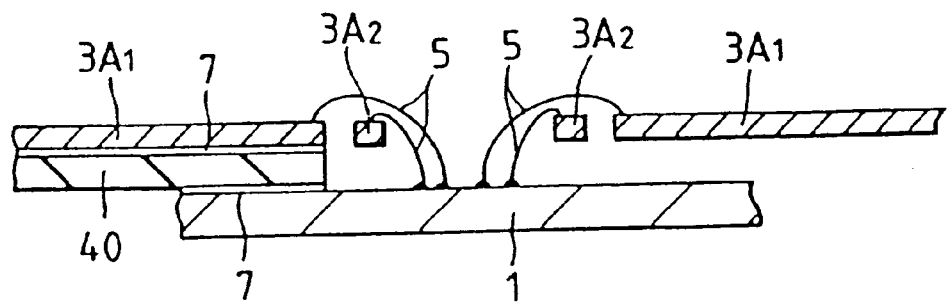

As shown in FIG. 57 (presenting a section showing the state before the resin molding), moreover, the insulating plate 40 may be sandwiched only between the one-side, e.g., lefthand signal inner lead $3A_1$ and common inner lead $3A_2$ and the semiconductor chip 1, whereas the righthand signal inner lead $3A_1$ and common inner lead $3A_2$ and the semiconductor chip 1 may be electrically connected through the bonding wires 5 and sealed with the mold resin such that the signal inner lead $3A_1$ and the common inner lead $3A_2$ are floating from the principal surface of the semiconductor chip 1.

Figure 54C:
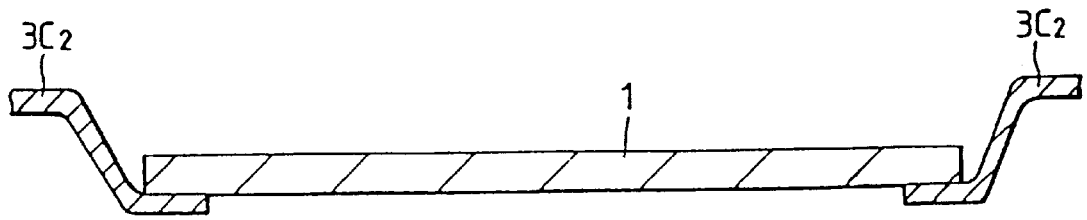

In order that the signal inner leads $3A_1$ and the common inner leads $3A_2$ may be arranged in a floating state from the principal surface of the semiconductor chip 1 (as shown in FIG. 56), as shown in FIG. 54C, the suspending leads $3C_1$ may be deeply folded to form suspending leads 3C₂ for fixedly adhering the side of the semiconductor chip 1 opposite to the principal surface. As a result, the side of the semiconductor chip 1 opposite to the principal surface is adhered and fixed by the suspension leads 3C₂ so that the signal inner leads 3A₁ and the common inner leads 3A₂ are floating from the principal surface of the semiconductor chip 1, thus eliminating the step of adhering the insulating films 4. Moreover, the semiconductor chip 1 is firmly fixed. Since no lead line is adhered to the memory cells, it is possible to reduce the breakage of the memory cells.

As has been described above, according to the present Embodiment VIII, the moisture absorption can be reduced by eliminating or minimizing the use of the insulating films 4 to make the solder reflow resistance advantageous.

In the Embodiment VIII, it is preferable to apply the alpha ray shielding polyimide film to the whole region of the principal surface of the semiconductor chip 1 except the bonding pads.

Embodiment IX

Figure 58A:
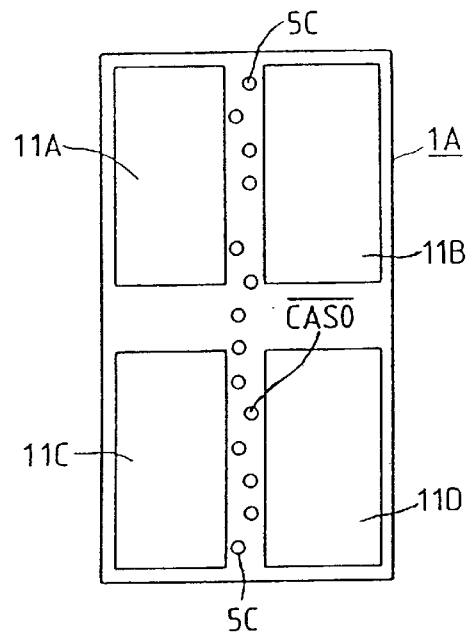
FIGS. 58 and 59 are layouts of the semiconductor chips of the resin-sealed type semiconductor device according to Embodiment IX of the present invention.
Figure 58B:
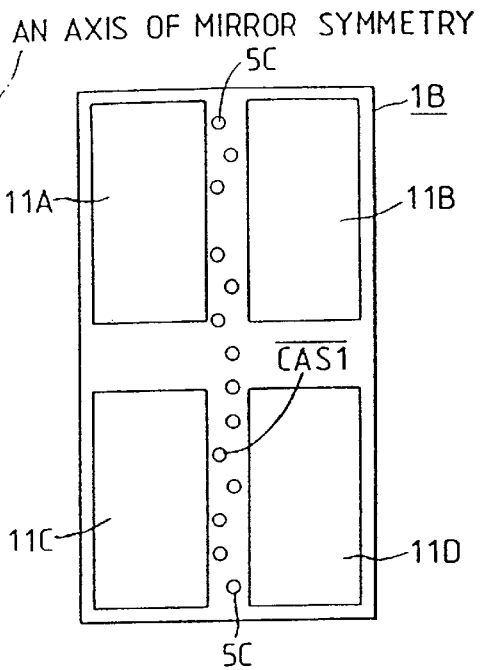
Figure 59A:
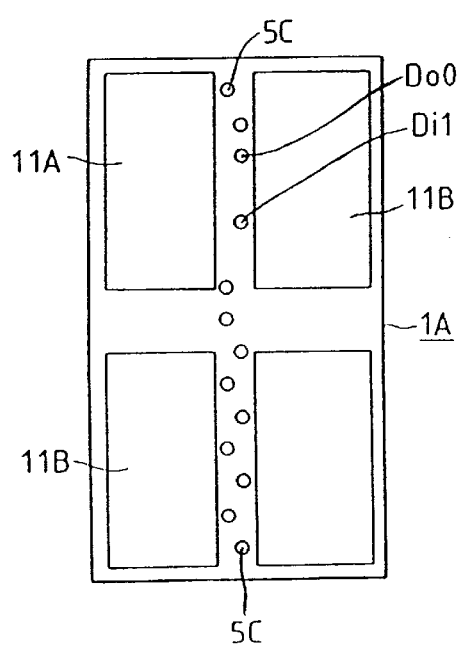
Figure 59B:
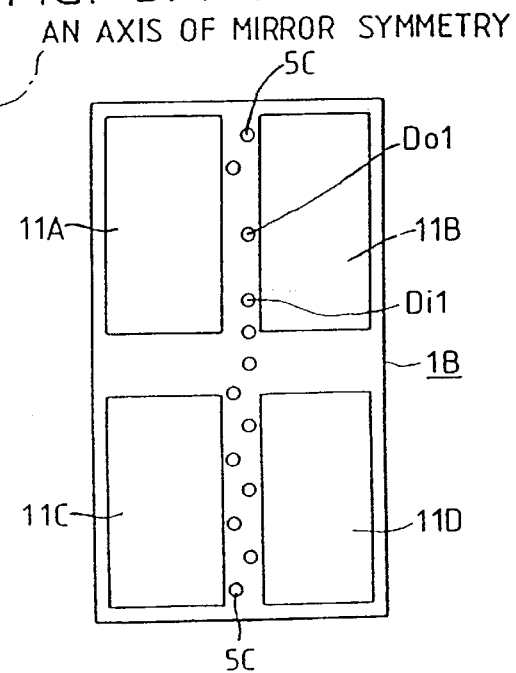

In the resin-sealed type semiconductor device according to the Embodiment IX of the present invention, as shown in FIGS. 58 and 59 (presenting layouts of the semiconductor chip), there are provided two semiconductor chips 1A and 1B which are formed in a mirror symmetry with the bonding pads BP (or solder bumps) connected with the inner leads.

In FIG. 58, the CAS0 terminals (i.e., bonding pads BP) and the CAS1 terminals (i.e., bonding pads BP) are shared, and the other terminals (i.e., bonding pads BP) are held in common. This layout doubles the capacity in the word direction.

In FIG. 59, the Do terminals and the Di terminals are shared, whereas the other terminals are held in common. This layout doubles the capacity in the bit direction.

Figure 60:
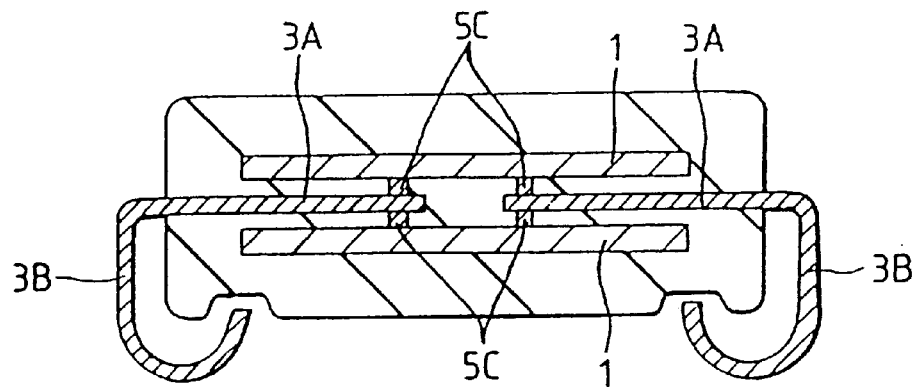
FIG. 60 is a section for explaining the package of the resin-sealed type semiconductor device according to the Embodiment IX of the present invention.

As shown in FIG. 60 (presenting a section for explaining the package), moreover, at the sides of the individual principal surfaces of the two semiconductor chips 1A and 1B and across the inner leads 3A, these inner leads 3A and the bonding pads BP of the semiconductor chip 1 are electrically connected through the solder bumps 5C and sealed up with the mold resin.

Thus, in the two semiconductor chips 1A and 1B formed in the mirror symmetry with the inner leads 3A and the bonding pads BP, the inner leads 3A and the bonding pads BP of the semiconductor chip 1 are electrically connected at the sides of the individual principal surfaces and across the inner leads 3A through the solder bumps 5C and sealed up with the mold resin so that an element having a twice capacity can be packaged without changing the contour of the package 2.

Embodiment X

Figure 61:
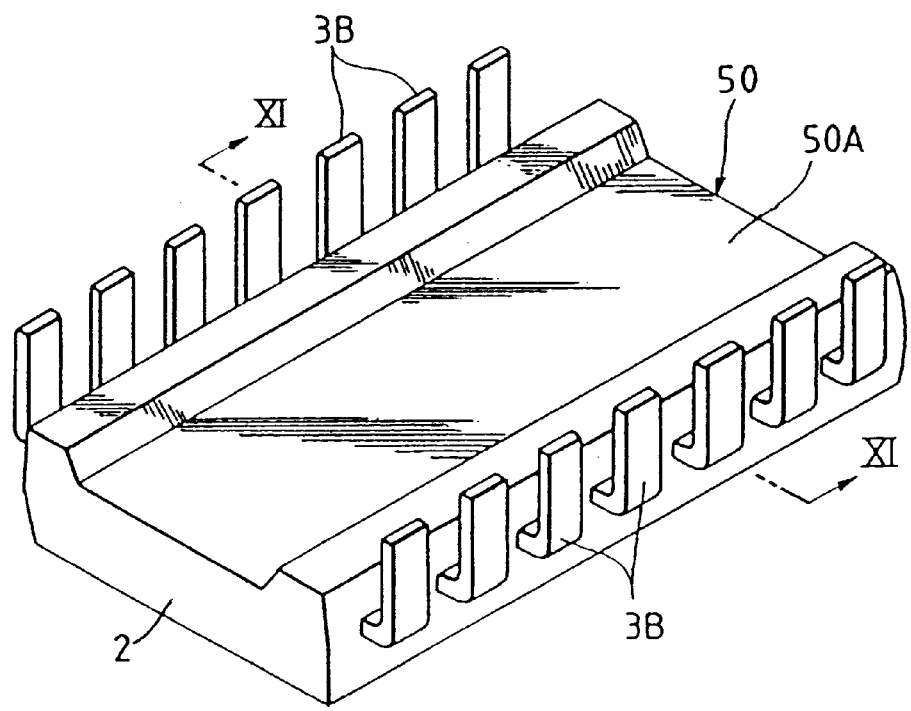
FIG. 61 is a perspective view showing the side opposed to the wiring substrate of a resin-sealed type semiconductor device according to Embodiment X.
Figure 62:
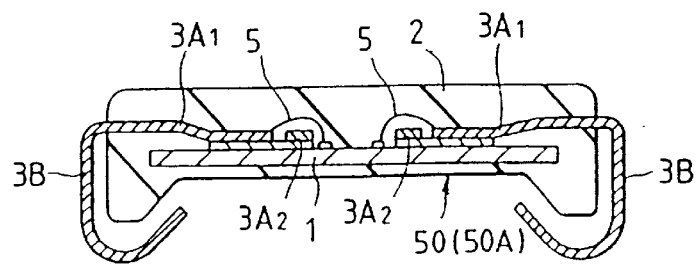
FIG. 62 is a section taken along line XI—XI of FIG. 61.

In the resin-sealed type semiconductor device according to the Embodiment X of the present invention, as shown in FIG. 61 (presenting a perspective view taken from the side opposed to the wiring substrate of the resin-sealed type semiconductor device of the Embodiment X) and FIG. 62 (presenting a section taken along line XI—XI of FIG. 61), the package 2 of the semiconductor device of the foregoing Embodiment I is formed, at its side facing the substrate, with a radiating groove 50 which is opened to the outside. In this case, the distance between the bottom 50A of the radiating groove 50 and the semiconductor chip 1, i.e., the thickness of the mold resin 2A below the semiconductor chip 1 is set at 0.3 mm or less.

Figure 68:
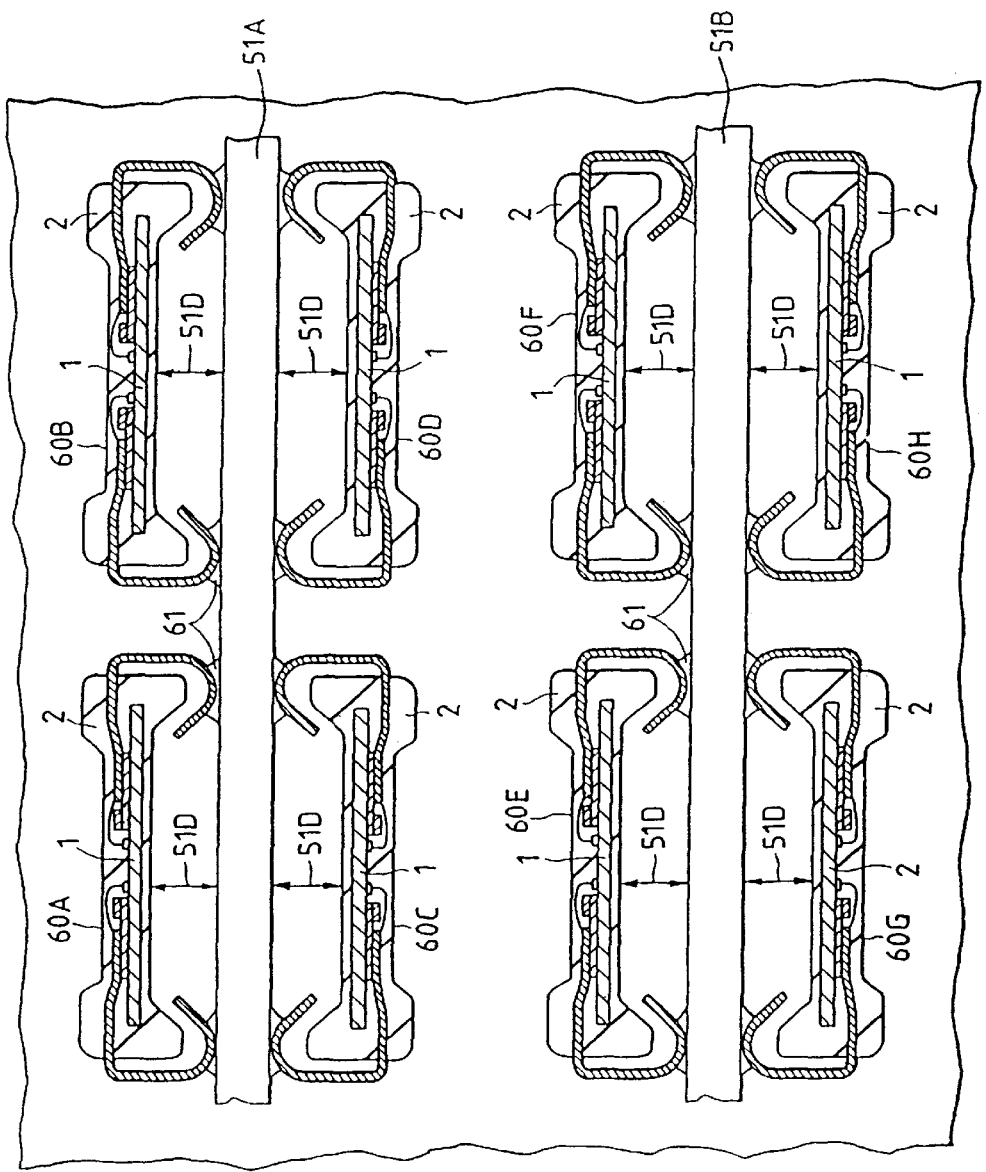
FIGS. 68 and 69 are sections showing the state in which the resin-sealed type semiconductor device of the Embodiment X is packed in the wiring substrate.
Figure 69:
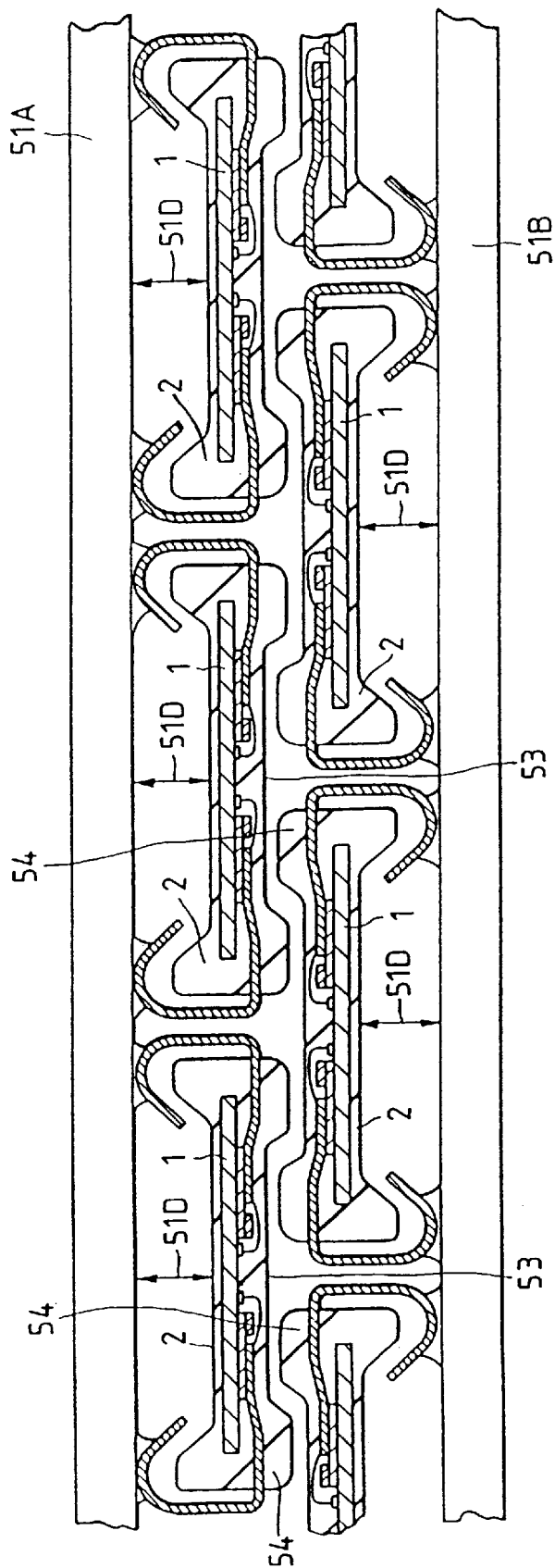

By forming the radiating groove 50, as shown in FIGS. 68 and 69 (presenting sections showing the state in which the resin-sealed type semiconductor device of the Embodiment X is packed in the wiring substrate), the gap 51D between a substrate 51A or 51B and the bottom 50A of the radiating groove 50 is so enlarged that it is supplied with the cooling air, if directed normal to the drawing surface, whereby the radiation is effected from the bottom 50A of the radiating groove 50, too, to reduce the heat resistance of the semiconductor device.

Incidentally, in the structure of the present embodiment, the mold resin 2A below the semiconductor chip 1 is thinned to make it necessary to make a device when in the resin molding operation. If the mold resin 2A having a low molten viscocity in the molding operation, the package 2 can be formed, as shown in FIG. 61.

Figure 63:
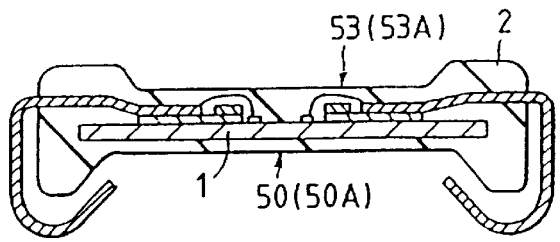
FIG. 63 is a section showing a modification of the resin-sealed type semiconductor device of the Embodiment X.

Next, a modification of the resin-sealed type semiconductor device of the foregoing Embodiment X is shown in FIG. 63 (presenting a section).

In this modified semiconductor device, as shown in FIG. 63, the upper surface of the package 2 shown in FIG. 61 is also formed with an open radiating groove 53. The distance between the bottom 50A of the radiating groove 50 and the bottom 53A of the radiating groove 53, i.e., the thickness of the mold resin below and above the semiconductor chip 1 is set at 0.3 mm or less.

By thus thinning the mold resin 2A of the package 2 above the semiconductor chip 1, the heat transfer surface is increased, but the heat resistance of the semiconductor device is decreased, so that the whole heat resistance can be accordingly reduced. As shown in FIG. 69, moreover, the gap when the semiconductor device is mounted on the substrates 51A and 51B can be shortened by twice as large as the depth of the groove so that the packing density can be increased.

Figure 64:
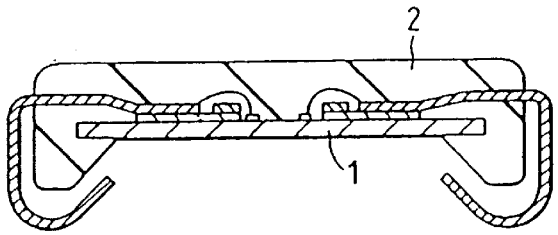
FIGS. 64, 65, 66 and 67 are sections showing other modifications of the semiconductor device of the Embodiment X.
Figure 65:
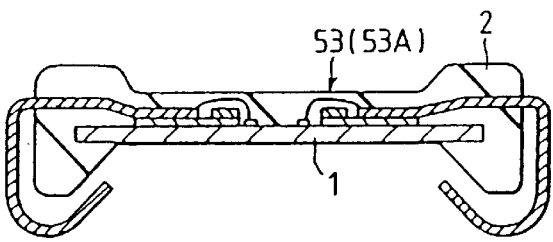

Another modification of the semiconductor device according to the Embodiment X is shown in FIG. 64 or 65.

In this modified semiconductor device, as shown in FIG. 64 or 65, the mold resin 2A of the package of FIG. 62 or 63 below the semiconductor chip 1 is removed to expose the side of the semiconductor chip 1, which is opposed to the principal surface, to the outside.

Thus, the mold resin 2A of the package 2 below the semiconductor chip 1 is removed to expose the side opposite to the principal surface of the semiconductor chip 1 to the outside so that the heat resistance of the semiconductor device can be dropped to reduce the overall heat resistance accordingly.

Thus, it is possible to prevent the cracking from the corner portions of the semiconductor chip 1 due to the temperature cycle.

Figure 66:
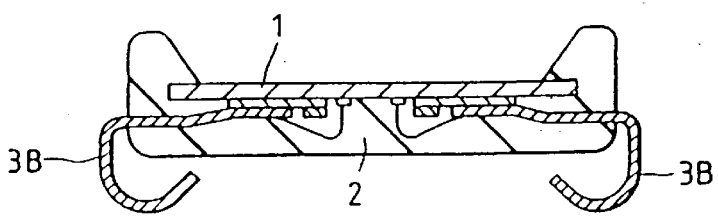
Figure 67:
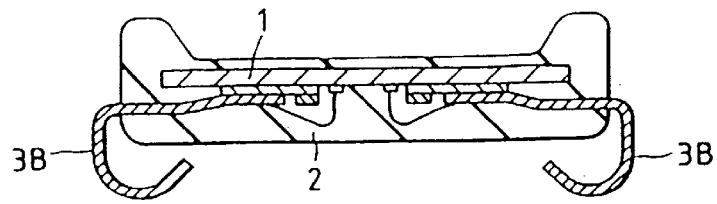

Another modification of the semiconductor device of the Embodiment X is shown in FIG. 66 or 67.

In this modified semiconductor device, as shown in FIG. 66 or 67, the relation between the semiconductor chip 1 and the output leads 3B is reversed in the semiconductor device in which the mold resin 2A of the package 2 shown in FIGS. 62 and 64 below the semiconductor chip 1 is removed to expose the side of the semiconductor chip 1 opposite to the principal surface to the outside.

Thus, the cooling efficiency can be improved in case the cooling of the upper surface of the packing substrate 51 is dominant.

In the modification shown in FIG. 66 or 67, the the package 2 is further formed with the radiating groove at the side of the substrate.

Next, one embodiment of a method of packing the substrate of the resin-sealed type semiconductor device of the present invention shown in FIGS. 61 to 67 will be described in the following.

In the embodiment of the method of packing the substrate of the resin-sealed type semiconductor device shown in FIGS. 61 to 67, as shown in FIG. 68, the resin-sealed type semiconductor devices 60A to 60H shown in FIG. 61 are planarly packed on the respective two sides of the substrates 51A and 51B by means of solder 61.

By thus packing the resin-sealed type semiconductor devices 60A to 60H on the substrates 51A and 51B, it is possible to improve the packing density of the semiconductor device and to radiate from the substrates 51A and 51B of the package 2, too. More specifically, since the radiations of the resin-sealed type semiconductor devices 60A to 60H are effected through the gap 51D between each of their packages 2 and the substrate 51A or 51B packing the former, the resistance to the cooling draft can be reduced to improve the radiating efficiency.

As shown in FIG. 69, the radiating groove 53 and the rise 54 above the package 2 of the resin-sealed type semiconductor device of the embodiment shown in FIG. 63 are packed together between the two substrates 51A and 51B.

Since the resin-sealed type semiconductor device is thus packed, its packing density can be further improved. The radiations can also be accomplished from the side of the substrate 51A or 51B of the package 2. Specifically, the gap when the resin-sealed type semiconductor device is placed over the substrate 51A or 51B can be shortened to one half of the depth of the groove, the packing density can be increased (to 1.5 times as high as that of the embodiment of FIG. 64).

Since, moreover, the radiations of the resin-sealed type semiconductor device are accomplished through the gap 51D between the package 2 and its packing substrate 51A or 51B, the resistance to the cooling draft can be reduced to improve the radiating efficiency.

Embodiment XI

Figure 70:
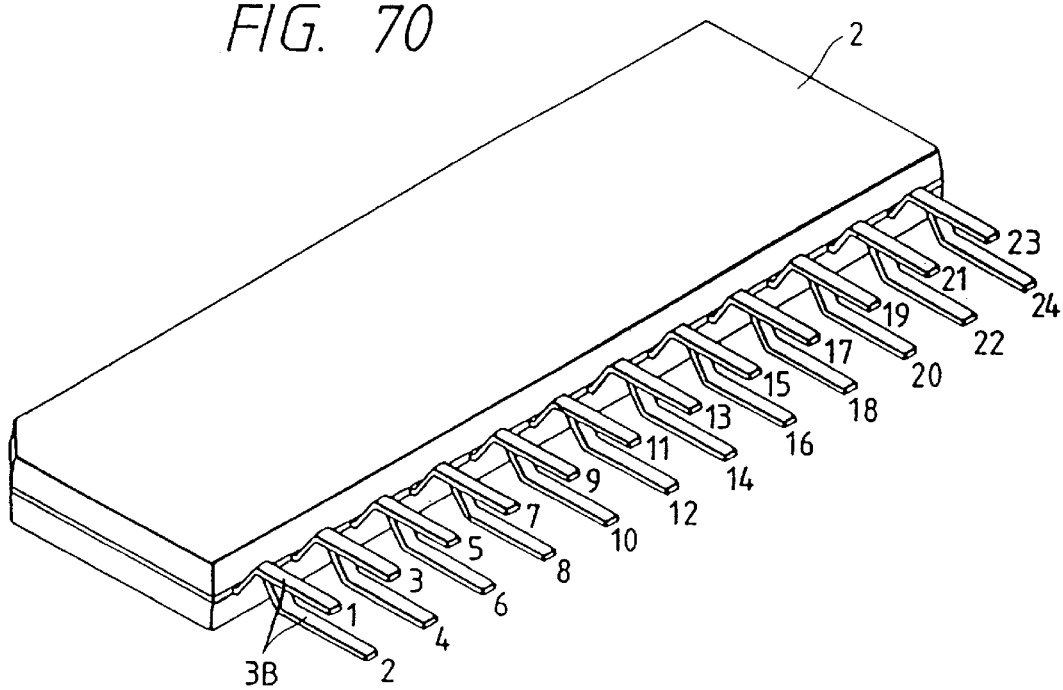
FIG. 70 is an overall perspective view showing the schematic structure of the resin-sealed type semiconductor device for sealing the DRAM according to Embodiment XI of the present invention.
Figure 71:
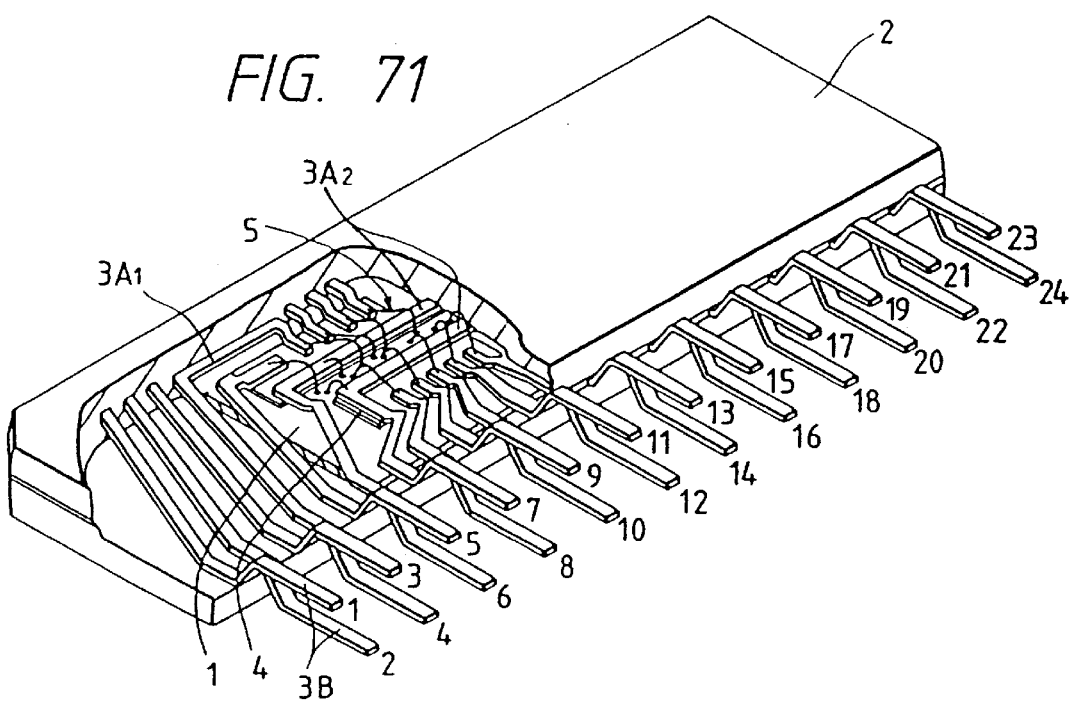
FIG. 71 is a partially sectional perspective view of FIG. 70.

The resin-sealed type semiconductor device for sealing the DRAM according to the Embodiment XI of the present invention is shown in FIG. 70 (presenting a perspective view showing the exterior) and FIG. 71 (presenting a partially sectional view of FIG. 70).

As shown in FIGS. 70 and 71, the DRAM (or semiconductor chip) 1 is sealed up with the ZIP (Zigzag In-line Package) type resin-sealed package 2. The DRAM 1 is constructed to have a large capacity of 16 [Mbits]×1 [bit] and a rectangular shape of 16.48 [mm]×8.54 [mm]. This DRAM 1 is sealed in the resin-sealed type package 2 of 450 [mil].

The DRAM 1 has its principal surface arranged mainly with a memory cell array and a peripheral circuit, as shown in FIG. 71. The memory cell array is arranged in a matrix form with memory cells (or elements) for storing information of 1 [bit], as will be described later in detail. The peripheral circuit is composed of a direct peripheral circuit and an indirect peripheral circuit. The direct peripheral circuit is one for directly controlling the information writing operations and the information reading operations of the memory cells. The direct peripheral circuit is exemplified by a row address decoder, a column address decoder or a sense amplifier. The indirect peripheral circuit is one for controlling the operations of the direct peripheral circuit indirectly. The indirect peripheral circuit is exemplified by a clock signal generator or a buffer.

The principal surface of the DRAM 1, i.e., the surface arranged with the memory cell array and the peripheral circuit is further arranged with the inner leads 3A. The insulating films 4 are sandwiched between the DRAM 1 and the inner leads 3A. The insulating films 4 are made of a polyimide resin, for example. The surfaces of the insulating films 4 at the individual sides of the DRAM 1 and the inner leads 3A are formed with adhesive layers.

These adhesive layers are made of a polyester amide-imide resin or an epoxy resin. The package 2 of this kind adopts the LOC (Lead On Chip) structure in which the inner leads 3A are arranged over the DRAM 1. Since the package 2 adopting the LOC structure can handle the inner leads 3A freely without being restricted by the shape of the DRAM 1, it can seal the DRAM 1 having a size enlarged according to the free handling. In other words, the package 2 adopting the LOC structure can have its packing density increased because the sealing (or package) size can be suppressed to a small value even if the size of the DRAM 1 is enlarged with the large capacity.

The aforementioned inner leads 3A have their one-side ends made integral with the outer leads 3B. These outer leads 3B are regulated with signals to be applied and are numbered according to the standards. In FIGS. 70 and 71, the upper step is equipped sequentially from its left with terminals of odd numbers, e.g., 1st, 3rd, 5th, - - -, 21st and 23rd, and the lower step is equipped sequentially from its left with terminals of even numbers, e.g., 2nd, 4th, 6th, - - -, 22nd and 24th. In short, this package 2 is composed of total twenty four terminals, i.e., the twelve terminals at each of the upper and lower steps.

The 1st one is an address signal terminal ($A_9$); the 2nd one is an idle terminal; the 3rd one is a column address strobe signal terminal ($\overline{CAS}$); the 4th one is an idle terminal; the 5th one is a data output signal terminal; and the 6th one is a reference voltage $V_{SS}$ terminal. This reference voltage $V_{SS}$ is the circuit operation voltage of 0 [V], for example. The 7th one is a power source voltage $V_{CC}$ terminal. This power source voltage $V_{CC}$ is the circuit operation voltage of 5 [V], for example.

The 8th one is a data input signal terminal ($D_{in}$); the 9th one is an idle terminal; the 10th one is a write enable signal terminal ($\overline{WE}$); the 11th one is a row address strobe signal terminal ($\overline{RAS}$); the 12th one is an address signal terminal ($A_{11}$); and the 13th one is an address signal terminal ($A_{10}$). The 14th one is an address signal terminal ($A_0$); the 15th one is an address signal terminal ($A_1$); the 16th one is an address signal terminal ($A_2$); the 17th one is an address signal terminal ($A_3$); and the 18th one is a power source voltage $V_{CC}$ terminal. This power source voltage $V_{CC}$ is the circuit operation voltage of 5 [V], for example.

The 19th one is a terminal for the reference voltage $V_{SS}$, which is the circuit operation voltage of 0 [V], for example.

The 20th one is an address signal terminal ($A_4$); the 21th one is an address terminal ($A_5$); the 22th one is an address terminal ($A_6$); the 23th one is an address terminal ($A_7$); and the 24th one is an address terminal ($A_8$).

The other ends of the inner leads 3A are extended across the individual longer sides of the rectangle of the DRAM 1 to the center of the DRAM 1. The extensions of the other ends of the inner leads 3A are connected with the external terminals (i.e., bonding pads) BP arrayed at the central portion of the DRAM 1 through the bonding wires 5. These bonding wires 5 are made of aluminum (Al) but may be coated wires prepared by coating gold (Au), copper (Cu) or another metal wires with an insulating resin. The bonding wires 5 are bonded by the hot contact bonding method using ultrasonic vibrations.

Of the inner leads 3A, the inner leads ($V_{CC}$) 3A of the 7th and 18th terminals are made integral and extended along the center portion of the DRAM 1 in parallel with the longer sides of the same (as will be called the common inner leads or the bus bar inner leads). Likewise, the inner leads ($V_{SS}$) 3A of the 6th and 19th terminals are also made integral and extended along the center portion of the DRAM 1 in parallel with the longer sides of the same (as will be called the common inner leads or the bus bar inner leads). The inner leads ($V_{SS}$) 3A are individually extended in parallel in the regions which are defined by the leading ends of the other ends of the remaining inner leads 3A. Each of those inner leads ($V_{CC}$) 3A and ($V_{SS}$) 3A is enabled to supply the power source voltage $V_{CC}$ and the reference voltage $V_{SS}$ to any position of the principal surface of the DRAM 1. In short, the package 2 is constructed to absorb the power source noises easily thereby to speed up the operations of the DRAM 1.

The shorter sides of the rectangle of the DRAM 1 are equipped with the chip supporting leads 3C.

Each of the inner leads 3A, the output leads 3B and the chip supporting leads 3C is cut from the lead frame and is molded. This lead frame is made of a Fe-Ni alloy containing 42 to 50 [%] of Ni) or Cu, for example.

The DRAM 1, the bonding wires 5, the inner leads 3A and the chip supporting leads 3C are sealed up with the resin sealing portion 6. This resin sealing portion 6 is is made of an epoxy resin to which are added a phenol hardener, silicon rubber and a filler so as to reduce the stress. The silicon rubber is effective to drop the modulus of elasticity and the thermal expansion coefficient of the epoxy resin. The filler is formed in spherical grains of silicon oxide and is effective to drop the thermal expansion coefficient.

As is apparent from the description thus far made, according to the present Embodiment XI, the 16MDRAM 1 of the ZIP package type is packed in the vertical form in the substrate so that its packing density can be improved.

Although the present invention has been specifically described in connection with the embodiments thereof, it should not be limited thereto but can naturally be modified in various manners without departing from the gist thereof.

The effects to be obtained from the representatives of the invention disclosed herein will be briefly enumerated in the following:

(1) The semiconductor device is enabled to improve the reliability;

(2) The semiconductor device is enabled to improve the signal transmission rate and reduce the electrical noises by the stray capacity between the semiconductor chip and the leads;

(3) The semiconductor device is enabled to improve the radiation efficiency of the heat generated;

(4) The semiconductor device is enabled to reduce the influences of the heat during the reflow;

(5) The semiconductor device is enabled to reduce the influences of the heat in the temperature cycle;

(6) The semiconductor device is enabled to prevent the molding defect;

(7) The semiconductor device is enabled to improve the productivity; and (8) The semiconductor device is enabled to improve the moisture resistance.

Embodiment XII

Figure 72:
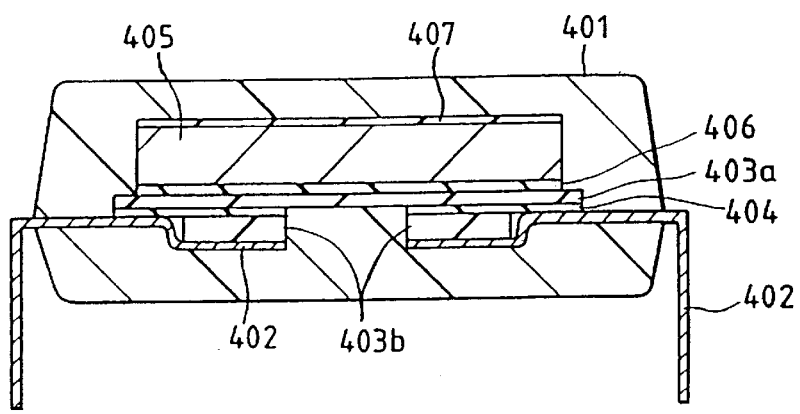
FIG. 72 is a section taken along line XII—XII FIG. 74 and showing a semiconductor device according to one embodiment of the present invention.
Figure 73:
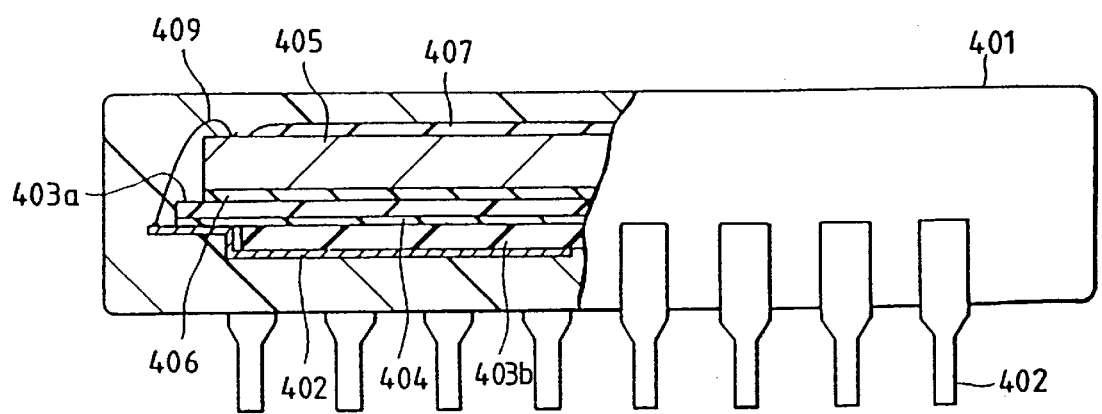
FIG. 73 is a partially broken section taken along line XIII—XIII of FIG. 74.
Figure 75:
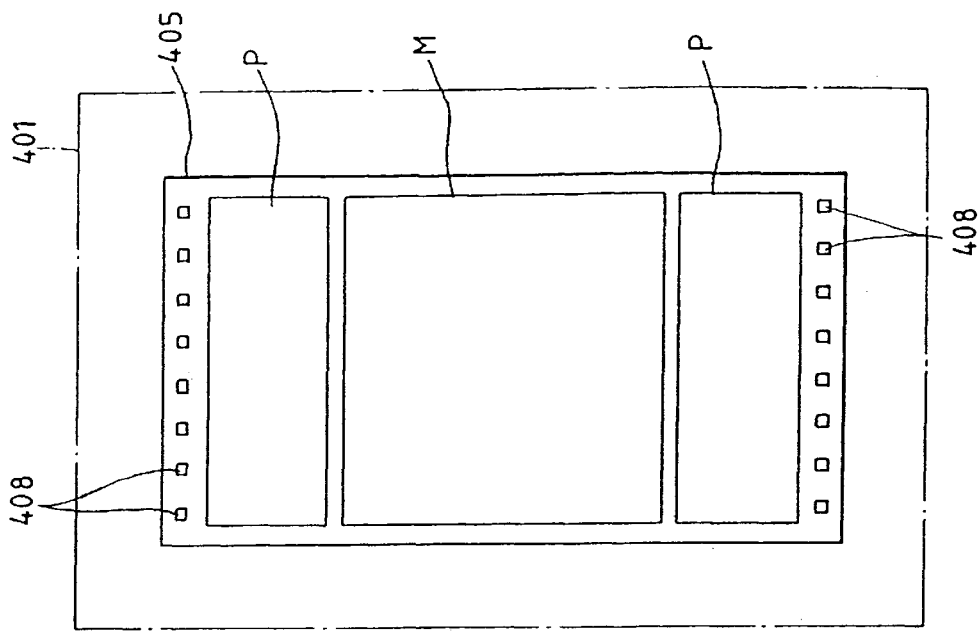
FIG. 75 is a general top plan view of a semiconductor chip showing the circuit block of the semiconductor device.
Figure 74:
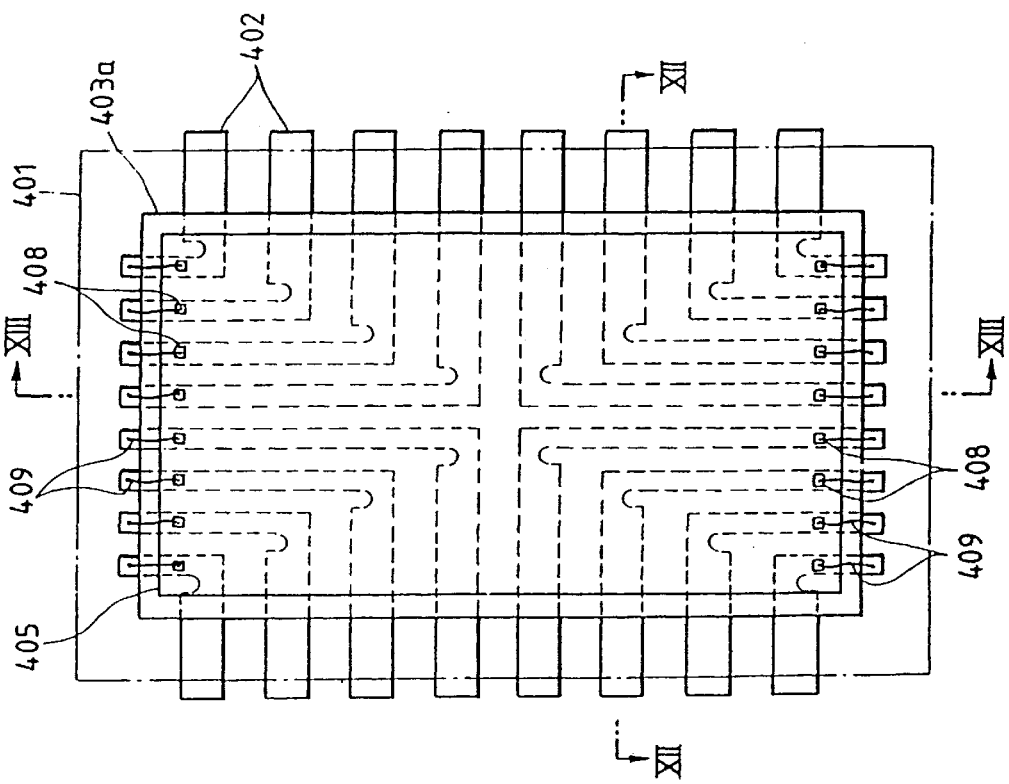
FIG. 74 is a general top plan view showing the semiconductor device.

FIG. 72 is a section showing a semiconductor device according to another embodiment of the present invention and taken along line XII—XII of FIG. 74; FIG. 73 is a partially broken section taken along line XIII—XIII of FIG. 74; FIG. 74 is a general top plan view showing the semiconductor device; and FIG. 75 is a general top plan view showing the semiconductor chip in a circuit block of the semiconductor device.

The present Embodiment XII is directed to the resin-sealed type semiconductor device which has the DIP (Dual In-line Package) package structure using the tabless lead frame.

A package body 401 is made of a resin which is prepared by filling an epoxy resin with a filler such as silica ($SiO_2$) to have a thermal expansion coefficient near that of silicone and which has a structure strong against the bending and the reflow cracking.

From the longitudinal two sides of the package body 401, there are extended to the outside and folded downward a plurality of leads 402 which constitute input/output pins and power source pins. These leads 402 are made of Cu, for example, and have their surfaces plated with a Sn-Ni alloy, for example.

To the surfaces of the leads 402 buried in the package body 401, there are bonded through an adhesive 404 rectangular insulating films 403a which are made of a polyimide resin, for example. The adhesive 404 is made of a polyimide resin, for example.

The leads 402 are folded, as shown in FIG. 74, below the insulating films 403a generally at a right angle in the horizontal direction such that their leading end portions plated with Ag, for example, extend from the shorter sides of the insulating films 403a to the outside.

As shown in FIGS. 72 and 73, moreover, the leads 402 are further folded midway downward below the insulating films 403a. To the resultant gaps between the leads 402 and the insulating films 403a, there are adhered second insulating films 403b which has a substantially equal thickness, so as to prevent the leads 402 from being deformed when in the molding operation. Incidentally, the insulating films 403b are made of the same polyimide resin as that of the foregoing insulating film 403a.

To the upper surfaces of the insulating films 403a, there is bonded through an adhesive 406 a rectangular semiconductor chip 405 which is made of single crystal of silicon. The adhesive 406 is made of a silicon resin, for example.

The chip 405 is constructed to have a slightly smaller area than that of the insulating films 403a. The chip 405 has its upper surface providing an integrated circuit forming surface, which is covered with a passivation film 407 of a polyimide resin so that it may be flattened.

The integrated circuit forming surface of the chip 405 is formed with a MOS DRAM of 4 mega bits, for example.

As shown in FIG. 75, the chip 405 is arranged at its center with a memory cell array M of the MOS DRAM of 4 mega bits and at its two sides with peripheral circuits P. Between the shorter sides of the chip 405 and the peripheral circuits P, there are arranged a plurality of bonding pads 408, which are electrically connected with the leads 402 through wires 409 made of Au, Cu or Al.

In the resin-sealed semiconductor device, parasitic capacities are usually established between the chip 405 and the leads 402. These parasitic capacities will increase inversely proportionally to the distance between the chip 405 and the leads 402 and proportionally to their opposed areas. In the package structure in which most of the leads 402 buried in the package body 401 are positioned below the chip 405, the opposed areas between the chip 405 and the leads 402 are enlarged to increase the parasitic capacities.

In the present Embodiment XII, however, the leads 402 below the chip 405 are folded midway downward to enlarge the distance between the chip 405 and the leads 402. As a result, the parasitic capacities to be established between the chip 405 and the leads 402 can be reduced more than the prior art in which the leads 402 are not folded midway downward.

As a result, the capacity of the leads 402 constituting the input/output pins is reduced to speed up the access to the MOS DRAM of 4 mega bits formed in the chip 405.

In the present Embodiment XII, the second insulating films 403*b* made of the same material as that of the insulating film 403*a* are adhered to the gaps between the leads 402 and the insulating film 403*a*. However, the insulating films 403*a* and 403*b* may be molded in an integral manner or made of different materials.

Embodiment XIII

Figure 76:
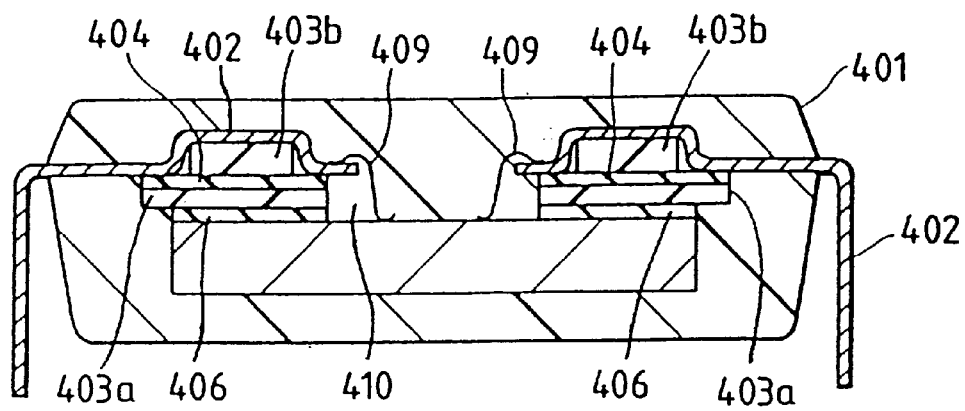
FIG. 76 is a section taken along line XIV—XIV FIG. 77 and showing a semiconductor device according to another embodiment of the present invention.
Figure 77:
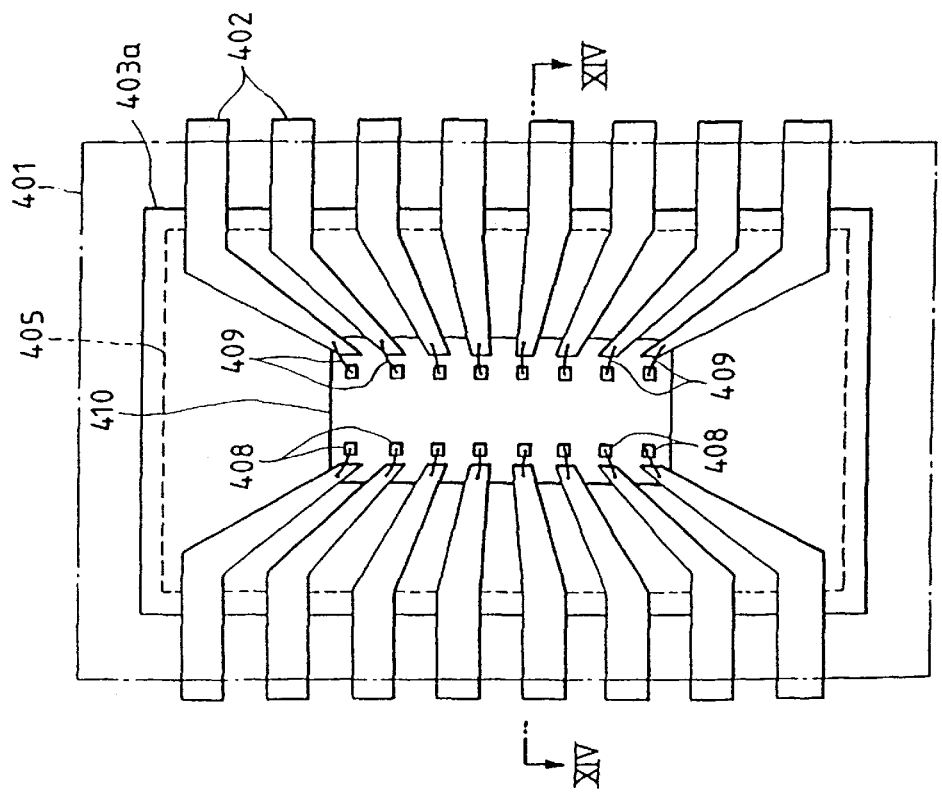
FIG. 77 is a general top plan view showing the semiconductor device.

FIG. 76 is a section showing a semiconductor device according to another embodiment of the present invention and taken along line XIV—XIV of FIG. 77; FIG. 77 is a general top plan view showing the semiconductor device; and FIG. 78 is a general top plan view showing the semiconductor chip of the circuit block of the semiconductor device.

The package structure of the present Embodiment XIII is the same DIP of the tabless lead frame type at that of the foregoing Embodiment XII. Although this Embodiment XII uses the so-called "Chip On Lead" type in which the leads 402 are arranged on the lower side of the chip 405, the present Embodiment XIII adopts the so-called Lead On Chip type in which the chip 405 is arranged on the lower side of the leads 402.

Specifically, the chip 405 sealed in the package body 401 made of a resin similar to that of the foregoing Embodiment XII has its upper surface providing an integrated circuit forming surface. This integrated circuit forming surface is formed with a MOS DRAM of 4 mega bits, for example.

Figure 78:
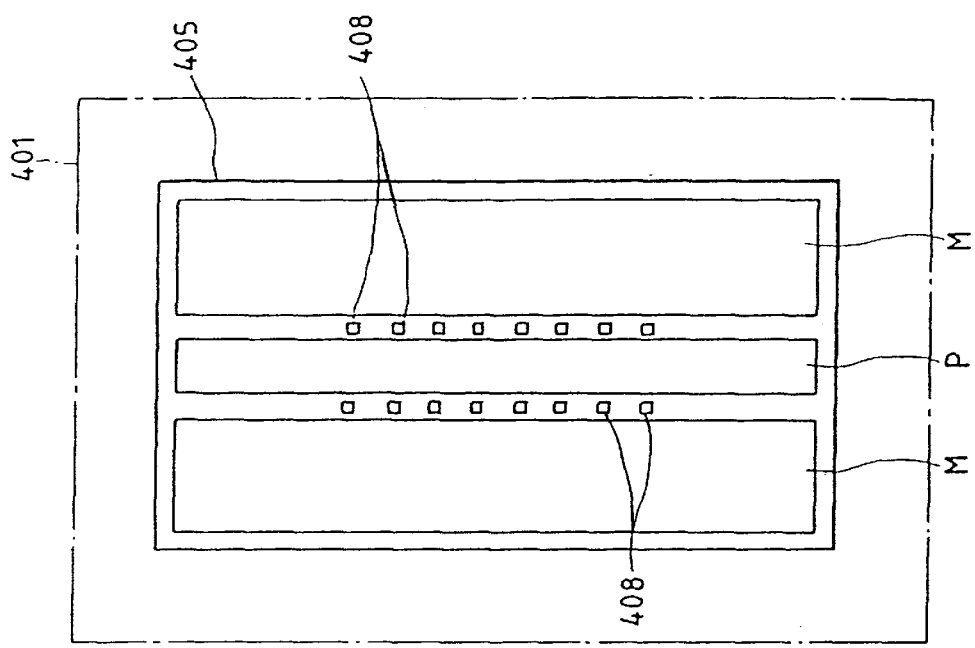
FIG. 78 is a general top plan view of a semiconductor chip showing the circuit block of the semiconductor device.

As shown in FIG. 78, the chip 405 is arranged at its central portion with the peripheral circuit P extending in the longitudinal direction of the chip and at its two sides with the memory cell arrays M. Since the peripheral circuit P is arranged at the center of the chip 405, the wiring length can be made less in the longitudinal direction of the chip 405 than that of the MOS DRAM of 4 mega bits of the Embodiment XII, in which the peripheral circuits P are arranged at the shorter sides of the chip 405, so that the wiring delay can be more reduced.

At the central portion of the chip 405, the bonding pads 408 are concentrated between the peripheral circuit P and the memory cell arrays M.

To the upper surface of the chip 405, as shown in FIG. 76, there is bonded through the adhesive 406 the rectangular insulating film 403*a* which is made of a polyimide resin, for example. This insulating film 403*a* has a slightly larger area than that of the chip 405 and is formed at its center with an opening 410.

To the upper surface of the insulating film 403*a*, there are bonded through the adhesive 404 a plurality of leads 402. These leads 402 are folded horizontally over the insulating film 403*a*, as shown in FIG. 77, to have their leading end portions arranged in the vicinity of the bonding pads 408. Moreover, the leads 402 and the bonding pads 408 are electrically connected through the wires 409.

As shown in FIG. 76, the leads 402 are folded midway upward over the insulating film 403*a*. To the resultant gaps between the leads 402 and the insulating film 403*a*, there are adhered the insulating films 403*b* which have substantially the same thickness as that of the gaps.

Thus, in the present Embodiment XIII, the leads 402 over the chip 405 are folded midway upward to increase the distance between the chip 405 and the leads 402 accordingly. As a result, the parasitic capacity to be formed between the chip 405 and the leads 402 can be reduced more than the prior art in which the leads 402 are not folded midway upward.

As a result, the capacity of the leads 402 constituting the input/output pins can be reduced to speed up the access to the MOS DRAM of 4 mega bits formed on the chip 405.

Although the invention has been specifically described in connection with the embodiments thereof, it should not be limited to the Embodiments XII and XIII but can naturally be modified in various manners within the gist thereof.

Figure 79:
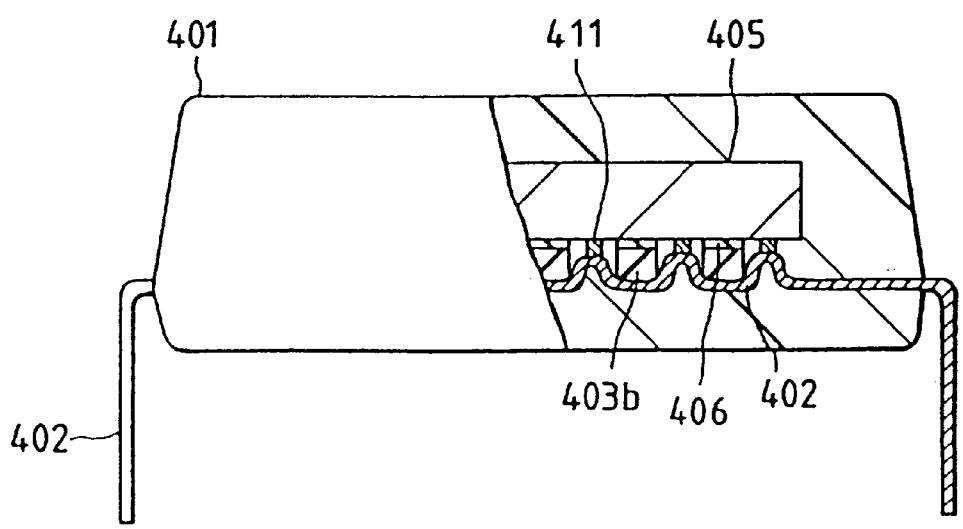
FIG. 79 is a partially broken section showing a semiconductor device according to another embodiment of the present invention.

As shown in FIG. 79, for example, the present invention can be applied to the package structure in which a predetermined integrated circuit formed on the chip 405 and the leads 402 are electrically connected through solder bumps 411. In case, as shown, most of the leads 402 buried in the package body 401 are arranged along the lower side of the chip 405, the parasitic capacity to be established between the leads 402 and the chip 405 can be reduced by folding the intermediate portions of the leads 402 connecting the solder bumps 411 downward.

Although the packages of the foregoing Embodiments XII and XIII are of the DIP type, they should not be limited thereto but may be exemplified by the SOJ (Small Outline J-lead Package) or the PLCC (Plastic Leaded Chip Carrier).

Moreover, the present invention should not be limited to the semiconductor device using the tabless lead frame type but can also be applied to the semiconductor device of the type in which the leads are arranged on the upper surface of the chip packed on the tabs.

Although the description thus far made is directed to the case in which the invention is applied to the MOS RAM or the background of its applications, the invention should not be limited thereto but can be applied to another semiconductor memory such as an EPROM or a logical LSI such as a microcomputer.

The effects to be attained by the representative of the invention disclosed herein will be briefly described in the following:

Specifically, the parasitic capacity to be established between the chip and the leads can be reduced by folding a portion of the leads, which are arranged over or below the chip packed in the package, outward with respect to the upper or lower sides of the chip.

Since, moreover, the insulating films are sandwiched between the chip and the leads, the distance between the chip and the leads can be so sufficiently enlarged to reduce the parasitic capacity to be established between the chip and the leads.

By arranging the peripheral circuit at the central portion of the chip, moreover, the wiring length taken in the longitudinal direction of the chip can be shortened to reduce the wiring delay.

TABLE 1

| Resin Composition (wt. parts) | |
|---|---|
| Base Resin: | |
| Embodiment 1: | |
| o-cresol novolak type epoxy resin: | 63 |
| novolak type phenol resin: | 37 |
| Embodiment 2: | |
| resol type phenol resin: | 80 |
| o-cresol novolak type epoxy resin: | 20 |
| Embodiment 3: | |
| ether type bismaleimide resin: | 70 |
| epoxy acrylate resin: | 30 |
| Hardening Catalyzer: | |
| Embodiment 1: | |
| triphenyl phosphine: | 1 |
| Embodiment 2: | |
| 2-Phenyl-4-metyl-5-hydromethyl imidazole: | 1 |
| Embodiment 3: | |
| dicumyl peroxide: | 0.5 |
| Fire Retardant: | |
| Embodiment 1: | |
| brominated bisphenol A-type epoxy resin: | 10 |
| antimony trioxide: | 5 |
| Embodiment 2: | |
| Embodiment 3: | |
| brominated visphenol A-type epoxy resin: | 8 |
| antimony trioxide: | 2 |
| Elasticizer: | |
| Embodiment 1: | |
| modified epoxy silicone: | 10 |
| Embodiment 2: | |
| modified amine silicone: | 10 |
| Embodiment 3: | |
| modified vinyl silicone: | 10 |
| Filler: | |
| Embodiment 1: | |
| spherical molten silica: | 520 |
| Embodiment 2: | |
| spherical molten silica: | 460 |
| Embodiment 3: | |
| spherical molten silica: | 520 |
| Coupling Agent: | |
| Embodiment 1: | |
| epoxy silane: | 3 |
| Embodiment 2: | |
| amino silane: | 3 |
| Embodiment 3: | |
| amino silane: | 3 |
| Parting Agent: | |
| Embodiment 1: | |
| montanic ester: | 1 |
| Embodiment 2: | |
| montanic ester: | 1 |

TABLE 1-continued

| Resin Composition (wt. parts) | |
|---|---|
| Embodiment 3: | |
| montanic ester: | 1 |
| Coloring Agent: | |
| Embodiment 1: | |
| carbon black | 1 |
| Embodiment 2: | |
| carbon black | 1 |
| Embodiment 3: | |
| carbon black | 1 |
| Molding Properties: | |
| Molten Viscosity (p) at 180° C.: | |
| Embodiment 1: | 215 |
| Embodiment 2: | 150 |
| Embodiment 3: | 200 |
| Spiral Flow (inch): | |
| Embodiment 1: | 35 |
| Embodiment 2: | 30 |
| Embodiment 3: | 40 |
| Hot Hardness at 180° C./90 s after: | |
| Embodiment 1: | 85 |
| Embodiment 2: | 85 |
| Embodiment 3: | 88 |
| Physical Properties of Set Device: | |
| Glass Transition Temperature (° C.): | |
| Embodiment 1: | 165 |
| Embodiment 2: | 220 |
| Embodiment 3: | 215 |
| Linear Expansion Coefficient ($10^{-5}$/° C.): | |
| Embodiment 1: | 1.3 |
| Embodiment 2: | 1.1 |
| Embodiment 3: | 1.1 |
| Bending Strength (kgf/mm$^2$) | |
| in Greenhouse: | |
| Embodiment 1: | 13.5 |
| Embodiment 2: | 14.5 |
| Embodiment 3: | 13.2 |
| at 215° C.: | |
| Embodiment 1: | 1.2 |
| Embodiment 2: | 8.5 |
| Embodiment 3: | 5.5 |
| Bulk Resistivity (ohms cm): | |
| in Greenhouse: | |
| Embodiment 1: | $3.6 \times 10^{16}$ |
| Embodiment 2: | $1.2 \times 10^{16}$ |
| Embodiment 3: | $8.5 \times 10^{16}$ |
| at 140° C.: | |
| Embodiment 1: | $4.0 \times 10^{14}$ |
| Embodiment 2: | $8.5 \times 10^{13}$ |
| Embodiment 3: | $5.0 \times 10^{15}$ |
| Moisture Absorption (%) at 65° C./95% RH: | |
| Embodiment 1: | 0.8 |
| Embodiment 2: | 0.8 |
| Embodiment 3: | 1.0 |
| Fire Retardance (UL-94, 1.6 mm thickness): | |
| Embodiment 1: | V-O |
| Embodiment 2: | V-O |
| Embodiment 3: | V-O |

TABLE 1-continued

Resin Composition (wt. parts)

Properties of Extract
(120° C./after extraction of 168 h):

pH:

| | |
|---|---|
| Embodiment 1: | 4.0 |
| Embodiment 2: | 4.2 |
| Embodiment 3: | 4.0 |

Electrical Conductivity (µs/cm):

| | |
|---|---|
| Embodiment 1: | 85 |
| Embodiment 2: | 65 |
| Embodiment 3: | 150 |

CL⁻ (ppm):

| | |
|---|---|
| Embodiment 1: | 3.2 |
| Embodiment 2: | <1 |
| Embodiment 3: | <1 |

TABLE 2

| Washing Times | 0 | 1 | 2 | 3 | 4 | 5 | 6 |
|---|---|---|---|---|---|---|---|
| Properties of Extracts: | | | | | | | |
| pH | 3.0 | 3.3 | 3.4 | 3.4 | 3.5 | 3.5 | 3.6 |
| Electrical Conductivity (µs/cm) | 1500 | 350 | 125 | 50 | 27 | 20 | 18 |
| Ionic Impurities (ppm)*1 | | | | | | | |
| CL⁻ | 75 | 15 | 3 | <1 | <1 | <1 | <1 |
| Br⁻ | 5 | <1 | <1 | <1 | <1 | <1 | <1 |
| Na⁺ | 30 | 8 | 2 | <1 | <1 | <1 | <1 |
| K⁺ | 15 | 3 | <1 | <1 | <1 | <1 | <1 |
| Zn⁺² | 250 | 75 | 18 | 3 | <1 | <1 | <1 |
| NH₄⁺ | <1 | <1 | <1 | <1 | <1 | <1 | <1 |
| Properties of Resins | | | | | | | |
| Softening Temp. (° C.) | 62 | 65 | 65 | 68 | 70 | 73 | 75 |
| Gel Time (sec)*2 | 31 | 37 | 40 | 42 | 42 | 43 | 45 |

In the Table 2:
*1: Densities of Extracts;
*2: JIS-K-5909 (Hot Plate).

What is claimed is:

1. A semiconductor device comprising:
    a semiconductor chip having a main surface, said semiconductor chip including an integrated circuit and external terminals on said main surface, said main surface having a first pair of opposed edges, each of said first pair extending in a first direction, and a second pair of opposed edges, each of the second pair extending in a second direction different from the first direction;
    a plurality of signal leads each having an inner lead, said inner lead having a first portion and a second portion, each of the first portions being disposed over said main surface of the semiconductor chip and being spaced from one another in said first direction, each of the second portions crossing one of the first pair of opposed edges and extending out from said semiconductor chip;
    an adhesive layer disposed between said main surface of said semiconductor chip and said first portions of the inner leads; and
    bonding wires for electrically connecting said external terminals of said semiconductor chip with said first portions of said inner leads,
    wherein said main surface of said semiconductor chip and each of said first portions of said inner leads are adhered to each other by said adhesive layer, said adhesive layer being divided into plural adhesive areas adjacent first portions of said inner leads, which adhesive areas are separated from each other in said first direction.

2. A semiconductor device according to claim 1, wherein said adhesive layer includes a thermoplastic resin.

3. A semiconductor device according to claim 2, wherein said adhesive layer includes a base insulating film and adhesive formed on both sides of said base insulating film.

4. A semiconductor device according to claim 2, wherein said adhesive areas correspond respectively to said first portions of said inner leads.

5. A semiconductor device according to claim 2, wherein said adhesive areas are adjacent said first portions and not said second portions of the inner leads.

6. A semiconductor device according to claim 1, wherein said main surface has a rectangular shape, with said first pair of opposed edges being a pair of longer sides and said second pair of opposed edges being a pair of shorter sides, the longer sides extending in said first direction, the second direction being substantially perpendicular to the first direction; and wherein said plurality of signal leads each has an outer lead which is continuous with said inner leads.

7. A semiconductor device according to claim 6, wherein each of said second portions crosses one of said pair of longer edges and extends away from the semiconductor chip.

8. A semiconductor device according to claim 7, further comprising a member sealing said semiconductor chip, said bonding wires and said inner leads of said plurality of signal leads, the outer leads of the plurality of signal leads extending out of said member.

9. A semiconductor device according to claim 8, wherein said member is a resin member.

10. A semiconductor device according to claim 9, wherein said external terminals extend in said first direction and are arranged at a substantially central position between said pair of longer edges.

11. A semiconductor device according to claim 9, wherein said adhesive areas of adjacent first portions of said signal leads correspond to areas where said bonding wires are bonded.

12. A semiconductor device comprising:
    a semiconductor chip having a main surface, said semiconductor chip including an integrated circuit and external terminals on said main surface;
    a plurality of signal leads each having an inner lead, said inner lead having a first portion and a second portion, each of the first portions being disposed over said main surface of the semiconductor chip and being spaced from one another, each of the second portions extending out of said semiconductor chip;
    a power supply lead having an inner lead, said inner lead of said power supply lead having a first portion and a second portion, said first portion of said power supply lead being disposed over said main surface of the semiconductor chip, said second portion of said power supply lead extending from said first portion and extending out from said semiconductor chip;
    an adhesive layer disposed between said main surface of said semiconductor chip and said first portion of the inner leads of said power supply lead; and
    bonding wires for electrically connecting said external terminals of said semiconductor chip with said first portions of said inner leads of said signal leads and said power supply lead, respectively, wherein said main surface of said semiconductor chip and each of said first portions of said inner leads are adhered to each other by said adhesive layer, said adhesive layer being divided into plural adhesive areas disposed between said first portion of said power supply lead and said main surface, said plural adhesive areas being disposed at an interval from each other and spaced from each other along said first portion of said power supply lead.

13. A semiconductor device according to claim 12, wherein said adhesive layer includes a thermoplastic resin.

14. A semiconductor device according to claim 12, wherein said adhesive layer includes a base insulating film and adhesive formed on both sides of said base insulating film.

15. A semiconductor device according to claim 12, wherein said main surface has a rectangular shape, with a pair of longer sides and a pair of shorter sides, the longer sides extending in a first direction; wherein said first portion of said power supply lead extends in said first direction; wherein the first portions of the signal leads are spaced from each other in the first direction; and wherein the plural adhesive areas are spaced at said interval in said first direction.

16. A semiconductor device according to claim 15, wherein each of said second portions crosses one of said pair of longer edges.

17. A semiconductor device according to claim 16, further comprising a member sealing said semiconductor chip, said bonding wires and said inner leads of said signal leads and said power supply lead.

18. A semiconductor device according to claim 17, wherein said member is a resin member.

19. A semiconductor device according to claim 15, wherein said external terminals extend in said first direction and are arranged at a substantially central position between said pair of longer edges.

20. A semiconductor device according to claim 12, wherein said plural adhesive areas correspond to areas where said bonding wires are bonded.

21. A semiconductor device according to claim 12, wherein said main surface of said semiconductor chip and the first portions of said signal leads are adhered to one another by a further adhesive layer, said further adhesive layer being divided into signal lead adhesive areas adjacent first portions of said inner leads, which adhesive areas are separated from one another.

22. A semiconductor device according to claim 21, wherein said signal lead adhesive areas adjacent first portions of said signal leads correspond to areas where said bonding wires are bonded.

23. A semiconductor device according to claim 12, wherein said power supply lead includes a power source voltage lead.

24. A semiconductor device according to claim 12, wherein said power supply lead includes a reference voltage lead.

25. A semiconductor device according to claim 12, wherein said adhesive layer is also disposed between the main surface and the first portions of the plurality of signal leads.

26. A semiconductor device comprising:
a semiconductor chip having a main surface, said semiconductor chip including an integrated circuit and external terminals on said main surface;
a power supply lead having an inner lead, said inner lead of said power supply having a first portion and a second portion, said first portion of said power supply lead being disposed over said main surface of the semiconductor chip, said second portion of said power supply lead extending from said first portion and extending out from said semiconductor chip;
an adhesive layer disposed between said main surface of said semiconductor chip and said first portion of the inner leads of said power supply lead; and
bonding wires for electrically connecting an external terminal of said semiconductor chip with said first portion of said inner lead of said power supply lead,
wherein said adhesive layer is disposed between said main surface and said first portion of said inner lead of said power supply lead s as to adhere said first portion of said inner lead of said power supply lead to said main surface, and is not disposed between at least part of the second portion of the inner lead of said power supply lead and the main surface, said adhesive layer being divided into plural adhesive areas disposed between said main surface and said first portion of said inner lead of said power supply lead, said plural adhesive areas being spaced from each other along said first portion of said inner lead of said power supply lead.

27. A semiconductor device according to claim 26, wherein the adhesive layer is provided between all of the first portion of the inner lead of the power supply lead and the main surface.

28. A semiconductor device according to claim 26, wherein the adhesive layer is disposed at spaced intervals along the first portion of the inner lead of the power supply lead, between the first portion of the inner lead of the power supply lead and the main surface.

29. A semiconductor device comprising:
a semiconductor chip having a main surface of a rectangular shape, said semiconductor chip having an integrated circuit and external terminals on said main surface, said main surface having a pair of longer edges extending in a first direction and a pair of shorter edges extending in a second direction which is different from said first direction;
a first fixed potential lead having an inner lead and an outer lead which is continuous with said inner lead, said inner lead of said first fixed potential lead having a first portion and a second portion, said first portion of said first fixed potential lead being disposed on said main surface and extending in said first direction, said second portion of said first fixed potential lead extending from said first portion to said outer lead of said first fixed potential lead;
a second fixed potential lead having an inner lead and an outer lead which is continuous with said inner lead, said inner lead of said second fixed potential lead having a first portion and a second portion, said first portion of said second fixed potential lead being disposed on said main surface and extending in said first direction, said second portion of said second fixed potential lead extending from said first portion to said outer lead of said second fixed potential lead;
first signal leads each having an inner lead and an outer lead which is continuous with said inner lead, each of said inner leads of said first signal leads crossing one of said pair of longer edges and extending on said main surface, each of said inner leads of said first signal leads having a first portion which is disposed on said main surface;
second signal leads each having an inner lead and an outer lead which is continuous with said inner lead, each of said inner leads of said second signal leads crossing the other of said pair of longer edges and extending on said main surface, each of said inner leads of said second signal leads having a first portion which is disposed on said main surface;
an adhesive layer disposed between said main surface of said semiconductor chip and said first portions of said first and second signal leads and said first and second fixed potential leads respectively;

bonding wires electrically connecting said external terminals with said first portions and of said first and second fixed potential leads and said first portions of said first and second signal leads respectively; and a resin member of a rectangular shape having a pair of longer sides extending in said first direction and a pair of shorter sides extending said second direction, said resin member sealing said semiconductor chip, said inner leads of said first and second fixed potential leads, said inner leads of said first and second signal leads and said bonding wires, said outer leads of said first fixed potential lead and said first signal leads protruding outwardly from one of said pair of longer sides adjacent to said one of the longer edges of said main surface of said semiconductor chip, said outer leads of said second fixed potential lead and said second signal leads protruding outwardly from the other of said pair of longer sides adjacent to the other of the longer edges of said main surface of said semiconductor chip, wherein said main surface of said semiconductor chip and each of said first portions of said first and second signal leads are adhered to each other by said adhesive layer, said adhesive layer being divided into adhesive areas adjacent first portions of said first and second signal leads, which adhesive areas are separated from each other in the first direction, and wherein said main surface of said semiconductor chip and each of said first portions of said first and second fixed potential leads are adhered to each other by said adhesive layer, said adhesive layer being divided into plural adhesive areas disposed between each of said first portions of said first and second fixed potential leads and said main surface, respectively, said plural adhesive areas being disposed at an interval from, and spaced from, each other in said first direction.

30. A semiconductor device according to claim 29, wherein said adhesive layer includes a thermoplastic resin.

31. A semiconductor device according to claim 29, wherein said adhesive layer includes a base insulating film and adhesive formed on both sides of said base insulating film.

32. A semiconductor device according to claim 29, wherein said external terminals extend in said first direction and are arranged at a substantially central position between said pair of longer edges.

33. A semiconductor device according to claim 29, wherein said adhesive areas of adjacent first portions of said first and second signal leads correspond to areas where said bonding wires are bonded.

34. A semiconductor device according to claim 29, wherein said first fixed potential lead includes a power source voltage lead, and wherein said second fixed potential lead includes a reference voltage lead.

35. A semiconductor device according to claim 22, wherein the signal lead adhesive areas are spaced from said plural adhesive areas disposed between said first portion of said power supply lead and said main surface.

36. A semiconductor device according to claim 12, wherein said main surface has a first pair of opposed edges, each of said first pair of opposed edges extending in a first direction, and a second pair of opposed edges, each of said second pair of opposed edges extending in a second direction different from the first direction; wherein each of the second portions of the plurality of signal leads crosses one of the first pair of opposed edges; wherein the first portion of the power supply lead extends in the first direction; and wherein the plural adhesive areas are spaced from each other in the first direction.

37. A semiconductor device according to claim 36, wherein said main surface of said semiconductor chip and the first portions of said signal leads are adhered to one another by a further adhesive layer, said further adhesive layer being divided into signal lead adhesive areas adjacent first portions of said inner leads, which signal lead adhesive areas are separated from one another in the first direction.

38. A semiconductor device comprising:

a semiconductor chip having a main surface, said semiconductor chip including an integrated circuit and external terminals on said main surface;

a power supply lead having an inner lead, said inner lead of said power supply lead having a first portion and a second portion, said first portion of said power supply lead being disposed over said main surface of the semiconductor chip, said second portion of said power supply lead extending from said first portion and extending out from said semiconductor chip;

an adhesive layer disposed between said main surface of said semiconductor chip and said first portion of the inner leads of said power supply lead; and bonding wires for electrically connecting an external terminal of said semiconductor chip with said first portions of said inner lead of said power supply lead, wherein said adhesive layer is disposed between said main surface and said first portion of said inner lead of said power supply lead so as to adhere said first portion of said inner lead of said power supply lead to said main surface, and is not disposed between at least part of the second portion of the inner lead of said power supply lead and the main surface, and wherein said adhesive layer disposed between said main surface and said first portion of said inner lead, so as to adhere said first portion of said inner lead of said power supply lead to said main surface, substantially does not extend beyond said first portion of said inner lead.

39. A semiconductor device according to claim 38, wherein said main surface has a first pair of opposed edges, each of said first pair extending in a first direction, and a second pair of opposed edges, each of the second pair extending in a second direction different from the first direction, and wherein the device further includes:

a plurality of signal leads each having an inner lead, said inner lead having a first portion and a second portion, each of the first portions being disposed over said main surface of the semiconductor chip and being spaced from one another in said first direction, each of the second portions crossing one of the first pair of opposed edges and extending out from said semiconductor chip; and another adhesive layer disposed between said main surface of said semiconductor chip and said first portions of the inner leads of the signal leads, wherein said main surface and each of said first portions of said inner leads of the signal leads are adhered to each other by said another adhesive layer, said another adhesive layer being divided into plural signal lead adhesive areas adjacent first portions of said inner leads of the signal leads, which signal lead adhesive areas are separated from each other in said first direction.

40. A semiconductor device according to claim 39, wherein said plural signal lead adhesive areas extend to meet the adhesive layer disposed between said main surface and said first portion of said inner lead of said power supply lead.

* * * * *